(12) United States Patent
Takishita et al.

(10) Patent No.: US 11,152,413 B2
(45) Date of Patent: Oct. 19, 2021

(54) STRUCTURE, METHOD FOR PRODUCING STRUCTURE, COMPOSITION FOR FORMING ABSORPTION LAYER, SOLID-STATE IMAGING ELEMENT, AND IMAGE DISPLAY DEVICE

(71) Applicant: FUJIFILM Corporation, Tokyo (JP)

(72) Inventors: Hirotaka Takishita, Haibara-gun (JP);
Shoichi Nakamura, Haibara-gun (JP);
Hiroshi Taguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/710,629

(22) Filed: Dec. 11, 2019

(65) Prior Publication Data
US 2020/0119071 A1   Apr. 16, 2020

Related U.S. Application Data

(63) Continuation of application No. PCT/JP2018/027737, filed on Jul. 24, 2018.

(30) Foreign Application Priority Data

Aug. 22, 2017   (JP) .............................. JP2017-159217
Nov. 30, 2017   (JP) .............................. JP2017-230053

(51) Int. Cl.
*H01L 27/146* (2006.01)
*G02B 5/22* (2006.01)

(52) U.S. Cl.
CPC .......... *H01L 27/14621* (2013.01); *G02B 5/22* (2013.01); *H01L 27/14603* (2013.01); *H01L 27/14685* (2013.01)

(58) Field of Classification Search
CPC ......... H01L 27/14621; H01L 27/14603; H01L 27/14685; G02B 5/22
See application file for complete search history.

(56) References Cited

U.S. PATENT DOCUMENTS

| 6,940,140 B1 | 9/2005 | Ikeda et al. |
| 2007/0045517 A1* | 3/2007 | Fukuyoshi ........ H01L 27/14627 250/208.1 |

(Continued)

FOREIGN PATENT DOCUMENTS

| JP | 63-083703 A | 4/1988 |
| JP | 3-081122 A | 4/1991 |

(Continued)

OTHER PUBLICATIONS

International Search Report dated Oct. 30, 2018 from the International Searching Authority in International Application No. PCT/JP2018/027737.

(Continued)

*Primary Examiner* — Feifei Yeung Lopez
(74) *Attorney, Agent, or Firm* — Sughrue Mion, PLLC

(57) ABSTRACT

A structure has a color filter having two or more different types of pixels and an absorption layer including at least one selected from a yellow colorant or a colorant having a maximum absorption wavelength in a wavelength range of 400 to 500 nm, in which the structure has the absorption layer on an optical path of at least one pixel of the pixels of the color filter and on the side through which light is incident on the pixel.

25 Claims, 3 Drawing Sheets

(56) References Cited

U.S. PATENT DOCUMENTS

| | | | | |
|---|---|---|---|---|
| 2008/0017607 | A1* | 1/2008 | Yoshibayashi | G03F 7/0007 216/24 |
| 2011/0045412 | A1* | 2/2011 | Kaneko | C08F 290/061 430/321 |
| 2016/0099272 | A1 | 4/2016 | Wang | |
| 2017/0009075 | A1 | 1/2017 | Sakamoto et al. | |

FOREIGN PATENT DOCUMENTS

| | | | |
|---|---|---|---|
| JP | 5-134113 | A | 5/1993 |
| JP | 2000-284112 | A | 10/2000 |
| JP | 2001-118967 | A | 4/2001 |
| JP | 2003-060176 | A | 2/2003 |
| JP | 2003-294932 | A | 10/2003 |
| JP | 2006-078766 | A | 3/2006 |
| JP | 2006-313974 | A | 11/2006 |
| JP | 2009-152314 | A | 7/2009 |
| JP | 2009-152315 | A | 7/2009 |
| JP | 2009152314 | * | 9/2009 |
| JP | 2011-176182 | A | 9/2011 |
| JP | 2012-212055 | A | 11/2012 |
| JP | 2016-075886 | A | 5/2016 |
| JP | 2017-092302 | A | 5/2017 |
| JP | 2017-167389 | A | 9/2017 |
| JP | 2017-203810 | A | 11/2017 |
| KR | 10-0825550 | B1 | 4/2008 |
| KR | 10-2016-0113094 | A | 9/2016 |
| TW | 201627417 | A | 8/2016 |
| TW | 201716512 | A | 5/2017 |

OTHER PUBLICATIONS

Written Opinion dated Oct. 30, 2018 from the International Bureau in International Application No. PCT/JP2018/027737.
International Preliminary Report on Patentability dated Feb. 25, 2020 from the International Bureau in International Application No. PCT/JP2018/027737.
Communication dated Dec. 21, 2020, issued by the Korean Intellectual Property Office in application No. 10-2019-7035878.
Communication dated Feb. 9, 2021, issued by the Japanese Patent Office in application No. 2019-538008.
Communication dated Aug. 4, 2020, from the Japanese Patent Office in application No. 2019-538008.
Communication dated Jun. 25, 2021 from the Korean Intellectual Property Office in Application No. 10-2019-7035878.
Notice of Reasons for Refusals dated Jul. 20, 2021 by the Japanese Patent Office in Japanese Application No. 2019-538008.
Communication dated Aug. 18, 2021 from the Taiwanese Patent Office in Application No. 107127271.

* cited by examiner

STRUCTURE, METHOD FOR PRODUCING STRUCTURE, COMPOSITION FOR FORMING ABSORPTION LAYER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2018/27737, filed on Jul. 24, 2018, which claims priority under 35 U.S.C. § 119(a) to Japanese Patent Application No. 2017-159217, filed on Aug. 22, 2017 and Japanese Patent Application No. 2017-230053, filed on Nov. 30, 2017. Each of the above application(s) is hereby expressly incorporated by reference, in its entirety, into the present application.

BACKGROUND OF THE INVENTION

1. Field of the Invention

The present invention relates to a structure, a method for producing a structure, a composition for forming an absorption layer, a solid-state imaging element, and an image display device.

2. Description of the Related Art

In recent years, as a digital camera, a mobile phone with a camera, and the like have been spreading, there has been a greatly increasing demand for a solid-state imaging element such as a charge coupled device (CCD) image sensor. A color filter has been used as a key device in a display or an optical element.

Generally, the color filter has pixels including a colorant. However, in a case where the color filter is irradiated with light for a long period of time, deterioration with color degradation and the like occur in some cases. With this occurrence, attempts to improve the light resistance of a color filter by providing a layer including an ultraviolet absorber on the side through which light is incident on the color filter have been studied (see JP1991-081122B (JP-H03-081122B), JP1988-083703A (JP-S63-083703A), JP2017-092302A, JP1993-134113A (JP-H05-134113A), JP2003-060176A, JP2001-118967A, and JP2000-284112A).

SUMMARY OF THE INVENTION

However, it has been difficult to sufficiently improve the light resistance of a color filter by the method described in JP1991-081122B (JP-H03-081122B), JP1988-083703A (JP-S63-083703A), JP2017-092302A, JP1993-134113A (JP-H05-134113A), JP2003-060176A, JP2001-118967A, or JP2000-284112A.

Therefore, an object of the present invention is to provide a structure having a color filter having excellent light resistance. Another object of the present invention is to provide a method for producing a structure having a color filter having excellent light resistance, a composition for forming an absorption layer used for the above-mentioned structure, and a solid-state imaging element and an image display device, each including the above-mentioned structure.

The present inventors have conducted extensive studies, and as a result, they have found that it is possible to enhance the light resistance of a color filter by providing an absorption layer including at least one selected from a yellow colorant or a colorant having a maximum absorption wavelength in a wavelength range of 400 to 500 nm on optical paths of the pixels of the color filter and on the side through which light is incident on the pixels, thereby completing the present invention. That is, the present invention is as follows.

<1> A structure comprising:
a color filter having two or more different types of pixels; and
an absorption layer including at least one selected from a yellow colorant or a colorant having a maximum absorption wavelength in a wavelength range of 400 to 500 nm,
in which the structure has the absorption layer on an optical path of at least one pixel of the pixels of the color filter and on the side through which light is incident on the pixel.

<2> The structure as described in <1>,
in which the absorption layer further includes an ultraviolet absorber.

<3> The structure as described in <2>,
in which the ultraviolet absorber includes at least one selected from a benzotriazole compound, a benzophenone compound, or a triazine compound.

<4> The structure as described in any one of <1> to <3>,
in which the absorption layer includes at least one selected from an azo compound or an isoindoline compound.

<5> The structure as described in any one of <1> to <3>,
in which the absorption layer includes at least one selected from Color Index Pigment Yellow 139, Color Index Pigment Yellow 150, or Color Index Pigment Yellow 185.

<6> The structure as described in any one of <1> to <5>,
in which the color filter includes at least one colored pixel selected from a green pixel or a red pixel, and the structure has the absorption layer on an optical path of the colored pixel.

<7> The structure as described in any one of <1> to <5>,
in which the color filter includes a green pixel, a red pixel, and a blue pixel, and
the structure has the absorption layer on an optical path of at least one pixel selected from the green pixel or the red pixel, but does not have the absorption layer on an optical path of the blue pixel.

<8> The structure as described in <7>,
in which the green pixel contains a halogenated zinc phthalocyanine pigment.

<9> The structure as described in <7> or <8>,
in which the structure has the absorption layer on the optical paths of the green pixel and the red pixel.

<10> The structure as described in any one of <6> to <9>,
in which a film thickness of the absorption layer is 0.001 to 2 times a film thickness of the pixel having the absorption layer provided on an optical path thereof.

<11> The structure as described in any one of <6> to <9>,
in which a film thickness of the absorption layer is 0.1 to 1 time a film thickness of the pixel having the absorption layer provided on an optical path thereof.

<12> The structure as described in any one of <6> to <11>,
in which the color filter further includes at least one pixel selected from a transparent pixel or a pixel of an infrared transmitting layer.

<13> The structure as described in any one of <1> to <12>,
in which the absorption layer is obtained by curing a composition including at least one selected from a yellow colorant or a colorant having a maximum absorption wavelength in a wavelength range of 400 to 500 nm, and a curable compound.

<14> The structure as described in any one of <1> to <13>,
in which the pixel of the color filter and the absorption layer are in contact with each other.

<15> A method for producing a structure, the method comprising:
forming a color filter; and
forming an absorption layer,
in which the color filter has two or more different types of pixels,
the absorption layer includes at least one selected from a yellow colorant or a colorant having a maximum absorption wavelength in a wavelength range of 400 to 500 nm,
the structure has the absorption layer on an optical path of at least one pixel of the pixels of the color filter and on the side through which light is incident on the pixel, and
forming an absorption layer includes applying a composition for forming an absorption layer, the composition including at least one selected from a yellow colorant or a colorant having a maximum absorption wavelength in a wavelength range of 400 to 500 nm.

<16> The method for producing a structure as described in <15>,
in which the composition for forming an absorption layer is applied onto a surface of the color filter.

<17> The method for producing a structure as described in <15> or <16>,
in which forming an absorption layer further includes forming a pattern.

<18> A composition for forming an absorption layer of a structure having a color filter having two or more different types of pixels and an absorption layer including at least one selected from a yellow colorant or a colorant having a maximum absorption wavelength in a wavelength range of 400 to 500 nm, the structure having the absorption layer on an optical path of at least one pixel of the pixels of the color filter and on the side through which light is incident on the pixel,
in which the composition for forming an absorption layer includes at least one selected from a yellow colorant or a colorant having a maximum absorption wavelength in a wavelength range of 400 to 500 nm.

<19> The composition for forming an absorption layer as described in <18>, further comprising an ultraviolet absorber.

<20> The composition for forming an absorption layer as described in <19>,
in which the ultraviolet absorber includes at least one selected from a benzotriazole compound, a benzophenone compound, or a triazine compound.

<21> A solid-state imaging element comprising the structure as described in any one of <1> to <14>.

<22> An image display device comprising the structure as described in any one of <1> to <14>.

According to the present invention, it is possible to provide a structure having a color filter having excellent light resistance. In addition, it is also possible to provide a method for producing a structure having a color filter having excellent light resistance, a composition for forming an absorption layer used for the above-mentioned structure, and a solid-state imaging element and an image display device, each including the above-mentioned structure.

DESCRIPTION OF THE PREFERRED EMBODIMENTS

Figure 1:
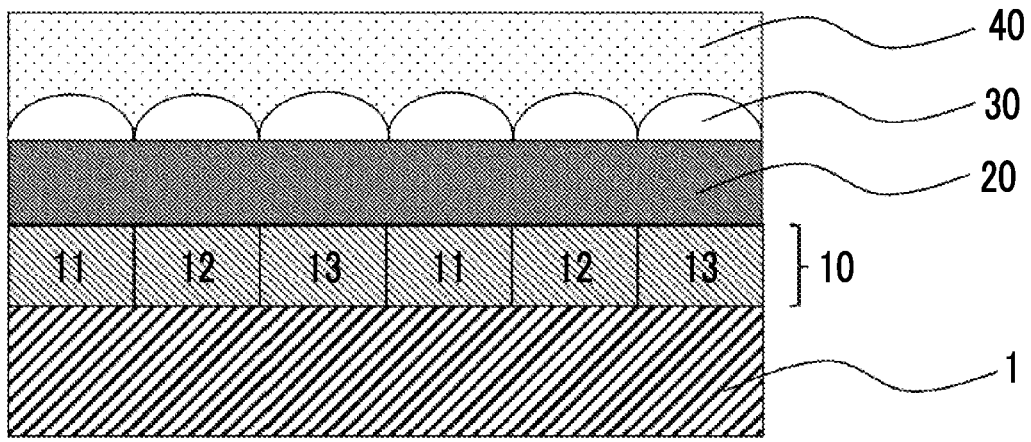
FIG. 1 is a schematic view showing an embodiment of the structure of the present invention.

Hereinafter, the contents of the present invention will be described in detail.

In citations for a group (atomic group) in the present specification, in a case where the group (atomic group) is denoted without specifying whether it is substituted or unsubstituted, the group (atomic group) includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, and electron beams.

In the present specification, a numerical range expressed using "to" means a range which includes the preceding and succeeding numerical values of "to" as the lower limit value and the upper limit value, respectively.

In the present specification, the total solid content refers to a total mass of the components other than a solvent from all the components of a composition.

In the present specification, infrared rays refer to light (electronic waves) at a wavelength of 700 to 2,500 nm.

In the present specification, "(meth)acrylate" represents both or either of acrylate and methacrylate, "(meth)acryl" represents both or either of acryl and methacryl, "(meth)allyl" represents both or either of allyl and methallyl, and "(meth)acryloyl" represents both or either of acryloyl and methacryloyl.

In the present specification, a term "step" not only an independent step but also a step in which the anticipated effect of this step is achieved, even if the step cannot be clearly differentiated from the other steps.

In the present specification, a weight-average molecular weight (Mw) and a number-average molecular weight (Mn)

are each defined as a value in terms of polystyrene as measured by means of gel permeation chromatography (GPC).

<Structure>

The structure of the embodiment of the present invention has:

a color filter having two or more different types of pixels, and an absorption layer including at least one selected from a yellow colorant or a colorant having a maximum absorption wavelength in a wavelength range of 400 to 500 nm.

in which the structure has the absorption layer on an optical path of at least one pixel of the pixels of the color filter and on the side through which light is incident on the above-mentioned pixel.

With regard to the structure of the embodiment of the present invention, by providing an absorption layer including at least one selected from a yellow colorant or a colorant having a maximum absorption wavelength in a wavelength range of 400 to 500 nm on an optical path of at least one pixel of the pixels of the color filter and on the side through which light is incident on the above-mentioned pixel, it is possible to effectively absorb light in the vicinity of the ultraviolet region among the lights in the visible region with the absorption layer. As a result, it is possible to enhance the light resistance of the color filter and it is also possible to effectively suppress a variation in the spectral characteristics of the color filter after a light resistance test. In addition, according to the present invention, it is possible to improve the moisture resistance of the color filter by providing the above-mentioned absorption layer, and thus, it is possible to effectively suppress a variation in the spectral characteristics even after a moisture resistance test. A reason for which such an effect is obtained is presumed to be as follows: penetration of moisture into the color filter can be effectively suppressed by providing the absorption layer.

Preferred examples of the structure of the embodiment of the present invention include the following aspects 1 and 2. According to these aspects, it is possible to improve the light resistance of the color filter while not giving an effect on the color of the pixel of the color filter. In addition, it is also possible to improve the performance of color separation of the pixel by blocking unnecessary absorption.

(Aspect 1) An aspect in which the color filter includes at least one colored pixel selected from a green pixel or a red pixel, and the structure has an absorption layer on an optical path of the colored pixel.

(Aspect 2) An aspect in which the color filter includes a green pixel, a red pixel, and a blue pixel, and the structure has the absorption layer on an optical path of at least one pixel selected from the green pixel or the red pixel, but does not have the absorption layer on an optical path of the blue pixel.

In Aspect 1, in a case where the color filter includes a green pixel and a red pixel, the color filter only needs to have the absorption layer on an optical path of at least one pixel of a green pixel or a red pixel, it is preferable that the color filter has the absorption layer on an optical path of the green pixel, and it is more preferable that the color filter has the absorption layer on the optical paths of both pixels of the green pixel and the red pixel. The green pixel tends to have low light resistance and tends to cause an easy variation in the spectrum of green due to generation of color degradation upon irradiation with light, but it is possible to improve the light resistance while not damaging the color of the green pixel by providing the absorption layer on an optical path of the green pixel. In addition, it is also possible to improve the light resistance while not damaging the color of the red pixel by providing the absorption layer on an optical path of the red pixel. In Aspect 1, in a case where the color filter further includes a blue pixel, it is preferable that the color filter does not have the absorption layer on an optical path of the red pixel.

In Aspect 2, it is preferable that the color filter has the absorption layer on an optical path of the green pixel, and it is more preferable that the color filter has the absorption layer on the optical paths of both pixels of the green pixel and the red pixel.

In Aspects 1 and 2, the film thickness of the absorption layer is preferably 0.001 to 2 times, more preferably 0.01 to 2 times, and still more preferably 0.1 to 1 time a film thickness of the pixel having the absorption layer provided on an optical path thereof.

In Aspects 1 and 2, the color filter may further include a transparent pixel and/or a pixel of an infrared transmitting layer (hereinafter also referred to as another pixel). In a case where the color filter further includes a pixel other than the pixels above, an absorption layer may not be provided on an optical path of such another pixel, but from the viewpoint of the light resistance, it is preferable that the absorption layer is provided on an optical path of such another pixel.

Moreover, the absorption layer in the structure of the embodiment of the present invention preferably further includes an ultraviolet absorber. According to this aspect, it is possible to more remarkably improve the light resistance of the color filter.

In addition, it is preferable that the pixel of the color filter and the absorption layer are in contact with each other in the structure of the embodiment of the present invention. According to this aspect, it is possible to more remarkably improve the moisture resistance of the color filter.

Hereinafter, the structure of the embodiment of the present invention will be described in detail.

(Color Filter)

The structure of the embodiment of the present invention has a color filter having two or more different types of pixels. In the structure of the embodiment of the present invention, the color filter is preferably formed on a support. The support is not particularly limited.

As the support, a substrate (a silicon wafer, a silicon carbide wafer, a silicon nitride wafer, a sapphire wafer, a glass wafer, and the like) used in various electronic devices such as a solid-state imaging element can be used. In addition, an undercoating layer may be provided on the substrate, as desired, in order to improve the adhesion to upper layers, prevent diffusion of a substance, or planarize a surface.

In the structure of the embodiment of the present invention, the color filter has two or more different types of pixels. The color filter used in the present invention preferably has at least one colored pixel. Examples of the colored pixel include a green pixel, a red pixel, a blue pixel, a cyan pixel, a magenta pixel, and a yellow pixel, and preferably include at least one selected from the green pixel or the red pixel. The colored pixel can be formed with a composition for forming a colored pixel, including a colorant which will be described later. The green pixel used in the present invention preferably includes a phthalocyanine pigment, and more preferably includes a halogenated zinc phthalocyanine pigment. The composition for forming a colored pixel will be described later.

Moreover, with regard to a pixel including the phthalocyanine pigment (particularly a phthalocyanine-based green pigment), the light resistance is improved by increasing the oxygen concentration of the pixel in some cases. Examples of increasing the oxygen concentration in the pixel include a method of reducing the thickness of a film (for example, an antireflection film) formed between outside air and the structure of the embodiment of the present invention, a method of making the above-mentioned film discontinuous, and a method for lowering a density of the above-mentioned film.

Furthermore, the colored pixel may include a colorant for only one color, or may include colorants for two or more colors. For example, a green pixel may include only a green colorant as a colorant which will be described later, or may further include a yellow colorant, in addition to the green colorant. By incorporating the yellow colorant into the green pixel, color separation characteristics with other colors can be enhanced. Further, for example, a red pixel may include only a red colorant as a colorant which will be described later, or may further include a yellow colorant, in addition to the red colorant. By incorporating the yellow colorant into the red pixel, color separation characteristics with other colors can be enhanced. In addition, in a case where the above-mentioned absorption layer is provided on the green pixel, it is possible to enhance the color separation characteristics of the green pixel with the absorption layer even while not incorporating the yellow colorant into the green pixel, and it is also possible to expect the same effect as in a case of incorporating the yellow colorant into the green pixel. Similarly, in a case of the red pixel, it is possible to enhance the color separation characteristics of the red pixel with the absorption layer even while not incorporating the yellow colorant into the red pixel in a case where the above-mentioned absorption layer is provided on the red pixel, and it is also possible to expect the same effect as in a case of incorporating the yellow colorant into the red pixel.

Moreover, in a case of adjusting the spectral characteristics of the colored pixels by using two or more colorants in combination, films with two or more layers may be laminated to adjust the spectral characteristics to desired ones. For example, in a case of adjusting the spectral characteristics of the green pixel by using the green colorant and the yellow colorant in combination, a film including the green colorant and a film including the yellow colorant may be laminated to adjust the spectral characteristics to desired ones. In addition, the lamination forms described in JP2017-167389A and JP2017-194560A can also be applied to the present invention.

Furthermore, the color filter may include at least one pixel selected from a transparent pixel or a pixel of an infrared transmitting layer, in addition to the colored pixel.

A minimum value in the transmittance in a wavelength range of 400 to 600 nm of the transparent pixel is preferably 80% or more, more preferably 90% or more, and still more preferably 95% or more. The transparent pixel can be formed with a composition for forming a transparent pixel which will be described later.

The pixel of the infrared transmitting layer only needs to be a pixel having spectral characteristics of blocking visible light and transmitting at least a part of infrared rays, and is not particularly limited. The pixel of the infrared transmitting layer can be formed with a composition for forming an infrared transmitting layer which will be described later.

Preferred examples of the pixel of the infrared transmitting layer include a pixel having any one of spectral characteristics of (1) to (4) below.

(1): A pixel in which a maximum value of a light transmittance in the thickness direction in a wavelength range of 400 to 640 nm is 20% or less (preferably 15% or less, and more preferably 10% or less), and a minimum value of a light transmittance in the thickness direction in a wavelength range of 800 to 1,300 nm is 70% or more (preferably 75% or more, and more preferably 80% or more). With this pixel, it is possible to block light in a wavelength range of 400 to 640 nm and transmit light in a wavelength range of more than 670 nm.

(2): A pixel in which a maximum value of a light transmittance in the thickness direction in a wavelength range of 400 to 750 nm is 20% or less (preferably 15% or less, and more preferably 10% or less), and a minimum value of a light transmittance in the thickness direction in a wavelength range of 900 to 1,300 nm is 70% or more (preferably 75% or more, and more preferably 80% or more). With this pixel, it is possible to block light in a wavelength range of 400 to 750 nm and transmit light in a wavelength range of more than 850 nm.

(3): A pixel in which a maximum value of a light transmittance in the thickness direction in a wavelength range of 400 to 830 nm is 20% or less (preferably 15% or less, and more preferably 10% or less), and a minimum value of a light transmittance in the thickness direction in a wavelength range of 1,000 to 1,300 nm is 70% or more (preferably 75% or more, and more preferably 80% or more). With this pixel, it is possible to block light in a wavelength range of 400 to 830 nm and transmit light in a wavelength range of more than 940 nm.

(4): A pixel in which a maximum value of a light transmittance in the thickness direction in a wavelength range of 400 to 950 nm is 20% or less (preferably 15% or less, and more preferably 10% or less), and a minimum value of a light transmittance in the thickness direction in a wavelength range of 1,100 to 1,300 nm is 70% or more (preferably 75% or more, and more preferably 80% or more). With this pixel, it is possible to block light in a wavelength range of 400 to 950 nm and transmit light in a wavelength range of more than 1,040 nm.

In the structure of the embodiment of the present invention, the color filter only needs to have two or more different types of pixels, and examples there include aspects of (1) to (3) below.

(1) An aspect in which a color filter includes only two or more colored pixels (having two or more different colors).

(2) An aspect in which the color filter includes two or more colored pixels (having two or more different colors), and a transparent pixel and/or a pixel of an infrared transmitting layer.

(3) An aspect in which a color filter includes only one colored pixel (having one color), and a transparent pixel and/or a pixel of an infrared transmitting layer.

As the colored pixel in the aspects of (1) and (2), at least one selected from a green pixel or a red pixel is preferably included, and at least a green pixel, a red pixel, and a blue pixel are more preferably included.

It is preferable that the coloring pixel in the aspect of (3) is a green pixel or a red pixel.

The thickness of each pixel of the color filter is not particularly limited. For example, the thickness is preferably 100 μm or less, more preferably 15 μm or less, still more preferably 5 μm or less, and particularly preferably 1 μm or less. Further, the thickness of each pixel may be different from each other, but is preferably substantially the same as each other. In addition, it is preferable that the height differences between the top surfaces of the pixels are substantially the same as each other.

(Absorption Layer)

The structure of the embodiment of the present invention has an absorption layer including at least one selected from a yellow colorant or a colorant having a maximum absorption wavelength in a wavelength range of 400 to 500 nm on an optical path of at least one pixel of the pixels of the color filter and on the side through which light is incident on the above-mentioned pixel. Hereinafter, the yellow colorant and the colorant having a maximum absorption wavelength in a wavelength range of 400 to 500 nm may be collectively referred to as a colorant Y.

Figure 2:
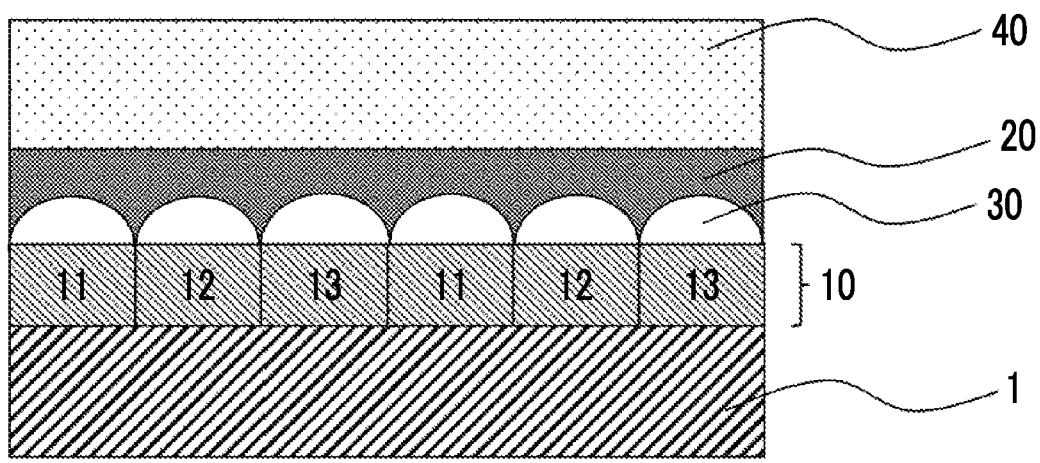
FIG. 2 is a schematic view showing an embodiment of the structure of the present invention.
Figure 3:
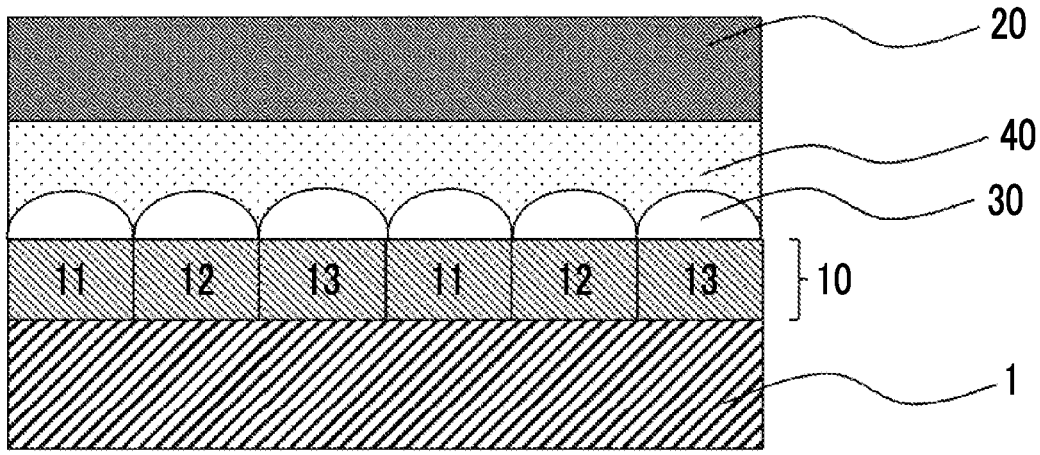
FIG. 3 is a schematic view showing an embodiment of the structure of the present invention.
Figure 4:
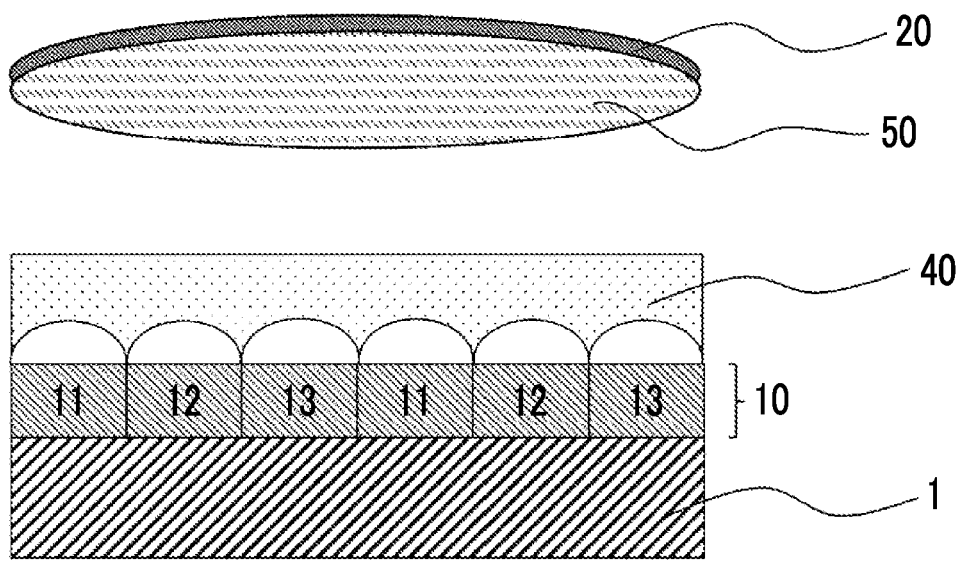
FIG. 4 is a schematic view showing an embodiment of the structure of the present invention.
Figure 5:
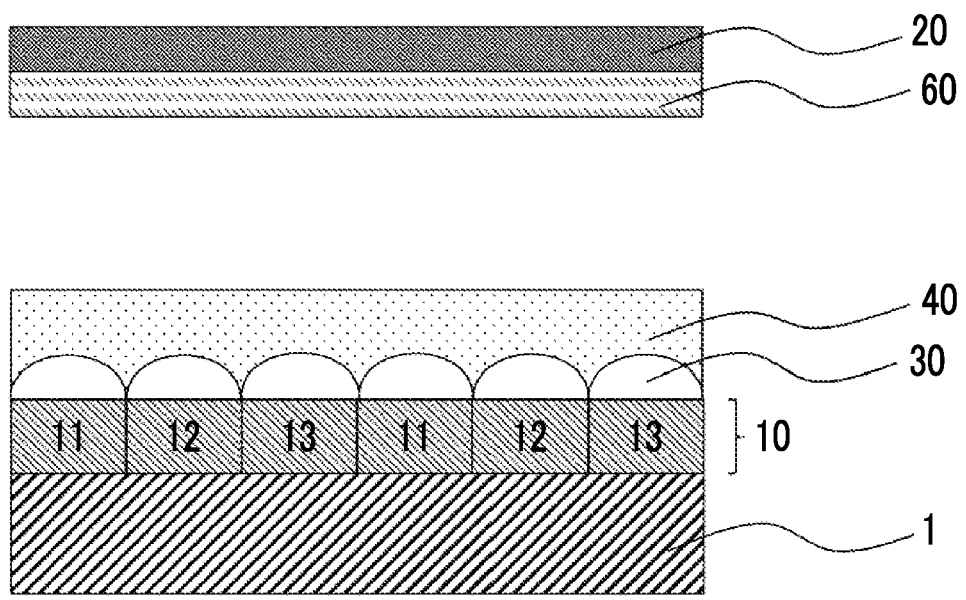
FIG. 5 is a schematic view showing an embodiment of the structure of the present invention.
Figure 6:
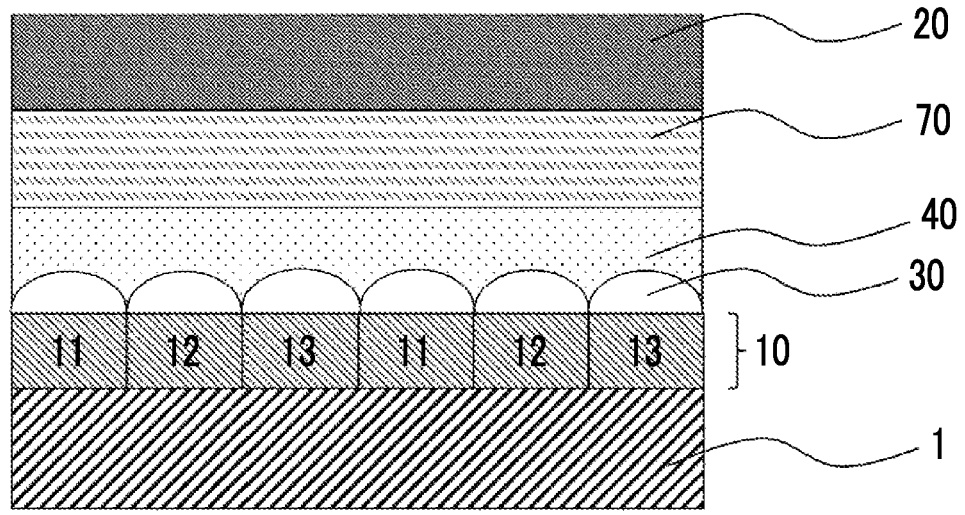
FIG. 6 is a schematic view showing an embodiment of the structure of the present invention.

The absorption layer in the structure of the embodiment of the present invention only needs to be provided on the side through which light is incident on the pixel of the color filter. In the present specification, an expression that the absorption layer is provided on the side through which light is incident on the pixel of the color filter means that, for example, in a case the color filter is provided on a support, it is preferable that the absorption layer is provided on a side opposite to the support with respect to the color filter. For example, an absorption layer 20 may be provided on a surface of a color filter 10 as shown in FIG. 1, or the absorption layer 20 may be provided on a microlens 30 provided on the side through which light is incident on the color filter 10 or on a surface of a planarization layer 40 as shown in FIGS. 2 and 3. In addition, the absorption layer 20 may also be provided on another member provided on the side through which light is incident on the color filter 10, such as a surface of a light collecting lens 50 (see FIG. 4), a surface of an infrared blocking filter 60 (see FIG. 5), and a surface of a sealing glass 70 (see FIG. 6). An aspect in which the absorption layer 20 is provided on a surface of the color filter 10 (that is, an aspect in which the pixel of the color filter and the absorption layer are in contact with each other) as shown in FIG. 1 is preferable. According to the aspect, the moisture resistance of the color filter can be more remarkably improved. In addition, in FIGS. 4 and 5, it is drawn that the light collecting lens 50 and an infrared cut filter 60 are kept apart from the planarization layer 40, but some members may be provided between the light collecting condenser lens 50 or the infrared cut filter 60 and the planarization layer 40, depending on the application.

Moreover, in FIGS. 1 to 6, a reference 1 is a support. In addition, in FIGS. 1 to 6, the color filter 10 has pixels 11 to 13, the absorption layer 20 is provided on the optical paths of the pixels 11 to 13 of the color filter, but the absorption layer 20 only needs to be provided on an optical path of at least one pixel of the pixel 11, . . . , or 13 and the absorption layer 20 does not need to be provided on all the optical paths of the pixels 11 to 13. In addition, in FIG. 4, the absorption layer 20 is provided only on a surface of the light incident side of the light collecting lens 50, but may be provided only on a surface of the light exiting side of the light collecting lens 50 or on both surfaces of the light incident side and the light exiting side of the light collecting lens 50. The same applies to FIGS. 5 and 6.

Figure 7:
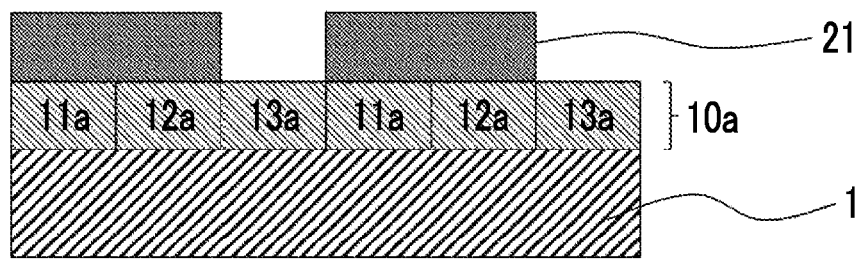
FIG. 7 is a schematic view showing an embodiment of the structure of the present invention.

The absorption layer in the structure of the embodiment of the present invention only needs to be provided on an optical path of at least one pixel of the pixels of the color filter. Further, the absorption layer may have a pattern or may be a film not having a pattern (planarized film). Examples of the case where the absorption layer does not have a pattern include a case where the absorption layer is provided on the optical paths of all the pixels of the color filter. Further, in the case where the color of the pixels of the color filter is affected by the absorption layer, it is preferable that the absorption layer is not provided on the optical paths of these pixels. Examples of the pixels of the type that gives an effect on the color by the absorption layer include colored pixels of tints having transmission regions in a wavelength range of 400 to 500 nm, such as a blue pixel, a cyan pixel, and a magenta pixel. For example, FIG. 7 has a color filter 10a formed of a red pixel 11a, a green pixel 12a, and a blue pixel 13a on a support 1, but in this case, it is preferable that an absorption layer 21 is provided on an optical path of at least one pixel of the red pixel 11a or the green pixel 12a and is not provided on an optical path of the blue pixel 13a. In addition, in FIG. 7, the absorption layer 21 is provided on the optical paths of both of the red pixel 11a and the green pixel 12a, but an aspect in which the absorption layer 21 is provided only on an optical path of one of the red pixel 11a and the green pixel 12a is also available.

Figure 8:
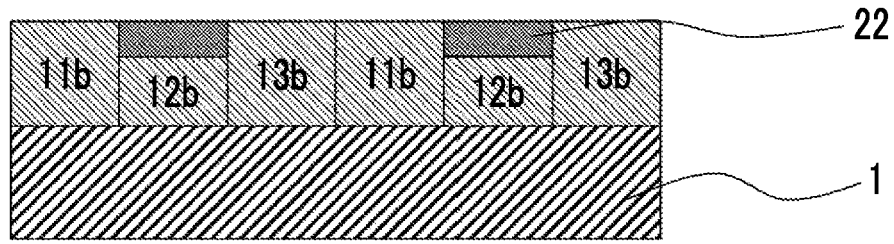
FIG. 8 is a schematic view showing an embodiment of the structure of the present invention.

Moreover, in a case where an absorption layer is provided only on the optical paths of some of the pixels of a color filter, the height of the upper surface of the absorption layer and the height of the upper surface of the pixels not provided with the absorption layer may be set to be almost the same as each other by adjusting a total thickness of the absorption layer and the pixels provided with the absorption layer to be the same as the thickness of the pixels not provided with the absorption layer. For example, the structure shown in FIG. 8 has a color filter formed of a red pixel 11b, a green pixel 12b, and a blue pixel 13b on a support 1. Further, the absorption layer 22 is provided only on an optical path of the green pixel 12a. A total thickness of the green pixel 12b and the absorption layer 22, the thickness of the red pixel 11b, and the thickness of the blue pixel 13b are almost the same, and the heights of the upper surfaces of the absorption layer 22, the red pixel 11b, and the blue pixel 13b are each almost the same as each other.

Next, the colorant Y used for the absorption layer will be described. The colorant Y used in the absorption layer may be either a pigment or a dye, but is preferably the pigment for a reason that it is easy to obtain more excellent light resistance and moisture resistance. Further, the average particle diameter of the pigment is preferably 0.01 to 0.1 μm, and more preferably 0.01 to 0.05 μm. Incidentally, in the present invention, a pigment means an insoluble dye compound which is hardly soluble in a solvent. Further, a dye refers to a dye compound that is dissolved in a solvent. For examples, both of an amount of the pigment used in the present invention, dissolved in 100 g of propylene glycol monomethyl ether acetate at 25° C., and an amount of the pigment dissolved in 100 g of water at 25° C. are preferably 0.1 g or less, more preferably 0.05 g or less, and still more preferably 0.01 g or less. In addition, at least one of an amount of the dye used in the present invention, dissolved in 100 g of propylene glycol monomethyl ether acetate at 25° C., and an amount of the dye dissolved in 100 g of water at 25° C. is preferably more than 0.1 g, more preferably 1 g or more, and still more preferably 5 g or more.

The content of the pigment of the colorant Y is preferably 50% by mass or more, more preferably 70% by mass or more, and still more preferably 90% by mass or more, and particularly preferably, the colorant Y includes substantially only the pigment. Here, a case where the colorant Y has substantially only the pigment means that the content of the pigment in the colorant Y is 99% by mass or more, and the content of the pigment is preferably 99.5% by mass or more, and more preferably 99.9% by mass or more, and particularly preferably, the colorant Y is only formed of the pigment.

The colorant Y is preferably at least one selected from an azo compound or an isoindoline compound, more preferably the azo compound, and still more preferably the azo compound having a barbituric acid structure.

The colorant Y preferably has a maximum absorption wavelength in a wavelength range of 450 to 500 nm, and more preferably has a maximum absorption wavelength in a wavelength range of 450 to 460 nm.

Specific examples of the colorant Y include yellow pigments such as Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214, and yellow dyes such as C. I. absorber Yellow 4, 82, 88, 14, 15, 24, 93, 94, 98, and 162. As the colorant Y, at least one selected from C. I. Pigment Yellow 139, C. I. Pigment Yellow 150, or C. I. Pigment Yellow 185 is preferable, and C. I. Pigment Yellow 150 is more preferable.

Moreover, as the colorant Y, a compound having a structure represented by each of Formulae (Y1) to (Y4) can also be used.

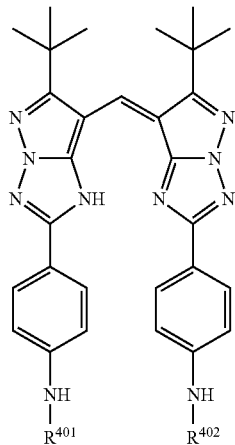

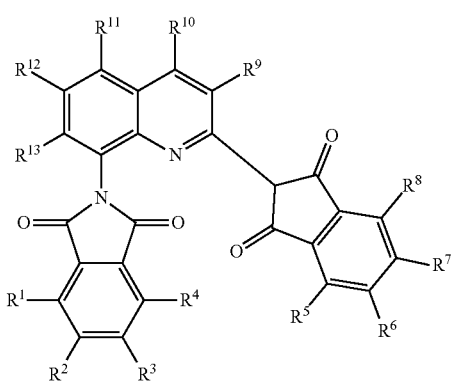

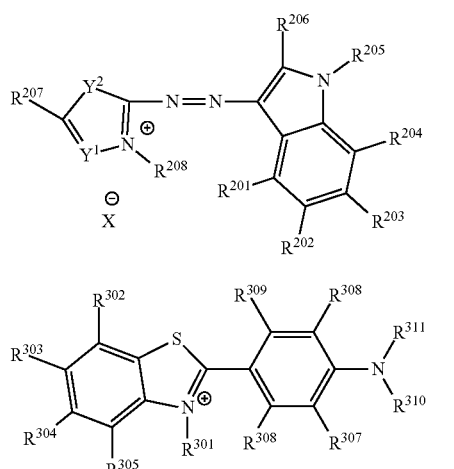

In Formula (Y1), $R^1$ to $R^{13}$ each independently represent a hydrogen atom or a substituent, and groups adjacent to $R^1$ to $R^8$ may be bonded to form a ring. It should be noted that at least one set of two groups adjacent to $R^1$ to $R^8$ may be bonded to each other to form an aromatic ring.

In Formula (Y2), $R^{205}$ and $R^{208}$ each independently represent a hydrogen atom, an alkyl group, an aryl group, or a heteroaryl group, $R^{201}$ to $R^{204}$, $R^{206}$, and $R^{207}$ each independently represent a hydrogen atom or a substituent, $Y^1$ represents a nitrogen atom or $—CR^{Y1}—$, $Y^2$ represents a sulfur atom or $—NR^{Y2}—$, $R^{Y1}$ and $R^{Y2}$ each independently represent a hydrogen atom, an alkyl group, an aryl group, or a heteroaryl group, and X represents a bis(sulfonyl)imide anion, a tris(sulfonyl)methide anion, or an anion having a boron atom.

In Formula (Y3), $R^{301}$, $R^{311}$, and $R^{310}$ each independently represent a hydrogen atom, an alkyl group, an aryl group, or a heteroaryl group, $R^{302}$ to $R^{305}$ and $R^{306}$ to $R^{309}$ each independently represent a hydrogen atom or a substituent, and X represents a bis(sulfonyl)imide anion, a tris(sulfonyl) methide anion, or an anion having a boron atom.

In Formula (Y4), $R^{401}$ and $R^{402}$ each independently represent $SO_2R^{403}$ or $COR^{403}$; and $R^{403}$ represents an alkyl group, an aryl group, or a heteroaryl group.

With regard to the details of Formulae (Y1) to (Y4), reference can be made to the description in paragraph Nos. 0016 to 0046 of WO2017/082226A, contents of which are incorporated herein by reference.

Furthermore, the quinophthalone compounds described in paragraph Nos. 0011 to 0034 of JP2013-054339A, the quinophthalone compounds described in paragraph Nos. 0013 to 0058 of JP2014-026228A, or the like can also be used as the colorant Y.

In the structure of the embodiment of the present invention, the absorption layer preferably contains the colorant Y in the amount of 30% to 99% by mass. The upper limit of the content is preferably 95% by mass or less, more preferably 90% by mass or less, and still more preferably 85% by mass or less. The lower limit of the content is preferably 40% by mass or more, more preferably 45% by mass or more, and still more preferably 50% by mass or more. The absorption layer may include only one kind or two or more kinds of the colorants Y In a case where two or more kinds of the colorants Y are included, the total amount thereof is preferably within the range.

In the structure of the embodiment of the present invention, preferably 50% by mass or more, more preferably 70% by mass or more, and still more preferably 90% by mass or more of the colorant Y included in the absorption layer is at least one selected from an azo compound or an isoindoline compound (preferably the azo compound, and more preferably the azo compound having a barbituric acid structure).

In addition, in the structure of the embodiment of the present invention, preferably 50% by mass or more, more preferably 70% by mass or more, and still more preferably 90% by mass or more of the colorant Y included in the absorption layer is at least one (preferably C. I. Pigment Yellow 150) selected from C. I. Pigment Yellow 139, C. I. Pigment Yellow 150, or C. I. Pigment Yellow 185.

In the structure of the embodiment of the present invention, it is preferable that the absorption layer does not substantially include a colorant other than the colorant Y. According to this aspect, it is possible to improve the light resistance of the color filter while not giving an effect on the color of the pixel of the color filter. In a case where the absorption layer does not substantially include a colorant other than the colorant Y, the content of the colorant other than the colorant Y is preferably 1 part by mass or less, more preferably 0.5 parts by mass or less, and still more preferably 0.1 parts by mass or less, with respect to 100 parts by mass of the colorant Y, and particularly preferably, the colorant is not contained.

In the structure of the embodiment of the present invention, it is also preferable that the absorption layer further includes an ultraviolet absorber. According to this aspect, it is possible to more remarkably improve the light resistance of the color filter since the absorption layer can make it possible to absorb light in the vicinity of the ultraviolet region among not only the lights in the visible region but also the light in the ultraviolet region.

The ultraviolet absorber is preferably a compound having a maximum absorption wavelength in the range of 300 to 380 nm, and more preferably a compound having a maximum absorption wavelength in the range of 320 to 380 nm. In addition, the molar absorption coefficient of the ultraviolet absorber at a wavelength of 365 nm is preferably 5,000 $L \cdot mol^{-1} \cdot cm^{-1}$ or more, more preferably 10,000 $L \cdot mol^{-1} \cdot cm^{-1}$ or more, and still more preferably 30,000 $L \cdot mol^{-1} \cdot cm^{-1}$ or more. The upper limit thereof is, for example, preferably 100,000 $L \cdot mol^{-1} \cdot cm^{-1}$ or less. By using such a compound, the effects of the present invention are more remarkably obtained.

As the ultraviolet absorber, a conjugated diene compound, a methyldibenzoyl compound, a coumarin compound, a salicylate compound, a benzophenone compound, a benzotriazole compound, an acrylonitrile compound, a triazine compound, a benzodithiazole compound, or the like can be used. Among those, at least one selected from the benzotriazole compound, the benzophenone compound, or the triazine compound is preferable, and the triazine compound is more preferable.

The conjugated diene compound is preferably a compound represented by Formula (UV-1).

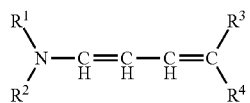

(UV-1)

In Formula (UV), $R^1$ and $R^2$ each independently represent a hydrogen atom, an alkyl group having 1 to 20 carbon atoms, or an aryl group having 6 to 20 carbon atoms, and $R^1$ and $R^2$ may be the same as or different from each other, but do not represent a hydrogen atom at the same time in any case.

$R^1$ and $R^2$ may form a cyclic amino group together with the nitrogen atom to which $R^1$ and $R^2$ are bonded. Examples of the cyclic amino group include a piperidino group, a morpholino group, a pyrrolidino group, a hexahydroazepino group, and a piperazino group.

$R^1$ and $R^2$ are each independently preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ each represent an electron-withdrawing group. R $R^3$ and $R^4$ are each preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, among which the acyl group, the carbamoyl group, the alkyloxycarbonyl group, the aryloxycarbonyl group, the cyano group, the alkylsulfonyl group, the arylsulfonyl group, the sulfonyloxy group, or the sulfamoyl group are preferable. Further, $R^3$ and $R^4$ may be bonded to each other to form a cyclic electron-withdrawing group. Examples of the cyclic electron-withdrawing group formed by mutual bonding of $R^3$ and $R^4$ include a 6-membered ring including two carbonyl groups.

At least one of $R^1$, $R^2$, $R^3$, or $R^4$ may be in the form of a polymer derived from a monomer bonded to a vinyl group via a linking group. Alternately, at least one of $R^1$, $R^2$, $R^3$, or $R^4$ may be a copolymer with other monomers.

With regard to a description of the substituents of the ultraviolet absorber represented by Formula (UV-1), reference can be made to the description in paragraphs 0024 to 0033 of WO2009/123109A (corresponding to paragraph Nos. 0040 to 0059 of US2011/0039195A), the contents of which are incorporated herein by reference. Specific examples of the ultraviolet absorber represented by Formula (UV-1) include the following compounds. In addition, with regard to specific preferred examples of the compound represented by Formula (UV-1), reference can be made to the description of the exemplary compounds (1) to (14) in paragraph Nos. 0034 to 0037 of WO2009/123109A (corresponding to paragraph No. 0060 of US2011/0039195A), the contents of which are incorporated herein by reference. Examples of a commercially available product of the ultraviolet absorber represented by Formula (UV-1) include UV503 (manufactured by Daito Chemical Co., Ltd.).

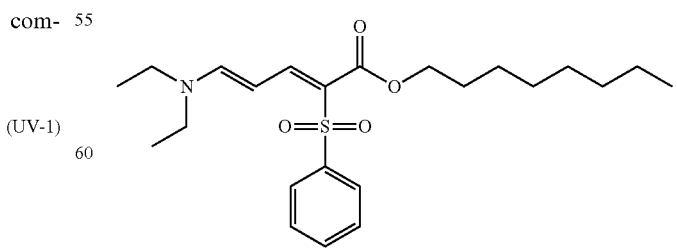

As the methyldibenzoyl compound, a compound represented by Formula (UV-2) is preferable.

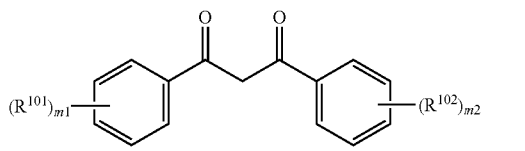

(UV-2)

In Formula (UV-2), $R^{101}$ and $R^{102}$ each independently represent a substituent, and m1 and m2 each independently represent 0 to 4.

Examples of the substituent represented by each of $R^{101}$ and $R^{102}$ include a halogen atom, cyano group, a nitro group, an alkyl group, an aryl group, a heteroaryl group, an alkoxy group, an aryloxy group, a heteroaryloxy group, an alkylthio group, an arylthio group, a heteroarylthio group, —$NR^{U1}R^{U2}$, —$COR^{U3}$, —$COOR^{U4}$, —$OCOR^{U5}$, —NH-$COR^{U6}$, —$CONR^{U7}R^{U8}$, —$NHCONR^{U9}R^{U10}$, —$NHCOOR^{U11}$, —$SO_2R^{U12}$, —$SO_2OR^{U13}$, —$NHSO_2R^{U14}$, and —$SO_2NR^{U15}R^{U16}$. $R^{U1}$ to $R^{U16}$ each independently represent a hydrogen atom, an alkyl group having 1 to 8 carbon atoms, or an aryl group.

The substituents represented by $R^{101}$ and $R^{102}$ are each independently preferably an alkyl group or an alkoxy group. The number of carbon atoms of the alkyl group is preferably 1 to 20, and more preferably 1 to 10. Examples of the alkyl group include linear, branched, and cyclic alkyl groups, the linear or branched alkyl group is preferable, and the branched alkyl group is more preferable. The number of carbon atoms of the alkoxy group is preferably 1 to 20, and more preferably 1 to 10. The alkoxy group is preferably linear or branched, and more preferably branched.

In Formula (UV-2), a combination in which one of $R^{101}$ and $R^{102}$ is an alkyl group, and the other is an alkoxy group is preferable.

m1 and m2 each independently represent 0 to 4. m1 and m2 are each independently preferably 0 to 2, more preferably 0 to 1, and particularly preferably 1.

Specific examples of the compound represented by Formula (UV-2) include avobenzone.

Examples of the benzotriazole compound include 2-(2'-hydroxy-3',5'-di-tert-butylphenyl)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3',5'-di-tert-butylphenyl)benzotriazole, 2-(2'-hydroxy-5'-methylphenyl)benzotriazole, 2-[2'-hydroxy-5'-(1,1,3,3-tetramethyl)phenyl]benzotriazole, 2-(2-hydroxy-5-tert-butylphenyl)-2H-benzotriazole, 3-(2H-benzotriazol-2-yl)-5-(1,1-dimethylethyl)-4-hydroxy, 2-(2H-benzotriazol-2-yl)-4,6-bis(1-methyl-1-phenylethyl)phenol, and 2-(2H-benzotriazol-2-yl)-6-(1-methyl-1-phenylethyl)-4-(1,1,3,3-tetramethylbutyl)phenol. Examples of a commercially available product thereof include TINUVIN PS, TINUVIN 99-2, TINUVIN 109, TINUVIN 328, TINUVIN 384-2, TINUVIN 900, TINUVIN 928, TINUVIN 171, and TINUVIN 1130 (all manufactured by BASF). As the benzotriazole compound, MYUA series manufactured by Miyoshi Oil & Fat Co., Ltd. (The Chemical Daily, Feb. 1, 2016) may be used.

Examples of the triazine compound include TINUVIN 400, TINUVIN 405, TINUVIN 460, TINUVIN 477, and TINUVIN 479 (all manufactured by BASF).

Examples of the benzophenone compound include 2-hydroxy-4-n-octyloxybenzophenone and 2,2',4,4'-tetrahydroxybenzophenone. Examples of a commercially available product thereof include UVINUL A, UVINUL 3049, and UVINUL 3050 (all manufactured by BASF).

Examples of the coumarin compound include coumarin-4,4-hydroxycoumarin and 7-hydroxycoumarin.

In the structure of the embodiment of the present invention, the absorption layer preferably contains the ultraviolet absorber in the amount of 0.1% to 90% by mass. The upper limit of the content is more preferably 50% by mass or less, still more preferably 30% by mass or less, and even still more preferably 20% by mass or less. The lower limit of the content is more preferably 1% by mass or more, still more preferably 3% by mass or more, and even still more preferably 5% by mass or more.

In addition, the absorption layer preferably contains the ultraviolet absorber in the amount of 0.1 to 200 parts by mass with respect to 100 parts by mass of the colorant Y The upper limit of the content is more preferably 100 parts by mass or less, still more preferably 50 parts by mass or less, and even still more preferably 30 parts by mass or less. The lower limit of the content is more preferably 1 part by mass or more, still more preferably 5 parts by mass or more, and even still more preferably 10 parts by mass or more. In a case where the ratio of the colorant Y to the ultraviolet absorber is within the range, it is possible to expect an effect that light in the vicinity of the ultraviolet region is efficiently blocked to further enhance the light resistance of the pixel.

The absorption layer may include only one kind or two or more kinds of the ultraviolet absorbers. In a case where two or more kinds of the ultraviolet absorbers are included, the total amount thereof is preferably within the range.

In the structure of the embodiment of the present invention, the absorption layer can be formed with a composition for forming an absorption layer, including the colorant Y The absorption layer is preferably obtained by curing a composition for forming an absorption layer, including the colorant Y and a curable compound. It is also preferable that the composition for forming an absorption layer further includes an ultraviolet absorber. Details of the composition for forming an absorption layer will be described later.

In the structure of the embodiment of the present invention, the thickness of the absorption layer is preferably 0.001 to 10 μm. The upper limit thereof is more preferably 5 μm or less, still more preferably 1 μm or less, and even still more preferably 0.5 μm or less. The lower limit of the thickness is more preferably 0.01 μm or more, still more preferably 0.05 μm or more, and even still more preferably 0.1 μm or more.

A minimum value of the transmittance of the absorption layer in a wavelength range of more than 500 nm and 700 nm or less is preferably 60% or more, more preferably 70% or more, and still more preferably 80% or more.

Furthermore, the transmittance of the absorption layer at some wavelengths in a wavelength range from 400 nm to 500 nm (preferably at least some wavelengths in a wavelength range from 400 nm to 450 nm, and more preferably the entire wavelength range from 400 nm to 450 nm) is preferably 10% or less, more preferably 5% or less, and still more preferably 1% or less.

In addition, the transmittance of the absorption layer at some wavelengths in a wavelength range of 300 nm or more and less than 400 nm (preferably at least some wavelengths in a wavelength range of 300 nm or more and less than 400 nm, and more preferably the entire wavelength range of 300 nm or more and less than 400 nm) is preferably 10% or less, more preferably 5% or less, and still more preferably 1% or less.

The structure of the embodiment of the present invention may further have layers or members such as a planarization layer, a microlens, a light collecting lens, an infrared blocking filter, and a sealing glass. These layers or members can be selected as appropriate, depending on the application of the structure. In addition, in a case where these layers or members are provided on the optical paths of the pixels of the color filter and on the side through which light is incident on the pixels, the absorption layer may be provided on such a member, as described above.

The structure of the embodiment of the present invention can be used after being introduced into a solid-state imaging element or an image display device (for example, a liquid crystal display device and an organic electroluminescence (organic EL) display device).

<Composition for Forming Absorption Layer>

Next, the composition for forming an absorption layer (composition for forming an absorption layer) of the structure of the embodiment of the present invention will be described.

<<Coloring Agent Y>>

The composition for forming an absorption layer includes at least one (colorant Y) selected from a yellow colorant or a colorant having a maximum absorption wavelength in a wavelength range of 400 to 500 nm. Details and preferred ranges of the yellow colorant and the colorant having a maximum absorption wavelength in a wavelength range of 400 to 500 nm are the same as the contents described in the section of the absorption layer as described above.

The content of the colorant Y is preferably 30% to 99% by mass with respect to the total solid content of the composition for forming an absorption layer. The upper limit thereof is more preferably 95% by mass or less, still more preferably 90% by mass or less, and even still more preferably 85% by mass or less. The lower limit is more preferably 40% by mass or more, still more preferably 45% by mass or more, and even still more preferably 50% by mass or more. The composition for forming an absorption layer may include only one kind or two or more kinds of the colorants Y In a case where two or more kinds of the colorants Y are included, the total amount thereof is preferably within the range.

<<Other Coloring Agents>>

It is preferable that the composition for forming an absorption layer does not substantially include a colorant other than the colorant Y According to this aspect, it is possible to improve the light resistance of the color filter while not giving an effect on the color of the pixel of the color filter. A case where the composition for forming an absorption layer does not substantially include a colorant other than the colorant Y means that the content of the colorant other than the colorant Y is preferably 1 part by mass or less, more preferably 0.5 parts by mass or less, and still more preferably 0.1 parts by mass or less, with respect to 100 parts by mass of the colorant Y, and particularly preferably the colorant other than the colorant Y is not contained.

<<Ultraviolet Absorber>>

It is preferable that the composition for forming an absorption layer further includes an ultraviolet absorber, in addition to the colorant Y. According to this aspect, it is possible to more remarkably improve the light resistance of the color filter. Details and preferred ranges of the ultraviolet absorber are the same as the contents of the section of the absorption layer as described above.

In a case where the composition for forming an absorption layer contains an ultraviolet absorber, the content of the ultraviolet absorber is preferably 0.1% to 90% by mass with respect to the total solid content of the composition for forming an absorption layer. The upper limit thereof is more preferably 50% by mass or less, still more preferably 30% by mass or less, and even still more preferably 20% by mass or less. The lower limit of the content is more preferably 1% by mass or more, still more preferably 3% by mass or more, and even still more preferably 5% by mass or more.

In addition, it is preferable that the composition for forming an absorption layer contains 0.1 to 200 parts by mass of the ultraviolet absorber with respect to 100 parts by mass of the colorant Y. The upper limit of the amount is more preferably 100 parts by mass or less, still more preferably 50 parts by mass or less, and even still more preferably 30 parts by mass or less. The lower limit of the amount is more preferably 1 part by mass or more, still more preferably 5 parts by mass or more, and even still more preferably 10 parts by mass or more.

The composition for forming an absorption layer may include only one kind or two or more kinds of the ultraviolet absorbers. In a case where two or more kinds of the ultraviolet absorbers are included, the total amount thereof is preferably within the range.

<<Curable Compound>>

It is preferable that the composition for forming an absorption layer further includes a curable compound. According to this aspect, it is possible to more effectively improve the light resistance and the moisture resistance of the color filter. As the curable compound, a well-known polymerizable compound which is crosslinkable by a radical, an acid, or heat can be used. Examples of the curable compound include a compound having an ethylenically unsaturated bond group and a compound having an epoxy group, and the compound having an ethylenically unsaturated bond group is preferable. Examples of the group having an ethylenically unsaturated bond include a vinyl group, a (meth)allyl group, and a (meth)acryloyl group. As the compound having an ethylenically unsaturated bond group, a polymerizable compound is preferable, and a radically polymerizable compound is more preferable.

In a case where the composition for forming an absorption layer contains a curable compound, the content of the curable compound is preferably 1% to 60% by mass with respect to the total solid content of the composition for forming an absorption layer. The lower limit thereof is, for example, more preferably 5% by mass or more, and still more preferably 10% by mass or more. The upper limit is, for example, more preferably 50% by mass or less, and still more preferably 40% by mass or less. The curable compound may be used singly or in combination of two or more kinds thereof. In a case where two or more kinds of the curable compounds are included, the total amount thereof is preferably within the range.

(Compound Having Ethylenically Unsaturated Bond Group)

The compound having an ethylenically unsaturated bond group may be any of chemical forms such as a monomer, a prepolymer, and an oligomer, but is preferably the monomer. The molecular weight of the compound having an ethylenically unsaturated bond group is preferably 100 to 3,000. The upper limit thereof is more preferably 2,000 or less, and still more preferably 1,500 or less. The lower limit of the molecular weight is more preferably 150 or more, and still more preferably 250 or more.

The compound having an ethylenically unsaturated bond group is preferably a compound having 3 or more ethylenically unsaturated bond groups, more preferably a compound having 3 to 15 ethylenically unsaturated bond groups, and still more preferably a compound having 3 to 6 ethylenically unsaturated bond groups. Further, the compound having an ethylenically unsaturated bond group is preferably a trifunctional to pentadecafunctional (meth)acrylate compound, and more preferably a trifunctional to hexafunctional (meth)acrylate compound. Specific examples of the compound having an ethylenically unsaturated bond group include the compounds described in paragraph Nos. 0095 to 0108 of JP2009-288705A, paragraph 0227 of JP2013-029760A, and paragraph Nos. 0254 to 0257 of JP2008-292970A, the contents of which are incorporated herein by reference.

As the compound having an ethylenically unsaturated bond group, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd. and NK Ester A-DPH-12E manufactured by Shin-Nakamura Chemical Co., Ltd.), or a compound having a structure in which the (meth)acryloyl group is bonded via an ethylene glycol and/or propylene glycol residue (for example, SR454 and SR499, commercially available from Sartomer Company, Inc.) is preferable. Oligomer types of these can also be used. In addition, as the compound having an ethylenically unsaturated bond group, NK Ester A-TMMT manufactured by Shin-Nakamura Chemical Co., Ltd., or KAYARAD RP-1040 or DPCA-20 manufactured by Nippon Kayaku Co., Ltd. can also be used. In addition, as the compound having an ethylenically unsaturated bond group, a trifunctional (meth)acrylate compound such as trimethylolpropane tri(meth)acrylate, trimethylolpropane propyleneoxy-modified tri(meth)acrylate, trimethylolpropane ethyleneoxy-modified tri(meth)acrylate, isocyanuric acid ethyleneoxy-modified tri(meth)acrylate, and pentaerythritol tri(meth)acrylate can also be preferably used. Examples of a commercially available product of the trifunctional (meth)acrylate compound include ARONIX M-309, M-310, M-321, M-350, M-360, M-313, M-315, M-306, M-305, M-303, M-452, and M-450 (manufactured by Toagosei Co., Ltd.), NK Ester A9300, A-GLY-9 E, A-GLY-20 E, A-TMM-3, A-TMM-3 L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the compound having an ethylenically unsaturated bond group, a compound having an acid group can be used. Examples of the acid group include a carboxyl group, a sulfo group, and a phosphoric acid group, and the carboxyl group is preferable. Examples of a commercially available product of the polymerizable compound having an acid group include ARONIX M-510 and M-520, and ARONIX TO-2349 (manufactured by Toagosei Chemical Industry Co., Ltd.).

In a case where the acid value of the compound having an ethylenically unsaturated bond group has an acid group, a preferred acid value of the compound having an ethylenically unsaturated bond group is 0.1 to 40 mgKOH/g, and preferably 5 to 30 mgKOH/g.

An aspect in which the compound having an ethylenically unsaturated bond group is a compound having a caprolactone structure is also preferable. As the compound having a caprolactone structure, for example, KAYARAD DPCA series manufactured by Nippon Kayaku Co., Ltd. are commercially available, and examples thereof include DPCA-20, DPCA-30, DPCA-60, and DPCA-120.

As the compound having an ethylenically unsaturated bond group, a compound having an ethylenically unsaturated bond group and an alkylene oxy group can also be used. As the compound having an ethylenically unsaturated bond group and an alkylene oxy group, a compound having an ethylenically unsaturated bond group and an ethyleneoxy group and/or propyleneoxy group is preferable, a compound having an ethylenically unsaturated bond group and an ethyleneoxy group is more preferable, and a trifunctional to hexafunctional (meth)acrylate compound having 4 to 20 ethyleneoxy groups are still more preferable. Examples of a commercially available product of the compound having an ethylenically unsaturated bond group and an alkylene oxy group include SR-494 manufactured by Sartomer Co., which is a tetrafunctional (meth)acrylate having four ethyleneoxy groups, Inc., and KAYARAD TPA-330 which is a trifunctional (meth)acrylate having three isobutyleneoxy groups.

As the compound having an ethylenically unsaturated bond group, the urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable. In addition, the compounds having an ethylenically unsaturated bond group having an amino structure or a sulfide structure in the molecules thereof described in JP1988-277653A (JP-S63-277653A), JP1988-260909A (JP-S63-260909A), and JP1989-105238A (JP-H01-105238A) are also preferably used. Examples of a commercially available product thereof include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

Furthermore, as the compound having an ethylenically unsaturated bond group, the compounds described in JP2017-048367A, JP6057891B, or JP6031807B can also be used.

In addition, as the compound having an ethylenically unsaturated bond group, 8UH-1006 or 8UH-1012 (manufactured by Taisei Fine Chemical Co., Ltd.), Light Acrylate POB-A0 (manufactured by Kyoeisha Chemical Co., Ltd.), or the like is also preferably used.

In a case where the composition for forming an absorption layer contains a compound having an ethylenically unsaturated bond group as the curable compound, the content of the compound having an ethylenically unsaturated bond group is preferably 1% to 60% by mass with respect to the total solid content of the composition for forming an absorption layer. The lower limit thereof is, for example, more preferably 5% by mass or more, and still more preferably 10% by mass or more. The upper limit is, for example, more preferably 50% by mass or less, and still more preferably 40% by mass or less. The compounds having an ethylenically unsaturated bond group may be used singly or in combination of two or more kinds thereof. In a case where two or more kinds of the compounds having an ethylenically unsaturated bond group are included, the total amount thereof is preferably within the range.

(Compound Having Epoxy Group)

The compound having an epoxy group (hereinafter also referred to as an epoxy compound) is preferably a compound having 1 to 100 epoxy groups per molecule. The lower limit of the number of the epoxy groups is more preferably 2 or more. The upper limit of the number of the epoxy groups can be set to, for example, 10 or less, or to 5 or less.

The epoxy equivalent (=the molecular weight of the epoxy compound/the number of epoxy groups) of the epoxy compound is preferably 500 g/equivalent or less, more preferably 100 to 400 g/equivalent, and still more preferably 100 to 300 g/equivalent.

The epoxy compound may be either a low-molecular-weight compound (for example, a molecular weight of less than 1,000) or a high-molecular-weight compound (macromolecule) (for example, a molecular weight of 1,000 or more, and in a case of the polymer, a weight-average molecular weight of 1,000 or more). The weight-average molecular weight of the epoxy compound is preferably 200 to 100,000, and more preferably 500 to 50,000. The upper limit of the weight-average molecular weight is more preferably 10,000 or less, still more preferably 5,000 or less, and particularly preferably 3,000 or less.

As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference.

In a case where the composition for forming an absorption layer contains an epoxy compound as the curable compound, the content of the epoxy compound is preferably 0.1% to 60% by mass with respect to the total solid content of the composition for forming an absorption layer. The lower limit thereof is, for example, more preferably 1% by mass or more, and still more preferably 3% by mass or more. The upper limit is, for example, more preferably 50% by mass or less, and still more preferably 40% by mass or less. The epoxy compounds may be used singly or in combination of two or more kinds thereof. In a case where two or more kinds of the epoxy compounds are used, the total sum thereof is preferably within the range.

<<Photopolymerization Initiator>>

In a case where the composition for forming an absorption layer contains a polymerizable compound as the curable compound, it is preferable that the composition for forming an absorption layer further contains a photopolymerization initiator. The photopolymerization initiator is not particularly limited as long as it has an ability to initiate the polymerization of the polymerizable compound, and the photopolymerization initiator can be selected as appropriate from known photopolymerization initiators. For example, a compound having photosensitivity to light in a range from the ultraviolet region to the visible region is preferable. In addition, the photopolymerization initiator may be a compound capable of causing a certain action with a photo-excited sensitizer to generate active radicals. The photopolymerization initiator is preferably a photoradical polymerization initiator.

Examples of the photopolymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an α-hydroxyketone compound, and an α-aminoketone compound. From the viewpoint of the exposure sensitivity, a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an aminoacetophenone compound, a cyclopentadiene-benzene-iron complex, a halomethyl oxadiazole compound, and a 3-aryl-substituted coumarin compound are preferable; a compound selected from an oxime compound, the α-hydroxyketone compound, the α-aminoketone compound, and the acylphosphine compound is more preferable; and the oxime compound is still more preferable. With regard to the photopolymerization initiator, reference can be made to the description in paragraph Nos. 0065 to 0111 of JP2014-130173A and paragraph Nos. 0274 to 0306 of JP2013-029760A, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, and the compounds described in WO2017/051680A. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluene sulfonyloxy)iminobutan-2-one, and 2-ethoxycarbonyloxy-imino-1-phenylpropan-1-one. As a commercially available product of the oxime compound, IRGACURE-OXE01, IRGACURE-OXE02, IRGACURE-OXE03, and IRGACURE-OXE04 (all manufactured by BASF) are also suitably used. In addition, examples of the commercially available product include TRONLY TR-PBG-304, TRONLY TR-PBG-309, and TRONLY TR-PBG-305 (manufactured by CHANGZHOU TRONLY NEW ELECTRONIC MATERIALS CO., LTD.), ADEKA ARKLS NCI-930 and ADEKA OPTOMER N-1919 (both manufactured by Adeka Corporation, a photopolymerization initiator 2 described in JP2012-014052A).

Moreover, as oxime compounds other than the above-described oxime compounds, the compounds described in JP2009-519904A in which oxime is linked to N of a carbazole ring, the compounds described in U.S. Pat. No. 7,626,957B in which a hetero-substituent is introduced into a benzophenone moiety, the compounds described in JP2010-015025A in which a nitro group is introduced into a dye site, the compounds described in US2009-0292039A, the ketoxime compounds described in WO2009/131189A, the compounds described in U.S. Pat. No. 7,556,910B, which contains a triazine skeleton and an oxime skeleton in the same molecule, the compound described in JP2009-221114A, which has a maximum absorption at 405 nm and has good sensitivity to a light source of g-rays, and the like may be used.

In the present invention, an oxime compound having a fluorene ring can also be used as the photopolymerization initiator. Specific examples of the oxime compound having a fluorene ring include the compounds described in JP2014-137466A. The contents of the publication are incorporated herein by reference.

In the present invention, an oxime compound having a benzofuran skeleton can also be used as the photopolymerization initiator. Specific examples thereof include the compounds OE-01 to OE-75 described in WO2015/036910A.

In the present invention, an oxime compound having a skeleton in which at least one benzene ring of a carbazole ring is a naphthalene ring can also be used as the photopolymerization initiator. Specific examples of such an oxime compound include the compounds described in WO2013/083505A.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by Adeka Corporation).

Specific examples of the oxime compound which is preferably used in the present invention are shown below, but the present invention is not limited thereto.

(C-1)
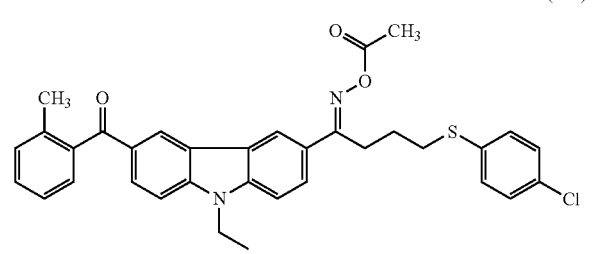

(C-2)
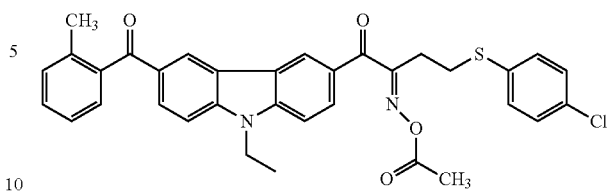

(C-3)
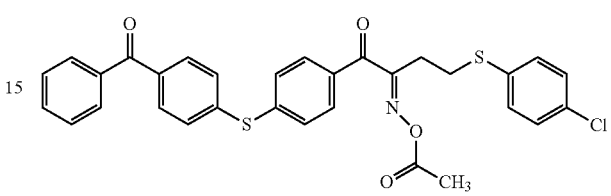

(C-4)
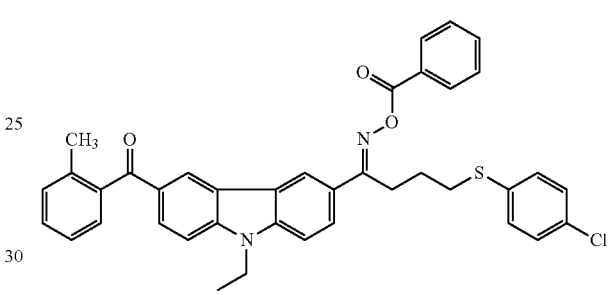

(C-5)
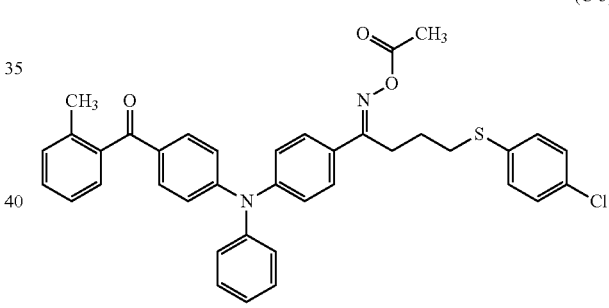

(C-6)
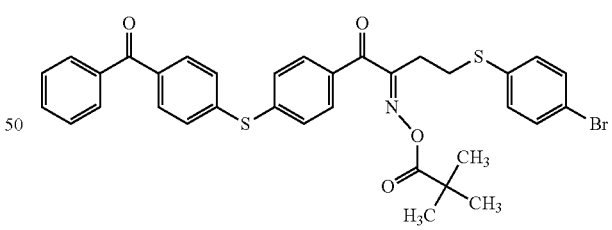

(C-7)
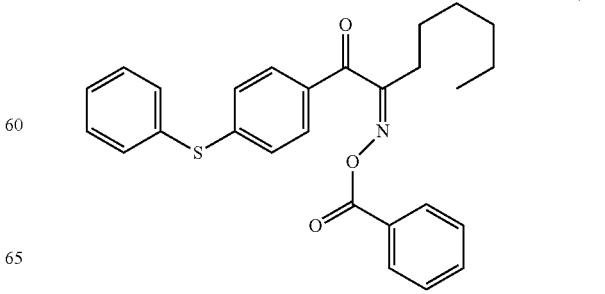

(C-8)
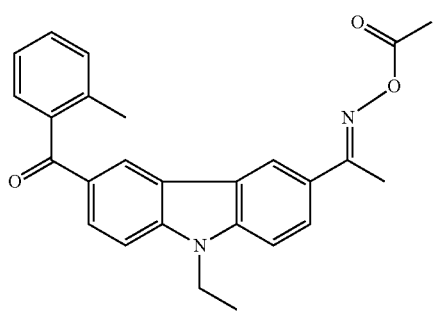

(C-9)
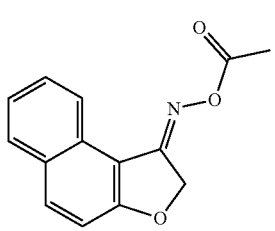

(C-10)
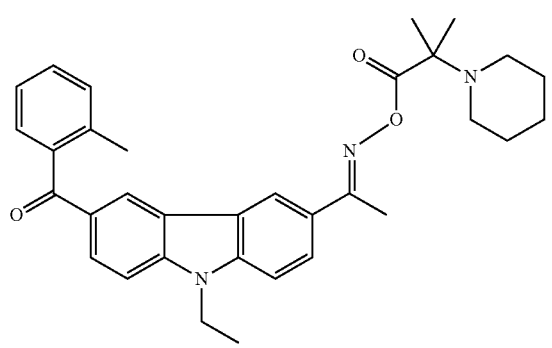

(C-11)
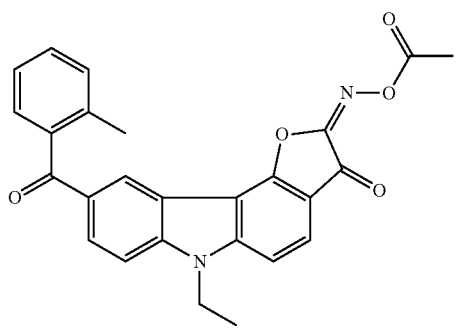

(C-12)
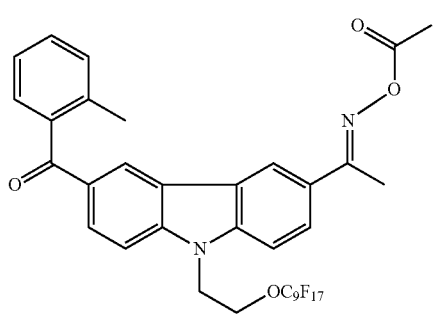

(C-13)
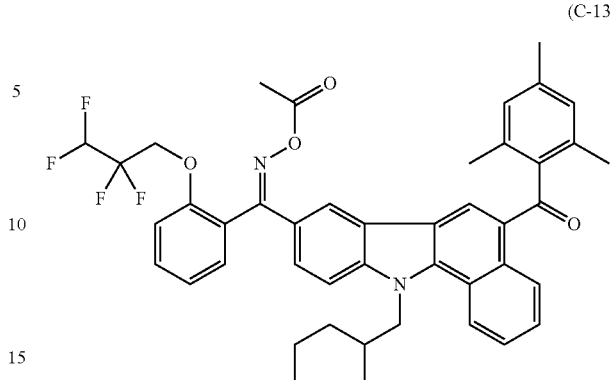

(C-14)

The oxime compound is preferably a compound having a maximum absorption wavelength in a wavelength range of 350 nm to 500 nm, and more preferably a compound having a maximum absorption wavelength in a wavelength range of 360 nm to 480 nm. In addition, the oxime compound is preferably a compound having a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method. For example, the molar light absorption coefficient is preferably measured by means of an ultraviolet and visible light spectrophotometer (Cary-5 spectrophotometer manufactured by Varian) at a concentration of 0.01 g/L using ethyl acetate as a solvent.

In the present invention, a bifunctional, or trifunctional or higher photopolymerization initiator may be used as the photopolymerization initiator. Specific examples of such a photopolymerization initiator include dimers of the oxime compounds described in JP2010-527339A, JP2011-524436A, WO2015/004565A, paragraph Nos. 0417 to 0412 of JP2016-532675A, and paragraph Nos. 0039 to 0055 of WO2017/033680A, the compound (E) and the compound (G) described in JP2013-522445A, and Cmpd 1 to 7 described in WO2016/034963A.

In a case where the composition for forming an absorption layer contains a photopolymerization initiator, the content of the photopolymerization initiator is preferably 1% to 20% by mass, with respect to the total solid content of the composition for forming an absorption layer. The lower limit thereof is, for example, more preferably 3% by mass or more, and still more preferably 5% by mass or more. The upper limit is, for example, more preferably 15% by mass or less, and still more preferably 10% by mass or less. The composition for forming an absorption layer may include only one kind or two kinds of the photopolymerization initiators. In a case where two or more kinds of the photopolymerization initiator are included, the total amount thereof is preferably within the range.

<<Resin>>

The composition for forming an absorption layer preferably includes a resin. The resin is blended, for example, in an application of dispersing particles such as a pigment in the composition or in an application as a binder. Incidentally, a resin which is used for dispersing particles such as a pigment is also referred to as a dispersant. It should be noted that such applications of the resin are only exemplary, and the resin can also be used for other purposes, in addition to such applications.

In a case where the composition for forming an absorption layer contains a resin, the content of the resin is preferably 1% to 60% by mass with respect to the total solid content of the composition for forming an absorption layer. The lower limit thereof is, for example, more preferably 5% by mass or more, and still more preferably 10% by mass or more. The upper limit is, for example, more preferably 50% by mass or less, and still more preferably 40% by mass or less.

(Dispersant)

The composition for forming an absorption layer can also include a resin as the dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70% by mole or more in a case where the total amount of the acid group and the basic group is 100% by mole, and more preferably a resin consisting substantially of only an acid group. The acid group contained in the acidic dispersant (acidic resin) is preferably a carboxyl group. The acid value of the acidic dispersant (acidic resin) is preferably 5 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50% by mole in a case where the total amount of the acid group and the basic group is 100% by mole. The basic group contained in the basic dispersant is preferably an amino group.

Examples of the dispersant include a polymer dispersant [for example, a polyamidoamine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalenesulfonic acid formalin condensate], a polyoxyethylene alkyl phosphate ester, a polyoxyethylenealkylamine, and an alkanolamine.

The polymer dispersants can be further classified into a linear polymer, a terminal-modified polymer, a graft type polymer, and a block type polymer in terms of their structures. The polymer dispersant is adsorbed onto a surface of a pigment and acts to prevent the re-aggregation. Thus, the terminal-modified polymer, the graft type polymer, and the block type polymer, which have an anchor site on a pigment surface, may be mentioned as a preferred structure. In addition, the dispersants described in paragraph Nos. 0028 to 0124 of JP2011-070156A or the dispersants described in JP2007-277514A are also preferably used. The contents of the publications are incorporated herein by reference.

In the present invention, as the resin, a resin including a repeating unit having a graft chain in a side chain (hereinafter also referred to as a graft resin) is preferably used.

According to this aspect, it is possible to further improve the dispersibility of a pigment. Here, the graft chain means a polymer chain that is branched from the main chain of the repeating unit to grow. The length of the graft chain is not particularly limited, but in a case where the graft chain gets longer, a steric repulsion effect is enhanced, and thus, the dispersibility of a pigment or the like can be increased. In the graft chain, it is preferable that the number of atoms excluding the hydrogen atoms is 40 to 10,000, it is more preferable that the number of atoms excluding the hydrogen atoms is 50 to 2,000, and it is still more preferable that the number of atoms excluding the hydrogen atoms is 60 to 500.

The graft chain preferably includes at least one structure selected from a polyester chain, a polyether chain, a poly (meth)acryl chain, a polyurethane chain, a polyurea chain, or a polyamide chain; more preferably includes at least one structure selected from the polyester chain, the polyether chain, or the poly(meth)acryl chain; and still more preferably includes the polyester chain.

The terminal structure of the graft chain is not particularly limited. The terminal structure may be either a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among those, from the viewpoint of improvement of the dispersibility of the pigment or the like, a group having a steric repulsion effect is preferable, and an alkyl group or alkoxy group having 5 to 24 carbon atoms is preferable. The alkyl group and the alkoxy group may be any of linear, branched, and cyclic forms, and are preferably linear or branched.

With regard to details of the graft resin, reference can be made to the description in paragraph Nos. 0025 to 0094 of JP2012-255128A, the contents of which are incorporated herein by reference. Further, specific examples of the graft resin include the resins described in paragraph Nos. 0072 to 0094 of JP2012-255128A, the contents of which are incorporated herein by reference.

Moreover, in the present invention, an oligoimine-based resin including a nitrogen atom at at least one of a main chain or a side chain can be used. The oligoimine-based resin preferably includes at least one repeating unit having a nitrogen atom selected from a poly(lower alkylenimine)-based repeating unit, a polyallylamine-based repeating unit, a polydiallylamine-based repeating unit, a metaxylenediamine-epichlorohydrin polycondensate-based repeating unit, or a polyvinylamine-based repeating unit. With regard to the oligoimine-based resin, reference can be made to the description in paragraph Nos. 0102 to 0174 of JP2012-255128A, the contents of which are incorporated herein by reference. Specific examples of the oligoimine-based resin include the resins described in paragraph Nos. 0168 to 0174 of JP2012-255128A.

A commercially available product of the resin as the dispersant can also be used. For example, the products described in paragraph No. 0129 of JP2012-137564A can also be used as the dispersant. Examples of the product include Disperbyk-111 (manufactured by BYK Chemie). In addition, the resin described as the dispersant can also be used in applications other than the application as the dispersant. For example, the resin can also be used as a binder.

The content of the dispersant is preferably 1 to 200 parts by mass with respect to 100 parts by mass of the pigment. The lower limit thereof is more preferably 5 parts by mass or more, and still more preferably 10 parts by mass or more.

The upper limit is more preferably 150 parts by mass or less, and still more preferably 100 parts by mass or less.

(Alkali-Soluble Resin)

The composition for forming an absorption layer can contain an alkali-soluble resin as the resin. In addition, the alkali-soluble resin can also be used as the dispersant or the binder.

The alkali-soluble resin can be selected as appropriate from resins having an alkali-solubility promoting group. Examples of the alkali-solubility promoting group (hereinafter also referred to as an acid group) include a carboxyl group, a phosphoric acid group, a sulfonic acid group, and a phenolic hydroxyl group, and the carboxyl group is preferable. With regard to the kinds of the acid groups contained in the alkali-soluble resin may be of only one kind or of two or more kinds.

The weight-average molecular weight (Mw) of the alkali-soluble resin is preferably 5,000 to 100,000. In addition, the number-average molecular weight (Mn) of the alkali-soluble resin is preferably 1,000 to 20,000.

From the viewpoint of heat resistance, as the alkali-soluble resin, a polyhydroxystyrene-based resin, a polysiloxane-based resin, an acrylic resin, an acrylamide-based resin, or an acryl/acrylamide copolymer resin is preferable. In addition, from the viewpoint of controlling the developability, the acrylic resin, the acrylamide-based resin, or the acryl/acrylamide copolymer resin is preferable.

The alkali-soluble resin is preferably a polymer having a carboxyl group in a side chain thereof. Specific examples thereof include a copolymer having a repeating unit derived from a monomer such as methacrylic acid, acrylic acid, itaconic acid, crotonic acid, maleic acid, 2-carboxyethyl (meth)acrylic acid, vinylbenzoic acid, and partially esterified maleic acid, alkali-soluble phenol resins such as a novolac resin, an acidic cellulose derivative having a carboxyl group in a side chain thereof, and a polymer obtained by adding an acid anhydride to a polymer having a hydroxyl group. In particular, a copolymer of a (meth)acrylic acid and another monomer copolymerizable therewith is suitable as the alkali-soluble resin. Examples of another monomer copolymerizable with the (meth)acrylic acid include alkyl (meth)acrylate, aryl (meth)acrylate, and a vinyl compound. Examples of the alkyl (meth)acrylate and the aryl (meth) acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth) acrylate, tolyl (meth)acrylate, naphthyl (meth)acrylate, cyclohexyl (meth)acrylate, glycidyl (meth)acrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of only one kind or of two or more kinds thereof.

As the alkali-soluble resin, a benzyl (meth)acrylate/ (meth)acrylic acid copolymer, benzyl (meth)acrylate/(meth) acrylic acid/2-hydroxyethyl (meth)acrylate copolymer, or a multicomponent copolymer including benzyl (meth)acrylate/(meth)acrylic acid/other monomers can also be preferably used. Further, copolymers obtained by copolymerizing 2-hydroxyethyl (meth)acrylate and other monomers; a 2-hydroxypropyl (meth)acrylate/polystyrene macromonomer/ benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/poly styrene macromonomer/benzyl methacrylate/methacrylic acid copolymer, and the like, described in JP1995-140654A (JP-H07-140654A), or the like can also be preferably used. In addition, as a commercially available product thereof, for example, FF-426 (manufactured by Fujikura Kasei Co., Ltd.) or the like can also be used.

Moreover, an alkali-soluble resin having a polymerizable group may also be used as the alkali-soluble resin. Examples of the polymerizable group include a (meth)allyl group and a (meth)acryloyl group. As the alkali-soluble resin having a polymerizable group, an alkali-soluble resin containing a polymerizable group on a side chain thereof, and the like are useful.

Examples of a commercially available product of the alkali-soluble resin containing a polymerizable group include DIANAL NR Series (manufactured by Mitsubishi Rayon Co., Ltd.), Photomer 6173 (carboxyl group-containing polyurethane acrylic oligomer, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), EBECRYL 3800 (manufactured by Daicel-UCB Co., Ltd.), ACRYCURE RD-F8 (manufactured by Nippon Shokubai Co., Ltd.), and DP-1305 (manufactured by Fuji Fine Chemicals Co., Ltd.).

It is also preferable that the alkali-soluble resin includes a polymer obtained by polymerization of monomer components including at least one compound (hereinafter, these compounds are also referred to as an "ether dimer") selected from a compound represented by Formula (ED1) or the compound described in JP2010-168539A.

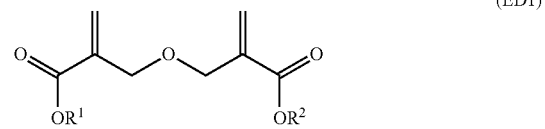
(ED1)

In Formula (ED1), $R^1$ and $R^2$ each independently represent a hydrogen atom or a hydrocarbon group having 1 to 25 carbon atoms, which may have a substituent.

With regard to specific examples of the ether dimer, reference can be made to paragraph No. 0317 of JP2013-029760A, the contents of which are incorporated herein by reference. The ether dimers may be of only one kind or of two or more kinds thereof.

Examples of the polymer obtained by polymerization of the monomer components including an ether dimer include polymers having the following structures.

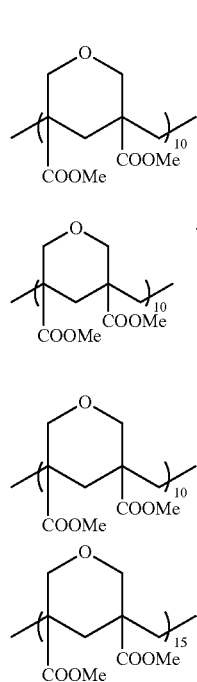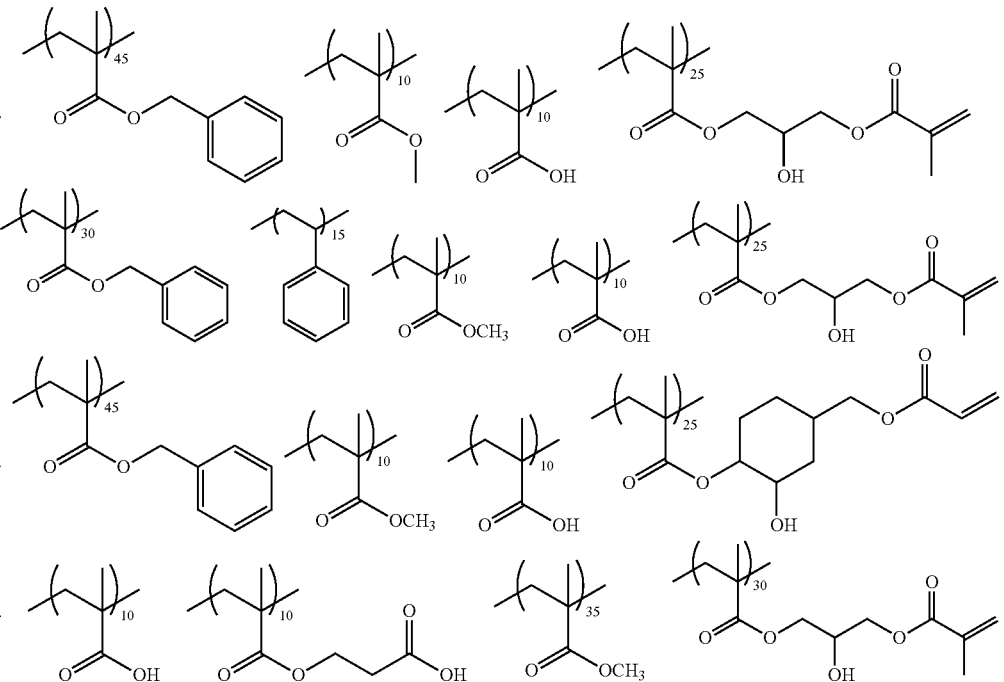

The alkali-soluble resin may include a repeating unit derived from a compound represented by Formula (X).

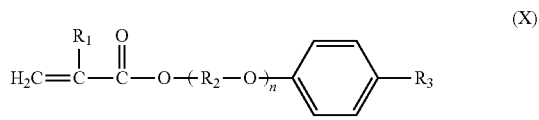

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may have a benzene ring. n represents an integer of 1 to 15.

In Formula (X), the number of carbon atoms in the alkylene group of $R_2$ is preferably 2 or 3. In addition, the number of carbon atoms in the alkyl group of $R_3$ is preferably 1 to 10. The alkyl group of $R_3$ may have a benzene ring. Examples of the alkyl group including a benzene ring represented by $R_3$ include a benzyl group and a 2-phenyl (iso)propyl group.

With regard to the alkali-soluble resin, reference can be made to the descriptions in paragraph Nos. 0558 to 0571 of JP2012-208494A (paragraph Nos. 0685 to 0700 of the corresponding US2012/0235099A), the contents of which are incorporated herein by reference. In addition, it is also possible to use the copolymers (B) described in paragraph Nos. 0029 to 0063 of JP2012-032767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and used in Examples; or the binder resins described in paragraph Nos. 0030 to 0072 of JP2012-032770A. The contents of the publications are incorporated herein by reference.

The acid value of the alkali-soluble resin is preferably 30 to 500 mgKOH/g. The lower limit thereof is more preferably 50 mgKOH/g or more, and still more preferably 70 mgKOH/g or more. The upper limit is more preferably 400 mgKOH/g or less, still more preferably 200 mgKOH/g or less, even still more preferably 150 mgKOH/g or less, and particularly preferably 120 mgKOH/g or less.

The content of the alkali-soluble resin is preferably 1% to 60% by mass with respect to the total solid content of the composition for forming an absorption layer. The lower limit thereof is, for example, more preferably 5% by mass or more, and still more preferably 10% by mass or more. The upper limit is, for example, more preferably 50% by mass or less, and still more preferably 40% by mass or less.

(Other Resins)

The composition for forming an absorption layer can contain resins (hereinafter also referred to as other resins) other than the resins described in the section of the dispersant or the alkali-soluble resin as described above. Examples of such other resins include a (meth)acrylic resin, a (meth)acrylamide resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, and a siloxane resin. Such other resins may be used singly or as a mixture of two or more kinds thereof. In addition, in the present invention, as the resin, the resins described in JP2017-057265A, JP2017-032685A, JP2017-075248A, or JP2017-066240A can also be used, the contents of which are incorporated herein by reference.

<<Pigment Derivative>>

The composition for forming an absorption layer can contain a pigment derivative. Examples of the pigment derivative include a compound having a structure in which a part of a chromophore is substituted with an acid group, a basic group, or a phthalimidemethyl group. Examples of a chromophore constituting the pigment derivative include a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton; the quinoline-based skeleton, the benzimidazolone-based skeleton, the diketopyrrolopyrrole-based skeleton, the azo-based skeleton, the quinophthalone-based skeleton, the isoindoline-based skeleton, and the phthalocyanine-based skeleton are preferable; and the azo-based skeleton and the benzimidazolone-based skeleton are more preferable. As the acid group contained in the pigment derivative, a sulfo group or a carboxyl group is preferable, and the sulfo group is more preferable. As the basic group contained in the pigment derivative, an amino group is preferable, and a tertiary amino group is more preferable. With regard to specific examples of the pigment derivative, reference can be made to the description in paragraph Nos. 0162 to 0183 of JP2011-252065A, the contents of which are incorporated herein by reference.

In a case where the composition for forming an absorption layer contains a pigment derivative, the content of the pigment derivative is preferably 1 to 30 parts by mass, and more preferably 3 to 20 parts by mass, with respect to 100 parts by mass of the pigment. The pigment derivatives may be used singly or in combination of two or more kinds thereof. In a case where two or more kinds of the pigment derivatives are included, the total amount thereof is preferably within the range.

<<Solvent>>

The composition for forming an absorption layer preferably contains a solvent. The solvent is preferably an organic solvent. The solvent is not particularly limited as long as it satisfies the solubility of the respective components or the coatability of the composition for forming an absorption layer.

Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate. Examples of the ketones include methyl ethyl ketone, cyclohexanone, cyclopentanone, 2-heptanone, and 3-heptanone. Suitable examples of the aromatic hydrocarbons include toluene and xylene. However, it is preferable in some cases to reduce aromatic hydrocarbons (benzene, toluene, xylene, ethylbenzene, and the like) (for example, the amount can be set to 50 parts per million (ppm) by mass or less, 10 ppm by mass or less, or 1 ppm by mass or less with respect to the total amount of the organic solvent) as a solvent for a reason such as an environmental aspect.

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol monomethyl ether acetate.

In the present invention, the organic solvent preferably has a content of peroxides of 0.8 mmol/L or less, and more preferably, it does not substantially include peroxides. Further, it is preferable to use an organic solvent having a small metal content, and for example, the metal content of the organic solvent is preferably 10 parts per billion (ppb) by mass or less. The metal content of the organic solvent is at a level of parts per trillion (ppt), as desired, and such a high-purity solvent is provided by, for example, Toyo Kasei Kogyo Co., Ltd. (The Chemical Daily, Nov. 13, 2015).

The content of the solvent is preferably an amount such that the total solid content of the composition for forming an absorption layer is 5% to 80% by mass. The lower limit thereof is preferably 10% by mass or more. The upper limit is preferably 60% by mass or less, more preferably 50% by mass or less, and still more preferably 40% by mass or less.

Moreover, it is preferable that the composition for forming an absorption layer does not substantially contain an environmentally regulated substance from the viewpoint of environmental regulation. Further, in the present invention, an expression that the environmentally regulated substance is not substantially contained means that the content of the environmentally regulated substance in the composition for forming an absorption layer is 50 ppm by mass or less, and the content is preferably 30 ppm by mass or less, more preferably 10 ppm by mass or less, and particularly preferably 1 ppm by mass or less. Examples of the environmentally regulated substance include benzenes; alkyl benzenes such as toluene and xylene; and halogenated benzenes such as chlorobenzene. These are registered as an environmentally regulated substance in accordance with a Registration Evaluation Authorization and Restriction of Chemical Substances (REACH) rule, a Pollutant Release and Transfer Register (PRTR) method, a Volatile Organic Compounds (VOC) regulation, or the like, and the amounts of the substance to be used and methods of handling the substance are strictly regulated. These compounds are used as a solvent in the production of the respective components used in the composition for forming an absorption layer in some cases, or are incorporated as a residual solvent into the composition in some cases. From the viewpoints of human safety and environmental consideration, it is preferable to reduce these substances as much as possible. Examples of a method for reducing the amount of the environmentally regulated substance include a method of heating or depressurizing the inside of a system to make it equal to or higher than the boiling point of the environmentally regulated substance to evaporate the environmentally regulated substance out of the system and reduce it. In addition, in a case where a small amount of an environmentally regulated substance is evaporated, it is also useful to make the corresponding solvent and a solvent having a boiling point equivalent to that of the corresponding solvent be azeotropic in order to increase the efficiency. In addition, in a case where a compound having radical polymerizability is contained, a polymerization inhibitor or the like may be added to perform evaporation under reduced pressure, in order to suppress the crosslinking between molecules due to a progress of a radical polymerization reaction during the evaporation under reduced pressure. These evaporation methods can be available in any step out of a step with raw materials, a step with products obtained by reaction of the raw materials (for example, a resin solution after polymerization or a polyfunctional monomer solution), or a step with a composition manufactured by mixing these compounds.

<<Surfactant>>

The composition for forming an absorption layer preferably contains a surfactant. As the surfactant, various surfactants such as a fluorine-based surfactant, a nonionic surfactant, a cationic surfactant, an anionic surfactant, and a silicone-based surfactant can be used, and the fluorine-based surfactant is preferable for a reason that the coatability can be further improved.

By incorporating the fluorine-based surfactant into the composition for forming an absorption layer, liquid characteristics in a case of preparation of a coating liquid are improved, and thus, the evenness after application can be further improved. That is, in a case where a film is formed with a coating liquid to which the composition for forming an absorption layer containing the fluorine-based surfactant has been applied, the interface tension of a surface of the coating film is lowered to improve the evenness of drying is improved. Thus, formation of a film with little coating unevenness can be more suitably performed.

The fluorine content in the fluorine-based surfactant is preferably 3% to 40% by mass, more preferably 5% to 30% by mass, and particularly preferably 7% to 25% by mass. The fluorine-based surfactant having a fluorine content that falls within this range is effective in terms of the evenness of the thickness of the coating film or liquid saving properties, and the solubility of the surfactant in the composition for forming an absorption layer is also good.

Examples of the fluorine-based surfactant include MEGAFACE F171, F172, F173, F176, F177, F141, F142, F143, F144, R30, F437, F475, F479, F482, F554, F780, EXP, and MFS-330 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, and S-393, and KH-40 (all manufactured by Asahi Glass Co., Ltd.), and PF636, PF656, PF6320, PF6520, and PF7002 (all manufactured by OMNOVA). As the fluorine-based surfactant, the compounds described in paragraph Nos. 0015 to 0158 of JP2015-117327A or the compounds described in paragraph Nos. 0117 to 0132 of JP2011-132503A can be used. As the fluorine-based surfactant, a block polymer can also be used, and specific examples thereof include the compounds described in JP2011-089090A.

As the fluorine-based surfactant, an acrylic compound having a molecular structure having a functional group containing a fluorine atom, in which the functional group containing a fluorine atom is cut to volatilize a fluorine atom, can also be suitably used. Examples of the fluorine-based surfactant include MEGAFACE DS series manufactured by DIC Corporation (The Chemical Daily, Feb. 22, 2016) (Nikkei Business Daily, Feb. 23, 2016), for example, MEGAFACE DS-21, which may also be used.

As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used, and the following compounds are also exemplified as the fluorine-based surfactant for use in the present invention. In the following formulae, % representing the ratio of the repeating unit is % by mole.

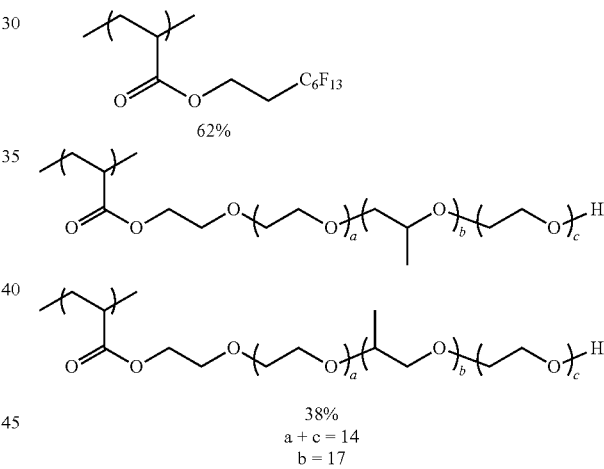

The weight-average molecular weights of the compounds are preferably 3,000 to 50,000, and is, for example, 14,000.

A fluorine-containing polymer having a group having an ethylenically unsaturated bond in a side chain can also be used as the fluorine-based surfactant. Specific examples thereof include the compounds described in paragraph Nos. 0050 to 0090 and paragraph Nos. 0289 to 0295 of JP2010-164965A. Examples of a commercially available product thereof include MEGAFACE RS-101, RS-102, RS-718-K, and RS-72-K, all manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (all manufactured by BASF), TETRONIC 304, 701, 704, 901, 904, and 150R1 (all manufactured by BASF), SOLSEPERSE 20000 (manufactured by Lubrizol Japan Ltd.), NCW-101, NCW-1001, and NCW-1002 (all manufactured by Wako Pure Chemical Industries, Ltd.), PIONIN D-6112, D-6112-W, and D-6315 (all manufactured by Takemoto Oil & Fat Co., Ltd.), and OLFINE E1010 and SURFYNOL 104, 400, and 440 (all manufactured by Nissin chemical industry Co., Ltd.).

Specific examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (all manufactured by KYOEISHA CHEMICAL CO., LTD.), and W001 (manufactured by Yusho Co., Ltd.).

Examples of the anionic surfactant include W004, W005, and W017 (all manufactured by Yusho Co., Ltd.), and BL (manufactured by Sanyo Chemical Industries, Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

In a case where the composition for forming an absorption layer contains a surfactant, the content of the surfactant is preferably 0.001% to 2.0% by mass with respect to the total solid content of the composition for forming an absorption layer. The lower limit thereof is, for example, more preferably 0.005% by mass or more. The upper limit is, for example, more preferably 1.0% by mass or less. The surfactants may be used singly or in combination of two or more kinds thereof. In a case where two or more kinds of the surfactants are included, the total amount thereof is preferably within the range.

<<Silane Coupling Agent>>

The composition for forming an absorption layer can contain a silane coupling agent. In the present invention, the silane coupling agent means a silane compound having a hydrolyzable group and another functional group. Further, the hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, and an acyloxy group.

The silane coupling agent is preferably a silane compound having at least one selected from a vinyl group, an epoxy group, a (meth)acryl group, a (meth)acryloyl group, an amino group, an isocyanurate group, a ureido group, a mercapto group, a sulfide group, or an isocyanate group, and an alkoxy group. Specific examples of the silane coupling agent include N-β-aminoethyl-γ-aminopropyl methyldimethoxysilane (KBM-602, manufactured by Shin-Etsu Chemical Co., Ltd.), N-β-aminoethyl-γ-aminopropyl trimethoxysilane (KBM-603, manufactured by Shin-Etsu Chemical Co., Ltd.), N-β-aminoethyl-γ-aminopropyl triethoxysilane (KBE-602, manufactured by Shin-Etsu Chemical Co., Ltd.), γ-aminopropyl trimethoxysilane (KBM-903, manufactured by Shin-Etsu Chemical Co., Ltd.), γ-aminopropyl triethoxysilane (KBE-903, manufactured by Shin-Etsu Chemical Co., Ltd.), 3-methacryloxypropyl trimethoxysilane (KBM-503, manufactured by Shin-Etsu Chemical Co., Ltd.), and 3-glycidoxypropyl trimethoxysilane (KBM-403, manufactured by Shin-Etsu Chemical Co., Ltd.). With regard to details of the silane coupling agent, reference can be made to the description in paragraph Nos. 0155 to 0158 of JP2013-254047A, the contents of which are incorporated herein by reference. In addition, compounds having the following structures can also be exemplified. In the following structural formulae, Et represents an ethyl group.

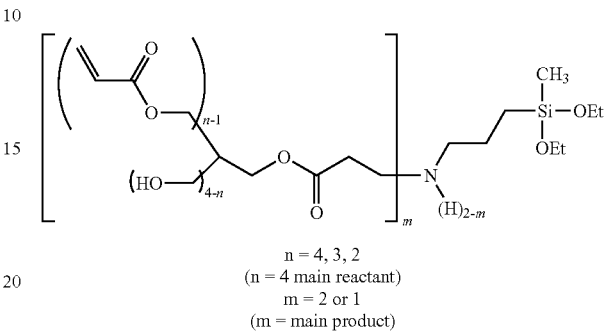

n = 4, 3, 2
(n = 4 main reactant)
m = 2 or 1
(m = main product)

In a case where the composition for forming an absorption layer contains a silane coupling agent, the content of the silane coupling agent is preferably 0.001% to 20% by mass, more preferably 0.01% to 10% by mass, and particularly preferably 0.1% to 5% by mass, with respect to the total solid content of the composition for forming an absorption layer. The composition for forming an absorption layer may include one kind or two or more kinds of the silane coupling agents. In a case where the composition for forming an absorption layer includes two or more kinds of the silane coupling agent, the total amount thereof is preferably within the range.

<<Polymerization Inhibitor>>

The composition for forming an absorption layer can contain a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and an N-nitrosophenylhydroxylamine salt (an ammonium salt, a cerous salt, or the like).

In a case where the composition for forming an absorption layer contains a polymerization inhibitor, the content of the polymerization inhibitor is preferably 0.01% to 5% by mass with respect to the total solid content of the composition for forming an absorption layer. The composition for forming an absorption layer may include one kind or two or more kinds of the polymerization inhibitor. In a case where the composition for forming an absorption layer includes two or more kinds of the polymerization inhibitor, the total amount thereof is preferably within the range.

<<Other Additives>>

Various additives such as a filler, an adhesion promoter, an antioxidant, and an aggregation inhibitor can be blended into the composition for forming an absorption layer, as desired. Examples of these additives include the additives described in paragraph Nos. 0155 and 0156 of JP2004-295116A, the contents of which are incorporated herein by reference. Further, as the antioxidant, for example, a phenol compound, a phosphorus-based compound (for example, the compounds described in paragraph No. 0042 of JP2011-090147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by Adeka Corporation. In addition, as the antioxidant, the polyfunctional hindered amine antioxidant described in WO2017/006600A can also be used. The antioxidants may be used singly or in combination of two or more kinds thereof. Further, the potential antioxidant is a compound in which a portion that functions as an antioxidant is protected by a protective group and the protective group leaves by heating the compound at 100° C. to 250° C. or by heating the compound at 80° C. to 200° C. in the presence of an acid/a base catalyst. Examples of the potential antioxidant include the compounds described in WO2014/021023A, WO2017/030005A, and JP2017-008219A. Examples of a commercially available product thereof include ADEKA ARKLS GPA-5001 (manufactured by Adeka Corporation).

<Composition for Forming Colored Pixel Layer>

A composition (composition for forming a colored pixel) which can be preferably used for formation of a colored pixel in the color filter will be described. The composition for forming a colored pixel preferably includes a colorant. Examples of the colorant include chromatic colorants such as a yellow colorant, an orange colorant, a red colorant, a green colorant, a violet colorant, and a blue colorant. The colorant may be either of a pigment or a dye.

Specific examples of the pigment include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all red pigments);

C. I. Pigment Green 7, 10, 36, 37, 58, and 59 (all green pigments);

C. I. Pigment Violet 1, 19, 23, 27, 32, 37, 42, 58, and 59 (all violet pigments);

C. I. Pigment Blue 1, 2, 15, 15:1, 15:2, 15:3, 15:4, 15:6, 16, 22, 60, 64, 66, 79, and 80 (all blue pigments).

Moreover, as the green pigment, a halogenated zinc phthalocyanine pigment in which the average number of halogen atoms per molecule is 10 to 14, the average number of bromine atoms per molecule is 8 to 12, and the average number of chlorine atoms per molecule is 2 to 5 can also be used. Specific examples thereof include the compounds described in WO2015/118720A.

In addition, as the blue pigment, an aluminum phthalocyanine compound having a phosphorus atom can also be used. Specific examples thereof include the compounds described in paragraph Nos. 0022 to 0030 of JP2012-247591A and the compounds described in paragraph No. 0047 of JP2011-157478A.

Furthermore, as the yellow colorant, the compounds exemplified by the above-mentioned colorant Y can also be used.

Examples of the dye include the dyes disclosed in JP1989-090403A (JP-S64-090403A), JP1989-091102A (JP-S64-091102A), JP1989-094301A (JP-H01-094301A), JP1994-011614A (JP-H06-011614A), U.S. Pat. Nos. 4,808,501A, 5,667,920A, JP1993-333207A (JP-H05-333207A), JP1994-035183A (JP-H06-035183A), JP1994-051115A (JP-H06-051115A), JP1994-194828A (JP-H06-194828A), and the like can be used. In terms of classification based on the chemical structure, examples of the dye include a pyrazoleazo compound, a pyrromethene compound, an anilinoazo compound, a triarylmethane compound, an anthraquinone compound, a benzylidene compound, an oxonol compound, a pyrazolotriazoleazo compound, a pyridoneazo compound, a cyanine compound, a phenothiazine compound, and a pyrrolopyrazoleazomethine compound.

Moreover, a dye multimer may be used as the colorant. The dye multimer is preferably a dye that is used after being dissolved in a solvent, but the dye multimer may form a particle. In a case where the dye multimer is the particle, it is usually used in a state of being dispersed in a solvent or the like. The dye multimer in the state of particles can be obtained by, for example, emulsion polymerization. Examples of the dye multimer in the state of particles include the compounds described in JP2015-214682A. In addition, as the dye multimer, the compounds described in JP2011-213925A, JP2013-041097A, JP2015-028144A, JP2015-030742A, or the like can also be used.

The content of the colorant is preferably 20% by mass or more, more preferably 30% by mass or more, still more preferably 40% by mass or more, even still more preferably 50% by mass or more, particularly preferably 60% by mass or more, and most preferably 65% by mass or more, with respect to the total solid content in the composition for forming a colored pixel. The upper limit thereof is preferably 80% by mass or less, more preferably 75% by mass or less, and still more preferably 70% by mass or less. The colorants included in the composition for forming a colored pixel may be of one kind or two or more kinds. In a case where two or more kinds of the colorants are included, the total amount thereof is preferably within the range.

The composition for forming a colored pixel may include additives such as a resin, a curable compound, a photopolymerization initiator, a pigment derivative, a solvent, a surfactant, a silane coupling agent, a polymerization inhibitor, an ultraviolet absorber, a filler, an adhesion promoter, an antioxidant, and a potential antioxidant. Further, details thereof include the above-mentioned materials used in the above-mentioned composition for forming an absorption layer, and preferred ranges thereof are also the same. In addition, a preferred content of the materials is also the same as that in the composition for forming an absorption layer.

<Composition for Forming Transparent Pixel>

Next, a composition (composition for forming a transparent pixel) which can be preferably used for formation of a transparent pixel in a color filter will be described. The composition for forming a transparent pixel preferably contains a resin. Examples of the resin include the above-mentioned materials used in the above-mentioned composition for forming an absorption layer, and preferred ranges thereof are also the same. Further, a preferred content of the resin is the same as the content thereof in the composition for forming an absorption layer. The composition for forming an absorption layer can further contain particles (also referred to as inorganic particles) of an oxide including at least one element selected from Ti, Zr, Sn, Sb, Cu, Fe, Mn, Pb, Cd, As, Cr, Hg, Zn, Al, Mg, Si, P, or S. In a case where the above-mentioned inorganic particles are contained, the content of the inorganic particles is preferably 20% to 70% by mass with respect to the total solid content of the composition for forming an absorption layer. The lower limit thereof is more preferably 25% by mass or more, and still more preferably 30% by mass or more. The upper limit is more preferably 65% by mass or less, and still more preferably 60% by mass or less. The composition for forming a transparent pixel may further include additives such as a curable compound, a photopolymerization initiator, a solvent, a surfactant, a silane coupling agent, a polymerization inhibitor, an ultraviolet absorber, a filler, an adhesion promoter, an antioxidant, and a potential antioxidant. Details thereof include the above-mentioned materials used in the above-mentioned composition for forming an absorption layer, and preferred ranges thereof are also the same. In addition, preferred contents of these materials are the same as the contents in the composition for forming an absorption layer.

<Composition for Forming Infrared Transmitting Layer>

Next, a composition (composition for forming an infrared transmitting layer) which can be preferably used for formation of a pixel of the infrared transmitting layer in the structure of the embodiment of the present invention will be described. In the composition for forming an infrared transmitting layer, a ratio A/B of a minimum value A of an absorbance in a wavelength range of 400 to 640 nm to a maximum value B of an absorbance in a wavelength range of 1,100 to 1,300 nm is preferably 5 or more, more preferably 7.5 or more, still more preferably 15 or more, and even still more preferably 30 or more.

With regard to the absorbance conditions, in the composition for forming an infrared transmitting layer, suitable absorbance conditions can be accomplished by adjusting, for example, the kinds and contents of light blocking materials which will be described later.

An absorbance $A\lambda$ at a wavelength of $\lambda$ is defined by Equation (1).

$$A\lambda = -\log(T\lambda/100) \qquad (1)$$

$A\lambda$ is an absorbance at the wavelength $\lambda$ and $T\lambda$ is a transmittance (%) at the wavelength $\lambda$.

In the present invention, a value of the absorbance may be a value measured in the state of a solution or a value of a film prepared with the composition for forming an infrared transmitting layer. In a case where the absorbance is measured in the state of the film, it is preferable to perform the measurement using a film prepared by applying the composition for forming an infrared transmitting layer onto a glass substrate by a method such as spin coating such that the thickness of the film after drying reaches a predetermined value, and drying the applied composition on a hot plate at 100° C. for 120 seconds. The thickness of the film can be measured using a stylus surface profilometer (DEKTAK 150, manufactured by ULVAC Inc.) on s substrate using the film.

In addition, the absorbance can be measured using a spectrophotometer known in the related art. Measurement conditions for the absorbance are not particularly limited, but it is preferable that the maximum value B of an absorbance in a wavelength range of 1,100 to 1,300 nm is measured under conditions which are adjusted such that the minimum value A of an absorbance in a wavelength range of 400 to 640 nm is 0.1 to 3.0. By measuring the absorbance under such conditions, a measurement error can be further reduced. A method of adjusting the minimum value A of an absorbance in a wavelength range of 400 to 640 nm to be 0.1 to 3.0 is not particularly limited. For example, in a case where the absorbance is measured in the state of the solution, a method of adjusting the optical path length of a sample cell can be exemplified. In addition, in a case where the absorbance is measured in the state of the film, examples of the adjustment method include a method of adjusting the film thickness.

The composition for forming an infrared transmitting layer preferably contains a light blocking material. The light blocking material is preferably a color material that absorbs light in a wavelength range from violet to red. Further, the light blocking material is preferably a color material that blocks light in a wavelength range of 400 to 640 nm. In addition, the light blocking material is preferably a color material that transmits light in a wavelength range of 1,100 to 1,300 nm. The light blocking material preferably satisfies at least one of the following requirements of (1) or (2).

(1): Two or more kinds of chromatic colorants are included, and a black color is formed by combination of two or more kinds of chromatic colorants.

(2): An organic black colorant is included. In the aspect of (2), it is also preferable that a chromatic colorant is further contained.

In the light blocking material, for example, a ratio A/B of a minimum value A of an absorbance in a wavelength range of 400 to 640 nm to a maximum value B of an absorbance in a wavelength range of 1,100 to 1,300 nm is preferably 4.5 or more. These characteristics may be satisfied with one kind of material or with a plurality of two or more kinds of materials. For example, in a case of the aspect of (1), it is preferable that a plurality of chromatic colorants are combined to satisfy the above spectral characteristics. Further, in a case of the aspect of (2), an organic black colorant may satisfy the above spectral characteristics. In addition, a combination of the organic black colorant and the chromatic colorant may also satisfy the above spectral characteristics.

The light blocking material preferably includes two or more selected from a red colorant, a blue colorant, a yellow colorant, a violet colorant, or a green colorant. That is, the light blocking material preferably forms a black color by combination of two or more colorants selected from the red colorant, the blue colorant, the yellow colorant, the violet colorant, or the green colorant. Examples of preferred combinations include the following ones.

(1) An aspect in which a red colorant and a blue colorant are contained.

(2) An aspect in which a red colorant, a blue colorant, and a yellow colorant are contained.

(3) An aspect in which a red colorant, a blue colorant, a yellow colorant, and a violet colorant are contained.

(4) An aspect in which a red colorant, a blue colorant, a yellow colorant, a violet colorant, and a green colorant are contained.

(5) An aspect in which a red colorant, a blue colorant, a yellow colorant, and a green colorant are contained.

(6) An aspect in which a red colorant, a blue colorant, and a green colorant are contained.

(7) An aspect in which a yellow colorant and a violet colorant are contained.

In the aspect of (1), the mass ratio of the red colorant to the blue colorant, that is, red colorant:blue colorant is preferably 20 to 80:20 to 80, more preferably 20 to 60:40 to 80, and still more preferably 20 to 50:50 to 80.

In the aspect of (2), the mass ratio of the red colorant to the blue colorant to the yellow colorant, that is, red colorant:

blue colorant:yellow colorant is preferably 10 to 80:20 to 80:10 to 40, more preferably 10 to 60:30 to 80:10 to 30, and still more preferably 10 to 40:40 to 80:10 to 20.

In the aspect of (3), the mass ratio of the red colorant to the blue colorant to the yellow colorant to the violet colorant, that is, red colorant:blue colorant:yellow colorant:violet colorant is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect of (4), the mass ratio of the red colorant to the blue colorant to the yellow colorant to the violet colorant to the green colorant, that is, red colorant:blue colorant:yellow colorant:violet colorant:green colorant is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the aspect of (5), the mass ratio of the red colorant to the blue colorant to the yellow colorant to the green colorant, that is, red colorant:blue colorant:yellow colorant:green colorant is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the aspect of (6), the mass ratio of the red colorant to the blue colorant to the green colorant, that is, red colorant:blue colorant:green colorant is preferably 10 to 80:20 to 80:10 to 40, more preferably 10 to 60:30 to 80:10 to 30, and still more preferably 10 to 40:40 to 80:10 to 20.

In the aspect of (7), the mass ratio of the yellow colorant to the violet colorant, that is, yellow colorant:violet colorant is preferably 10 to 50:40 to 80, more preferably 20 to 40:50 to 70, and still more preferably 30 to 40:60 to 70.

The yellow colorant is preferably C. I. Pigment Yellow 139, 150, or 185, more preferably C. I. Pigment Yellow 139 or 150, and still more preferably C. I. Pigment Yellow 139. The blue colorant is preferably C. I. Pigment Blue 15:6. The violet colorant is preferably C. I. Pigment Violet 23. The red colorant is preferably C. I. Pigment Red 122, 177, 224, or 254, more preferably C. I. Pigment Red 122, 177, or 254, and still more preferably C. I. Pigment Red 254. The green colorant is preferably C. I. Pigment Green 7, 36, 58, or 59.

In a case where an organic black colorant is used as the light blocking material, it is preferable that the organic black colorant is used in combination with a chromatic colorant. By using the organic black colorant and the chromatic colorant in combination, excellent spectral characteristics are easily obtained. Examples of the chromatic colorant to be used in combination with the organic black colorant include a red colorant, a blue colorant, and a violet colorant, and the red colorant or the blue colorant is preferable. These may be used singly or in combination of two or more kinds thereof. In addition, the mixing ratio of the chromatic colorant to the organic black colorant is a ratio such that the amount of the chromatic colorant is preferably 10 to 200 parts by mass, and more preferably 15 to 150 parts by mass, with respect to 100 parts by mass of the organic black colorant.

The content of the pigment in the light blocking material is preferably 95% by mass or more, more preferably 97% by mass or more, and still more preferably 99% by mass or more, with respect to the total amount of the light blocking material.

The content of the light blocking material is preferably 5% to 60% by mass with respect to the total solid content of the composition for forming an infrared transmitting layer. The lower limit is preferably 9% by mass or more, and more preferably 13% by mass or more. The upper limit is preferably 50% by mass or less, and more preferably 40% by mass or less.

The composition for forming an infrared transmitting layer can further contain an infrared absorber. In the composition for forming an infrared transmitting layer, the infrared absorber plays a role in limiting transmitted light (infrared rays) to the longer wavelength side. As the infrared absorber, a compound having a maximum absorption wavelength in an infrared region (preferably a wavelength range of 700 to 1,300 nm, and more preferably a wavelength range of 700 to 1,000 nm) can be preferably used.

As the infrared absorber, at least one selected from a pyrrolopyrrole compound, a cyanine compound, a squarylium compound, a phthalocyanine compound, a naphthalocyanine compound, a queterylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable; at least one selected from the pyrrolopyrrole compound, the cyanine compound, squarylium compound, the phthalocyanine compound, the naphthalocyanine compound, or the diimmonium compound is more preferable; at least one selected from the pyrrolopyrrole compound, the cyanine compound, or the squarylium compound is still more preferable; and the pyrrolopyrrole compound is particularly preferable. Specific examples of the pyrrolopyrrole compound include the compounds described in paragraph Nos. 0016 to 0058 of JP2009-263614A, the compounds described in paragraph Nos. 0037 to 0052 of JP2011-068731A, and the compounds described in paragraph Nos. 0010 to 0033 of WO2015/166873A, the contents of which are incorporated herein by reference. Specific examples of the squarylium compound include the compounds described in paragraph Nos. 0044 to 0049 of JP2011-208101A, the compounds described in paragraph Nos. 0060 and 0061 of JP6065169B, the compounds described in paragraph No. 0040 of WO2016/181987A, the compounds described in JP2015-176046A, and the compounds described in paragraph No. 0072 of WO2016/190162A, the contents of which are incorporated herein by reference. Specific examples of the cyanine compound include the compounds described in paragraph Nos. 0044 and 0045 of JP2009-108267A, the compounds described in paragraph Nos. 0026 to 0030 of JP2002-194040A, the compounds described in JP2015-172004A, the compounds described in JP2015-172102A, the compounds described in JP2008-088426A, and the compounds described in paragraph No. 0090 of WO2016/190162A, the contents of which are incorporated herein by reference. Specific examples of the diimmonium compound include the compounds described in JP2008-528706A, the content of which is incorporated herein by reference. Specific examples of the phthalocyanine compound include the compounds described in paragraph No. 0093 of JP2012-077153A, oxytitaniumphthalocyanine described in JP2006-343631A, and the compounds described in paragraph Nos. 0013 to 0029 of JP2013-195480A, the contents of which are incorporated herein by reference. Specific examples of the naphthalocyanine compound include the compounds described in paragraph No. 0093 of JP2012-077153A, the content of which is incorporated herein by reference. In addition, as the infrared absorbing compound, the compounds described in JP2016-146619A can also be used, the contents of which are incorporated herein by reference.

In a case where the composition for forming an infrared transmitting layer contains an infrared absorber, the content of the infrared absorber is preferably 1% to 30% by mass with respect to the total solid content of the composition for forming an infrared transmitting layer. The upper limit thereof is more preferably 20% by mass or less, and still more preferably 10% by mass or less. The lower limit is more preferably 3% by mass or more, and still more preferably 5% by mass or more. Further, the total amount of the infrared absorber and the light blocking material is preferably 10% to 70% by mass of the total solid content of the composition for forming an infrared transmitting layer. The lower limit is more preferably 20% by mass or more, and still more preferably 25% by mass or more. In addition, the content of the infrared absorber in the total amount of the infrared absorber and the light blocking material is preferably 5% to 40% by mass. The upper limit thereof is more preferably 30% by mass or less, and still more preferably 25% by mass or less. The lower limit is more preferably 10% by mass or more, and still more preferably 15% by mass or more.

The composition for forming an infrared transmitting layer may further include additives such as a resin, a curable compound, a photopolymerization initiator, a pigment derivative, a solvent, a surfactant, a silane coupling agent, a polymerization inhibitor, an ultraviolet absorber, a filler, an adhesion promoter, an antioxidant, and a potential antioxidant. Details thereof include the above-mentioned materials used in the above-mentioned composition for forming an absorption layer, and preferred ranges thereof are also the same. In addition, preferred contents of these materials are also the same as the contents in the composition for forming an absorption layer.

<Storage Container for Composition>

A storage container for each of the above-mentioned compositions is not particularly limited, and a known storage container can be used. Further, as the storage container, it is also preferable to use a multilayer bottle having an inner wall constituted with 6 layers from 6 kinds of resins or a bottle having a 7-layer structure from 6 kinds of resins for the purpose of suppressing incorporation of impurities into raw materials or compositions. Examples of such a container include the containers described in JP2015-123351A.

<Method for Preparing Composition>

Each of the above-mentioned compositions can be prepared by mixing the above-mentioned components. In a case of preparing the composition by mixing the components, all the components may be dissolved or dispersed at the same time in a solvent to prepare the composition, or the respective components may be left as appropriate in two or more solutions or dispersion liquids that are blended as appropriate, and mixed to prepare the composition upon use (upon coating), as desired.

Furthermore, in a case where the composition includes particles such as a pigment, it is preferable that a process for dispersing the pigment is included. In the process for dispersing the particles, examples of a mechanical force that is used for dispersion of the particles include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. Further, in the pulverization of the particles in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the particles, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the particles, a refining treatment of particles in a salt milling process may be performed. With regard to the materials, the equipment, the process conditions, and the like used in the salt milling process, reference can be made to, for example, the description in JP2015-194521A and JP2012-046629A.

It is preferable that the composition is filtered through a filter for the purpose of removing foreign matters, reducing defects, or the like in the preparation of the composition. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high density or an ultrahigh molecular weight) such as polyethylene and polypropylene (PP). Among these materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm. The pore diameter of the filter is within the range, fine foreign matters can be reliably removed. In addition, a fibrous filter material is also preferably used as the filter. Examples of the fibrous filter material include a polypropylene fiber, a nylon fiber, and a glass fiber. Specific examples of the fibrous filter material include filter cartridges of SBP type series (SBP008 and the like), TPR type series (TPR002, TPR005, and the like), or SHPX type series (SHPX003 and the like), manufactured by Roki Techno Co., Ltd.

In a case where a filter is used, the filter may be combined with other filters (for example, a first filter and a second filter). At this time, the filtration with each of the filters may be performed once or may be performed twice or more times. Moreover, filters having different pore diameters within the above-mentioned range may be combined. With regard to the pore diameter of the filter herein, reference can be made to nominal values of filter manufacturers. A commercially available filter may be selected from, for example, various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, and the like. As the second filter, a filter formed of the same material as that of the first filter, or the like can be used. In addition, the filtration through the first filter may be performed for only a dispersion liquid, the other components may be mixed therewith, and then the filtration through the second filter may be performed.

<Method for Producing Structure>

Next, the method for producing a structure of an embodiment of the present invention will be described. The method for producing a structure of the embodiment of the present invention includes a step of forming a color filter and a step of forming an absorption layer, in which the color filter has two or more different types of pixels, the absorption layer includes at least one selected from a yellow colorant or a colorant having a maximum absorption wavelength in a wavelength range of 400 to 500 nm, the structure has the absorption layer on an optical path of at least one pixel of the pixels of the color filter and on the side through which light is incident on the above-mentioned pixel, and the step of forming an absorption layer includes a step of applying a composition for forming an absorption layer, the composition including at least one selected from a yellow colorant or a colorant having a maximum absorption wavelength in a wavelength range of 400 to 500 nm.

In the method for producing a structure of the embodiment of the present invention, it is preferable that the absorption layer is formed after forming the color filter. That is, it is preferable that the step of forming an absorption layer is performed after performing the step of forming a color filter. Hereinafter, the respective steps will be described in detail.

<<Step of Forming Color Filter>>

The step of forming a color filter includes a step of applying each composition for forming a pixel of the color filter to form a composition layer for forming a pixel, and a step of forming a pattern for the composition layer for forming a pixel by photolithography or a dry etching method. As the composition for forming a pixel, the composition for forming a colored pixel, the composition for forming a transparent pixel, or the composition for forming an infrared transmitting layer as described above is used. At least one of the pixels is preferably formed with the composition for forming a colored pixel. A pattern forming method by the photolithography preferably includes a step of patternwise exposing the composition layer for forming a pixel (exposing step) and a step of removing the composition layer for forming a pixel in the unexposed areas by development to form a pattern (developing step). A pattern forming method by the dry etching method preferably includes a step of curing the composition layer for forming a pixel to form a cured product layer, a step of forming a photoresist layer patterned on the cured product layer, and a step of subjecting the cured product layer to dry etching with an etching gas using the patterned photoresist layer as a mask. Hereinafter, the respective steps will be described.

(Step of Forming Composition Layer for Forming Pixel)

In the step of forming a composition layer for forming a pixel, the composition layer for forming a pixel is preferably formed on a support. The support is not particularly limited, and can be selected as appropriate, depending on applications. A substrate (a silicon wafer, a silicon carbide wafer, a silicon nitride wafer, a sapphire wafer, a glass wafer, and the like) that is used in various electronic devices such as a solid-state imaging element can be used.

Incidentally, an undercoat layer may be provided on the substrate, as desired, so as to improve adhesion to an upper layer, prevent the diffusion of materials, or planarize the surface.

As a method for applying the composition layer for forming a pixel, various methods such as slit coating, an ink jet method, spin coating, cast coating, roll coating, and a screen printing method can be used.

The composition layer for forming a pixel may be dried (pre-baked). In a case of forming a pattern by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or set to 80° C. or higher. By setting the pre-baking temperature to 150° C. or lower, these characteristics can be more effectively maintained in a case of a configuration in which a photo-electric conversion film of an image sensor is formed of organic materials. The pre-baking time is preferably 10 seconds to 300 seconds, more preferably 40 to 250 seconds, and still more preferably 80 to 220 seconds. Drying can be performed using a hot plate, an oven, or the like.

(Case of Forming Pattern by Photolithography)

[Exposing Step]

Next, the composition layer for forming a pixel is patternwise exposed (exposing step). For example, the composition layer for forming a pixel can be subjected to patternwise exposure by performing exposure using an exposure device such as a stepper through a mask having a predetermined mask pattern. Thus, the exposed portion can be cured. As the radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$, and more preferably 0.05 to 1.0 J/cm$^2$. The oxygen concentration during the exposure can be selected as appropriate, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. Further, the exposure illuminance can be set as appropriate, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the illuminance of exposure energy may be combined, and for example, a combination of an oxygen concentration of 10% by volume and an illuminance of 10,000 W/m$^2$, a combination of an oxygen concentration of 35% by volume and an illuminance of 20,000 W/m$^2$, or the like is available.

[Developing Step]

Next, the unexposed areas are removed by development to form a pattern. The removal of the unexposed areas by development can be carried out using a developer. Thus, the composition layer for forming a pixel in the unexposed areas in the exposing step is eluted into the developer, and as a result, only the photocured portion remains. As the developer, an organic alkali developer (aqueous alkaline solution) giving no damage on the underlying solid-state imaging element, circuit, or the like is preferable. The temperature of the developer is preferably for example, 20° C. to 30° C. The development time is preferably 20 to 180 seconds. Further, a step of removing the developer by shaking per 60 seconds and further supplying a fresh developer may be repeated multiple times in order to improve residue removing properties.

Examples of the alkali agent used in the developer include organic alkaline compounds such as aqueous ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, Ethyltrimethylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene; and inorganic alkaline compounds such as sodium hydroxide, potassium hydroxide, sodium carbonate, sodium hydrogen carbonate, sodium silicate, and sodium metasilicate. As the alkaline agent, a compound having a high molecular weight is preferable from the viewpoints of environment and safety. As the developer, an alkaline aqueous solution is preferably used in which the above alkali agent is diluted with pure water. The concentration of the alkali agent in the aqueous alkaline solution is preferably 0.001% to 10% by mass, and more preferably 0.01% to 1% by mass. Moreover, the developer further containing a surfactant may be used. Examples of the surfactant include the above-mentioned surfactants, and the nonionic surfactants are preferable. The developer may be first produced as a concentrated liquid and then diluted to a concentration required upon from the viewpoints of transportation, storage, and the like. The dilution ratio is not particularly limited, and can be set to, for example, a range of 1.5 to 100 times. In addition, in a case where a developer including such an aqueous alkaline solution is used, it is preferable to perform washing (rinsing) with pure water after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. The Young's modulus of the film after post-baking is preferably 0.5 to 20 GPa, and more preferably 2.5 to 15 GPa. In addition, in a case where a support on which the cured film is formed includes an organic electroluminescence (organic EL) element, an image sensor having a photo-electric conversion film formed with organic materials, and the like, the post-baking temperature is preferably 150° C. or lower, more preferably 120° C. or lower, still more preferably 100° C. or lower, and particularly preferably 90° C. or lower. The lower limit thereof can be set to, for example, 50° C. or higher. The post-baking can be performed continuously or batchwise by using a heating means such as a hot plate, a convection oven (hot-air circulating dryer), and a high-frequency heater so that the film after development (cured film) satisfies the conditions. In addition, with regard to a pixel including a phthalocyanine pigment (particularly a phthalocyanine-based green pigment), weather resistance is improved by enhancing curability in some cases. Examples of a method for enhancing the curability of the pixel include curing with ultraviolet rays, a heating treatment in a nitrogen atmosphere, a further heating treatment after postbaking, and a combination of these methods.

(Case of Forming Pattern by Dry Etching Method)

Pattern formation by a dry etching method can be performed by, for example, a method in which a composition layer for forming a pixel layer formed by applying a composition layer for forming a pixel onto a support or the like is cured to form a cured product layer, a patterned photoresist layer is then formed on the cured product layer, and the cured product layer is then dry-etched with an etching gas using the patterned photoresist layer as a mask. With regard to the photoresist layer, it is preferable that a positive tone or negative tone radiation-sensitive composition is applied onto a cured product layer, and dried to form a photoresist layer. As the radiation-sensitive composition used for formation of the photoresist layer, a positive tone radiation-sensitive composition is preferably used. As the positive tone radiation-sensitive composition, a radiation-sensitive composition which is sensitive to radiations such as far ultraviolet rays including ultraviolet rays (g-rays, h-rays, and i-rays), KrF-rays, ArF-rays, and the like, electron beams, ion beams, and X-rays is preferable. The above-mentioned positive tone radiation-sensitive composition is preferably a radiation-sensitive composition which is sensitive to KrF-rays, ArF-rays, i-rays, or X-rays, and from the viewpoint of micromachining, it is more preferably a radiation-sensitive composition which is sensitive to KrF-rays. As the positive tone photosensitive resin composition, the positive tone resist compositions described in JP2009-237173A or JP2010-134283A is suitably used. In the formation of a photoresist layer, an exposing step with the radiation-sensitive composition is preferably performed with KrF-rays, ArF-rays, i-rays, X-rays, or the like, more preferably performed with KrF-rays, ArF-rays, X-rays, or the like, and still more preferably performed with KrF-rays.

By sequentially repeating each of the above-mentioned steps depending on the types of the pixels, a color filter having two or more different types of pixels can be produced.

In the color filter, each of the pixels preferably has high planarization. Specifically, the surface roughness Ra is preferably 100 nm or less, more preferably 40 nm or less, and still more preferably 15 nm or less. The lower limit thereof is not particularly limited, but is, for example, preferably 0.1 nm or more. The surface roughness can be measured, for example, using an atomic force microscope (AFM) Dimension 3100 manufactured by Veeco Instruments, Inc.

In addition, the contact angle of water on the pixel can be set as appropriate to a preferred value, but is typically in a range of 50° to 110°. The contact angle can be measured, for example, using a contact angle meter CV-DT•A Model (manufactured by Kyowa Interface Science Co., Ltd.).

In the color filter, a higher volume resistivity value of each pixel is preferable. Specifically, the volume resistivity value of the pixel is preferably $10^9$ Ω·cm or more, and more preferably $10^{11}$ Ω·cm or more. The upper limit thereof is not particularly limited, but is, for example, preferably $10^{14}$ Ω·cm or less. The volume resistivity value of the pixel can be measured, for example, using an ultrahigh resistance meter 5410 (manufactured by Advantest Corporation).

<<Step of Forming Absorption Layer>>

Next, the step of forming an absorption layer will be described. The absorption layer includes a step of applying the above-mentioned composition for forming an absorption layer. As a method for applying the composition for forming an absorption layer, various methods such as slit coating, an ink jet method, spin coating, cast coating, roll coating, and a screen printing method can be used.

As described above, the absorption layer in the structure of the embodiment of the present invention only needs to be provided on the side through which light is incident on the pixel of the color filter. Accordingly, the composition for forming an absorption layer may be applied onto a surface of the color filter, or may also be applied onto a surface of various layers or members (for example, a planarization layer, a microlens, a light collecting lens, an infrared blocking filter, and a sealing glass) provided on an optical path of an pixel of the color filter and on the side through which light is incident on the pixel. Among those, the composition for forming an absorption layer is preferably applied onto a surface of the color filter for a reason that it is easy to further improve the moisture resistance of the color filter.

The composition layer formed by applying the composition for forming an absorption layer may be dried (pre-baked). The pre-baking temperature is preferably 150° C. or lower, more preferably 120° C. or lower, and still more preferably 110° C. or lower. The lower limit thereof may be set to, for example, 50° C. or higher, or to 80° C. or higher. The pre-baking time is preferably 10 seconds to 300 seconds, more preferably 40 to 250 seconds, and still more preferably 80 to 220 seconds. Drying can be performed using a hot plate, an oven, or the like.

It is also preferable that a curing treatment is performed after carrying out the drying. Examples of the curing treatment include a thermosetting treatment and a photocuring treatment. Further, the thermosetting treatment and the photocuring treatment can also be used in combination. In a case where the thermosetting treatment is performed, the thermosetting temperature is, for example, preferably 180° C. to 260° C. The upper limit of the thermosetting temperature is preferably 250° C. or lower, and more preferably 240° C. or lower. The lower limit of the thermosetting temperature is preferably 190° C. or higher, and more preferably 200° C. or higher. The thermosetting time is preferably 60 to 600 seconds. The upper limit of the thermosetting time is preferably 300 seconds or less, and more preferably 180 seconds or less. The lower limit of the thermosetting time is preferably 80 seconds or more, and more preferably 100 seconds or more. The thermosetting treatment can be performed using a hot plate, an oven, or the like. In addition, as radiation (light) used during the photocuring, ultraviolet rays such as g-rays and i-rays are preferable, and the i-rays are more preferable. The irradiation dose (exposure dose) is, for example, preferably 0.03 to 2.5 $J/cm^2$, and more preferably 0.05 to 1.0 $J/cm^2$. The oxygen concentration in the photocuring can be selected as appropriate.

In the present invention, the step of forming an absorption layer may further include a step of forming a pattern. In a case where the color filter includes pixels in kinds that cause an effect on the absorption layer, it is preferable that a pattern is formed such that the absorption layer is not provided on the optical paths of these pixels. Examples of the pixels in a type that causes an effect on the absorption layer include the above-mentioned pixels. The step of forming a pattern is preferably performed before the above-mentioned curing treatment step or performed instead of the above-mentioned curing treatment.

As the pattern forming method, a pattern forming method using photolithography is preferable. Details of the pattern forming method using the photolithography are the same as for the above-mentioned method, and preferred ranges thereof are also the same.

<Solid-State Imaging Element>

The solid-state imaging element of an embodiment of the present invention has the above-mentioned structure of the embodiment of the present invention. The configuration of the solid-state imaging element of the embodiment of the present invention is not particularly limited as long as the solid-state imaging element is configured to include the color filter in the embodiment of the present invention and function as a solid-state imaging element, but examples thereof include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a support; have a light blocking film having openings only over the light receiving portion of the photodiode, on the photodiodes and the transfer electrodes; have a device-protective film formed of silicon nitride or the like, which is formed to coat the entire surface of the light blocking film and the light receiving portion of the photodiodes, on the light blocking film; and have the structure of the embodiment of the present invention on the device-protective film. In addition, the solid-state imaging element may also be configured, for example, such that it has a light collecting means (for example, a microlens, which is the same hereinafter) on a device-protective film under a color filter (a side closer to the support), or has a light collecting means on a color filter. Further, the color filter may have a structure in which a cured film forming each pixel is embedded in, for example, a space partitioned in a lattice shape by a partition wall. The partition wall in this case preferably has a low refractive index for each pixel. Examples of an imaging device having such a structure include the devices described in JP2012-227478A and JP2014-179577A. An imaging device comprising the solid-state imaging element of the embodiment of the present invention can also be used as a vehicle camera or a monitoring camera, in addition to a digital camera or electronic equipment (mobile phones or the like) having an imaging function.

<Image Display Device>

The image display device of an embodiment of the present invention includes the above-mentioned structure of the embodiment of the present invention. Examples of the image display device include a liquid crystal display device and an organic electroluminescence display device. The definition of image display device or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention is not limited to the specific examples shown below. In addition, "parts" and "%" are on a mass basis unless otherwise specified.

<Preparation of Composition for Forming Absorption Layer>

[Preparation of Pigment Dispersion Liquid]

Raw materials shown below were stirred and mixed, and then mixed and dispersed for 3 hours with a beads mill, thereby preparing each of pigment dispersion liquids.

(Pigment Dispersion Liquid Y-1)

C. I. Pigment Yellow 150 . . . 11.3 parts by mass

Dispersion resin 1 . . . 8.4 parts by mass

Propylene glycol monomethyl ether acetate (PGMEA) . . . 68.3 parts by mass

Cyclohexanone . . . 12.0 parts by mass (Pigment Dispersion Liquid Y-2)

C. I. Pigment Yellow 185 . . . 12.4 parts by mass

Dispersion resin 1 . . . 3.8 parts by mass

PGMEA . . . 83.7 parts by mass (Pigment Dispersion Liquid Y-3)

C. I. Pigment Yellow 139 . . . 12.4 parts by mass

Dispersion resin 1 . . . 3.8 parts by mass

PGMEA . . . 83.7 parts by mass

Dispersion resin 1: A resin having the following structure (Mw=24,000, the numerical values appended to the main chains are molar ratios, and the numerical values appended to the side chains are the number of repeating units)

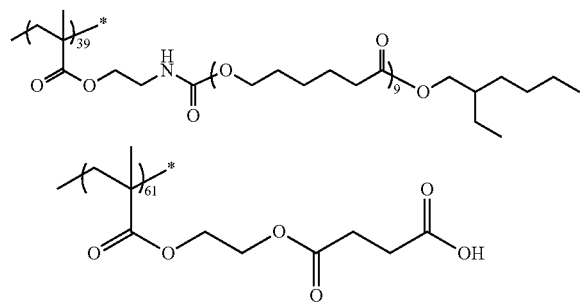

[Preparation of Composition for Forming Absorption Layer]

Raw materials shown below were stirred and mixed to prepare each of compositions for forming an absorption layer.

(Composition 1 for Forming Absorption Layer)

| | |
|---|---|
| Pigment dispersion liquid Y-1 | 62.6 parts by mass |
| Resin 1 | 1.5 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 1 | 1.4 parts by mass |
| Polymerization inhibitor (p-methoxyphenol) | 0.001 parts by mass |
| PGMEA | 23.4 parts by mass |

(Composition 2 for Forming Absorption Layer)

| | |
|---|---|
| Pigment dispersion liquid Y-2 | 58.1 parts by mass |
| Resin 1 | 1.5 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 1 | 1.4 parts by mass |
| Polymerization inhibitor (p-methoxyphenol) | 0.001 parts by mass |
| PGMEA | 20.7 parts by mass |

(Composition 3 for Forming Absorption Layer)

| | |
|---|---|
| Pigment dispersion liquid Y-3 | 58.1 parts by mass |
| Resin 1 | 1.5 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 1 | 1.4 parts by mass |
| Polymerization inhibitor (p-methoxyphenol) | 0.001 parts by mass |
| PGMEA | 20.7 parts by mass |

(Composition 4 for Forming Absorption Layer)

| | |
|---|---|
| Pigment dispersion liquid Y-1 | 62.6 parts by mass |
| Polymerizable compound 1 | 2.2 parts by mass |
| Polymerizable compound 2 | 1.9 parts by mass |
| Photopolymerization initiator 1 | 0.9 parts by mass |
| Surfactant 1 | 4.2 parts by mass |
| Ultraviolet absorber 2 | 4.8 parts by mass |
| Polymerization inhibitor (p-methoxyphenol) | 0.001 parts by mass |
| PGMEA | 23.4 parts by mass |

(Composition 5 for Forming Absorption Layer)

| | |
|---|---|
| Pigment dispersion liquid Y-2 | 58.1 parts by mass |
| Resin 1 | 1.5 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 2 | 5.0 parts by mass |
| Polymerization inhibitor (p-methoxyphenol) | 0.001 parts by mass |
| PGMEA | 20.7 parts by mass |

(Composition 6 for Forming Absorption Layer)

| | |
|---|---|
| Pigment dispersion liquid Y-3 | 58.1 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 2 | 10.2 parts by mass |
| Polymerization inhibitor (p-methoxyphenol) | 0.001 parts by mass |
| PGMEA | 20.7 parts by mass |

(Composition 7 for Forming Absorption Layer)

| | |
|---|---|
| Dye solution Y-1 | 62.6 parts by mass |
| Resin 1 | 1.5 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 1 | 1.4 parts by mass |
| Polymerization inhibitor (p-methoxyphenol) | 0.001 parts by mass |
| PGMEA | 23.4 parts by mass |

(Composition 8 for Forming Absorption Layer)

| | |
|---|---|
| Dye solution Y-2 | 62.6 parts by mass |
| Resin 1 | 1.5 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |

-continued

| | |
|---|---|
| Ultraviolet absorber 1 | 1.4 parts by mass |
| Polymerization inhibitor (p-methoxyphenol) | 0.001 parts by mass |
| PGMEA | 23.4 parts by mass |

(Composition 9 for Forming Absorption Layer)

| | |
|---|---|
| Pigment dispersion liquid Y-1 | 62.6 parts by mass |
| Resin 1 | 2.9 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Polymerization inhibitor (p-methoxyphenol) | 0.001 parts by mass |
| PGMEA | 23.4 parts by mass |

(Composition 10 for Forming Absorption Layer)

| | |
|---|---|
| Pigment dispersion liquid Y-1 | 71.4 parts by mass |
| Resin 1 | 3.2 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 1 | 1.4 parts by weight |
| Polymerization inhibitor (p-methoxyphenol) | 0.001 parts by mass |
| PGMEA | 13.0 parts by mass |

(Composition 11 for Forming Absorption Layer)

| | |
|---|---|
| Pigment dispersion liquid Y-1 | 71.4 parts by mass |
| Resin 1 | 3.2 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 2 | 1.4 parts by weight |
| Polymerization inhibitor (p-methoxyphenol) | 0.001 parts by mass |
| PGMEA | 13.0 parts by mass |

(Composition 12 for Forming Absorption Layer)

| | |
|---|---|
| Pigment dispersion liquid Y-1 | 85.7 parts by mass |
| Resin 1 | 0.9 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Polymerization inhibitor (p-methoxyphenol) | 0.001 parts by mass |
| PGMEA | 2.4 parts by mass |

(Comparative Composition 1)

| | |
|---|---|
| Resin 1 | 30 parts by mass |
| Polymerizable compound 1 | 2.2 parts by mass |
| Polymerizable compound 2 | 1.9 parts by mass |
| Silane coupling agent 1 | 1.8 parts by mass |
| Photopolymerization initiator 1 | 0.9 parts by mass |
| Surfactant 1 | 4.2 parts by mass |
| Ultraviolet absorber 2 | 5 parts by mass |
| Polymerization inhibitor (p-methoxyphenol) | 0.001 parts by mass |
| PGMEA | 54 parts by mass |

Resin 1: A resin having the following structure (Mw=11,000, and the numerical values appended to the main chains are molar ratios. A PGMEA solution having a solid content of 40% by mass)

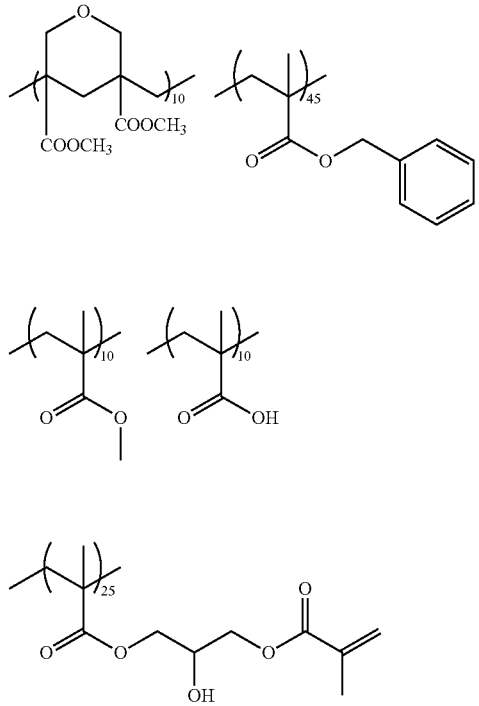

Photopolymerization initiator 1: IRGACURE-OXE01 (manufactured by BASF)

Surfactant 1: A 1%-by-mass PGMEA solution of the following compound (Mw=14,000). In the following formula, % indicating the ratio of the repeating units is % by mole.

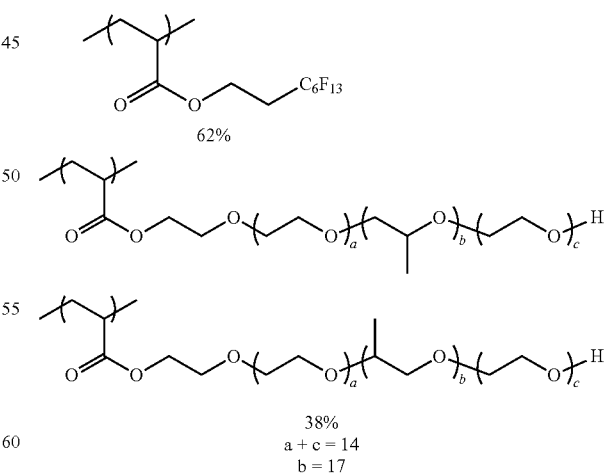

$a + c = 14$
$b = 17$

Polymerizable compound 1: A 56%-by-mass PGMEA solution of a mixture of compounds having the following structures (a mixture in which a molar ratio of the left compound to the right compound is 7:3)

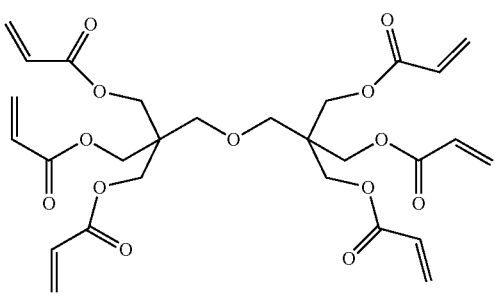

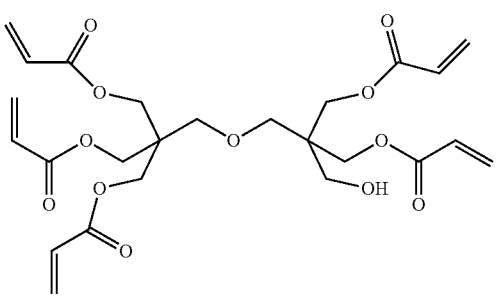

Polymerizable compound 2: A 65%-by-mass PGMEA solution of a compound having the following structure

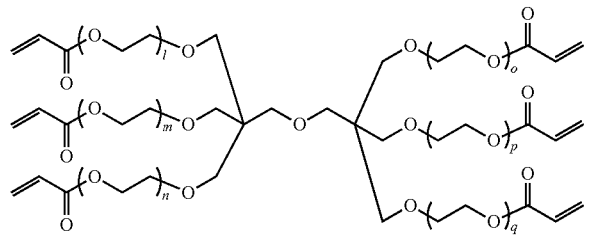

$l + m + n + o + p + q \approx 12$

Silane coupling agent 1: A 10%-by-mass PGMEA solution of a compound having the following structure (in the following structural formula, Et is an ethyl group)

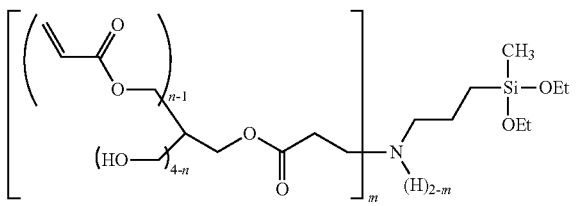

n = 4, 3, 2
(n = 4 main reactant)
m = 2 or 1
(m = main product)

Ultraviolet absorber 1: A compound having the following structure

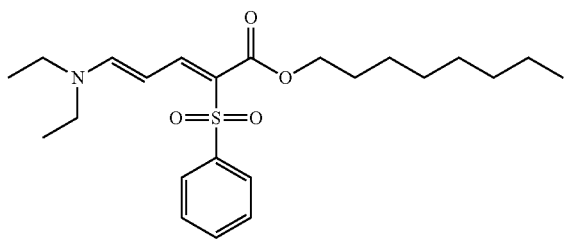 [SMILES: CCCCCCCCOC(=O)/C(=C/C=C/N(CC)CC)S(=O)(=O)c1ccccc1]

Ultraviolet absorber 2: Tinuvin 477 (manufactured by BASF, a triazine compound)

Dye solution Y-1: A solution formed by dissolving 11.3 parts by mass of C. I. Absorber Yellow 162 in 90 parts by mass of propylene glycol monomethyl ether acetate (PGMEA).

Dye solution Y-2: A solution formed by dissolving 11.3 parts by mass of the following yellow dye A in 90 parts by mass of tetrahydrofuran.

Yellow dye A: A compound having the following structure

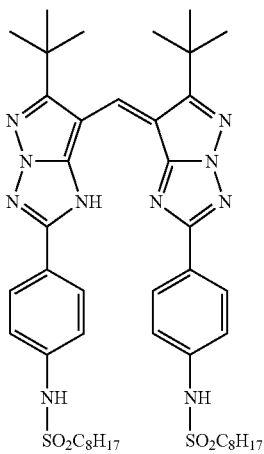

<Preparation of Composition for Forming Colored Pixel>

Raw materials shown below were mixed and stirred, and then filtered through a nylon-made filter having a pore diameter of 0.45 μm (manufactured by Nihon Pall Corporation) to prepare a composition for forming a pixel in each color.

(Composition for Forming Red Pixel)

| | |
|---|---|
| Red pigment dispersion liquid | 51.7 parts by mass |
| Resin 11 | 0.6 parts by mass |
| Polymerizable compound 11 | 0.6 parts by mass |
| Photopolymerization initiator 11 | 0.3 parts by mass |
| Surfactant 11 | 4.2 parts by mass |
| PGMEA | 42.6 parts by mass |

(Composition 1 for Forming Green Pixel)

| | |
|---|---|
| Green pigment dispersion liquid 1 | 73.7 parts by mass |
| Resin 11 | 0.3 parts by mass |
| Polymerizable compound 12 | 1.2 parts by mass |
| Photopolymerization initiator 11 | 0.6 parts by mass |

-continued

| Surfactant 11 | 4.2 parts by mass |
| Ultraviolet absorber 11 | 0.5 parts by mass |
| PGMEA | 19.5 parts by mass |

(Composition 2 for Forming Green Pixel)

| Green pigment dispersion liquid 2 | 73.7 parts by mass |
| Resin 11 | 0.3 parts by mass |
| Polymerizable compound 12 | 1.2 parts by mass |
| Photopolymerization initiator 11 | 0.6 parts by mass |
| Surfactant 11 | 4.2 parts by mass |
| Ultraviolet absorber 11 | 0.5 parts by mass |
| PGMEA | 19.5 parts by mass |

(Composition 3 for Forming Green Pixel)

| Green pigment dispersion liquid 3 | 73.7 parts by mass |
| Resin 11 | 0.3 parts by mass |
| Polymerizable compound 12 | 1.2 parts by mass |
| Photopolymerization initiator 11 | 0.6 parts by mass |
| Surfactant 11 | 4.2 parts by mass |
| Ultraviolet absorber 11 | 0.5 parts by mass |
| PGMEA | 19.5 parts by mass |

(Compositions 4 to 7 for Forming Green Pixel)

Compositions 4 to 7 for forming a green pixel were obtained in the same manner as for the composition 1 for forming a pixel, except that the green pigment dispersion liquid 1 was replaced by green pigment dispersion liquids 4 to 7.

(Compositions 8 to 11 for Forming Green Pixel)

Compositions 8 to 11 for forming a green pixel were obtained in the same manner as for the composition 1 for forming a pixel, except that the green pigment dispersion liquid 1 was replaced by green pigment dispersion liquids 8 to 11.

(Compositions 12 to 15 for Forming Green Pixel)

Compositions 12 to 15 for forming a green pixel were obtained in the same manner as for the composition 1 for forming a pixel, except that 0.5 parts by mass of the ultraviolet absorber 11 was replaced by each of additives 12 to 15.

(Compositions 16 to 27 for Forming Green Pixel)

Compositions 16 to 27 for forming a green pixel were obtained in the same manner as for the composition 1 for forming a pixel, except that 1.2 parts by mass of the polymerizable compound 12 was replaced by each of polymerizable compounds 16 to 27.

(Compositions 28 to 34 for Forming Green Pixel)

Compositions 28 to 34 for forming a green pixel were obtained in the same manner as for the composition 1 for forming a pixel, except that 0.3 parts by mass of the resin 11 was replaced by each of resins 28 to 34.

(Composition for Forming Blue Pixel)

| Blue pigment dispersion liquid | 44.9 parts by mass |
| Resin 11 | 2.1 parts by mass |
| Polymerizable compound 11 | 1.5 parts by mass |
| Polymerizable compound 13 | 0.7 parts by mass |
| Photopolymerization initiator 12 | 0.8 parts by mass |
| Surfactant 11 | 4.2 parts by mass |
| PGMEA | 45.8 parts by mass |

Raw materials used in the composition for forming a pixel in each color are as follows.

Red Pigment Dispersion Liquid

A mixed liquid formed of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads having a diameter of 0.3 mm) for 3 hours. Thereafter, a dispersion treatment was performed under a pressure of 2,000 kg/cm$^3$ at a flow rate of 500 g/min, using a high-pressure disperser NANO-3000-10 (manufactured by Nippon BEE Chemical Co., Ltd.) equipped with a pressure reducing mechanism. This dispersing treatment was repeated 10 times to obtain a red pigment dispersion liquid.

Green Pigment Dispersion Liquid 1

A mixed liquid formed of 6.4 parts by mass of C. I. Pigment Green 58, 5.3 parts by mass of C. I. Pigment Yellow 185, 5.2 parts by mass of a dispersant (Disperbyk-161, manufactured by BYK Chemie), and 83.1 parts by mass of PGMEA was mixed and dispersed for 3 hours using a beads mill (zirconia beads having a diameter of 0.3 mm). Thereafter, a dispersion treatment was performed under a pressure of 2,000 kg/cm$^3$ at a flow rate of 500 g/min, using a high-pressure disperser NANO-3000-10 (manufactured by Nippon BEE Chemical Co., Ltd.) equipped with a pressure reducing mechanism. This dispersing treatment was repeated 10 times to obtain a green pigment dispersion liquid 1.

Green Pigment Dispersion Liquid 2

A mixed liquid formed of 11.7 parts by mass of C. I. Pigment Green 58, 5.2 parts by mass of a dispersant (Disperbyk-161, manufactured by BYK Chemie), and 83.1 parts by mass of PGMEA was mixed and dispersed for 3 hours using a beads mill (zirconia beads having a diameter of 0.3 mm). Thereafter, a dispersion treatment was performed under a pressure of 2,000 kg/cm$^3$ at a flow rate of 500 g/min, using a high-pressure disperser NANO-3000-10 (manufactured by Nippon BEE Chemical Co., Ltd.) equipped with a pressure reducing mechanism. This dispersing treatment was repeated 10 times to obtain a green pigment dispersion liquid 2.

Green Pigment Dispersion Liquid 3

A mixed liquid formed of 11.7 parts by mass of C. I. Pigment Green 36, 5.2 parts by mass of a dispersant (Disperbyk-161, manufactured by BYK Chemie), and 83.1 parts by mass of PGMEA was mixed and dispersed for 3 hours using a beads mill (zirconia beads having a diameter of 0.3 mm). Thereafter, a dispersion treatment was performed under a pressure of 2,000 kg/cm$^3$ at a flow rate of 500 g/min, using a high-pressure disperser NANO-3000-10 (manufactured by Nippon BEE Chemical Co., Ltd.) equipped with a pressure reducing mechanism. This dispersing treatment was repeated 10 times to obtain a green pigment dispersion liquid 3.

Green Pigment Dispersion Liquids 4 to 7

Green pigment dispersion liquids 4 to 7 were obtained by performing the same treatment as for the green pigment dispersion liquid 1, except that 5.3 parts by mass of C. I. Pigment Yellow 185 was replaced by the following compounds 1 to 4.

Compound 1

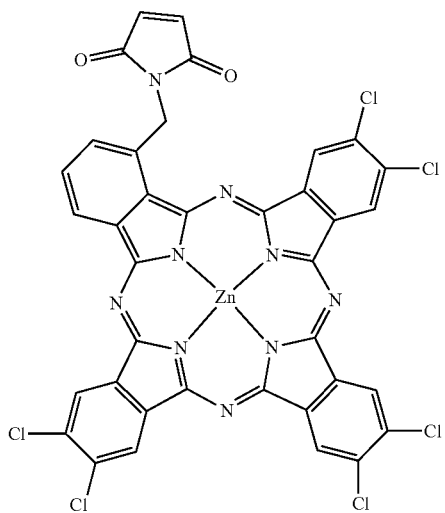

Compound 2

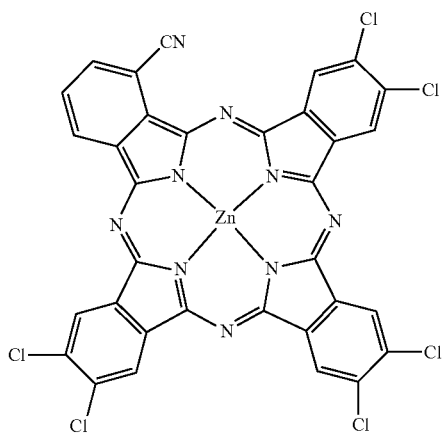

Compound 3

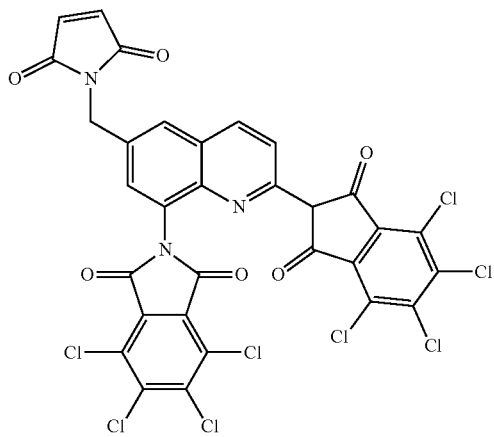

Compound 4

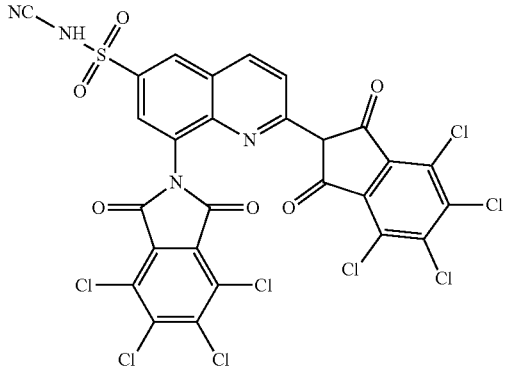

Green Pigment Dispersion Liquids 8 to 11

Green pigment dispersion liquids 8 to 11 were obtained by performing the same treatment as for the green pigment dispersion liquid 1, except that 5.2 parts by mass of the dispersant (Disperbyk-161, manufactured by BYK Chemie) was replaced by the following pigment dispersants 1 to 4 (in which the solid contents were adjusted to the same parts by mass)

[Pigment Dispersant 1]

For a first-stage synthesis, 100 parts by mass of methyl methacrylate, 100 parts by mass of n-butyl acrylate, 50 parts by mass of cyclohexyl maleimide as N-substituted maleimide, and 40 parts by mass of propylene glycol monomethyl ether acetate were introduced into a reaction tank equipped with a gas introduction pipe, a condenser, a stirring blade, and a thermometer, and the inside of the reaction tank was replaced by a nitrogen gas. The inside of the reaction vessel was heated to 80° C., 12 parts by mass of 3-mercapto-1,2-propanediol was added into the reaction vessel, then 0.2 parts by mass of 2,2'-azobisisobutyronitrile were added thereto every 30 minutes in 20 divided portions to undergo a reaction at 80° C. for 12 hours, and it was confirmed by measurement of a solid content that 95% of the reaction proceeded.

Next, for a second-stage synthesis, 30 parts by mass of pyromellitic anhydride, 160 parts by mass of propylene glycol monomethyl ether acetate, and 0.40 parts by mass of 1,8-diazabicyclo-[5.4.0]-7-undecene as a catalyst were added thereto to undergo a reaction at 120° C. for 7 hours. After confirming by titration that 98% or more of the acid anhydride was half-esterified, the reaction was completed. After completing the reaction, propylene glycol monomethyl ether acetate was added thereto for preparation such that the non-volatile content became 40% by weight, thereby preparing a pigment dispersant 1 having an acid value of 45 mg KOH/g per solid content and a weight-average molecular weight of 9,500.

[Pigment Dispersant 2]

For a first-stage synthesis, 100 parts by mass of methyl methacrylate, 100 parts by mass of n-butyl acrylate, 35 parts by mass of N-phenyl maleimide as N-substituted maleimide, and 40 parts by mass of propylene glycol monomethyl ether acetate were introduced into a reaction tank equipped with a gas introduction pipe, a condenser, a stirring blade, and a thermometer, and the inside of the reaction tank was replaced by a nitrogen gas. The inside of the reaction vessel was heated to 80° C., 12 parts of 3-mercapto-1,2-propanediol was added into the reaction vessel, then 0.2 parts by mass of 2,2'-azobisisobutyronitrile were added thereto every 30 minutes in 20 divided portions to undergo a reaction at 80° C. for 12 hours, and it was confirmed by measurement of a solid content that 95% of the reaction proceeded.

Next, for a second-stage synthesis, 30 parts by mass of pyromellitic anhydride, 160 parts by mass of propylene glycol monomethyl ether acetate, and 0.40 parts by mass of 1,8-diazabicyclo-[5.4.0]-7-undecene as a catalyst were added thereto to undergo a reaction at 120° C. for 7 hours. After confirming by titration that 98% or more of the acid anhydride was half-esterified, the reaction was completed. After completing the reaction, propylene glycol monomethyl ether acetate was added thereto for preparation such that the non-volatile content became 40% by mass, thereby preparing a pigment dispersant 2 having an acid value of 80 mg KOH/g per solid content and a weight-average molecular weight of 7,800.

[Pigment Dispersant 3]

For a first-stage synthesis, 100 parts by mass of diallyl isophthalate, 100 parts by mass of n-butyl acrylate, and 40 parts by mass of propylene glycol monomethyl ether acetate were introduced into a reaction vessel equipped with a gas introduction pipe, a condenser, a stirring blade, and a thermometer, and the inside of the reaction vessel was replaced by a nitrogen gas. The inside of the reaction vessel was heated to 80° C., 12 parts of 3-mercapto-1,2-propanediol was added thereto, then 0.2 parts by mass of 2,2'-azobisisobutyronitrile were added to the reaction vessel every 30 minutes in 20 divided portions to undergo a reaction at 80° C. for 12 hours, and it was confirmed by measurement of a solid content that 95% of the reaction proceeded.

Next, for a second-stage synthesis, 30 parts by mass of pyromellitic anhydride, 160 parts by mass of propylene glycol monomethyl ether acetate, and 0.40 parts by mass of 1,8-diazabicyclo-[5.4.0]-7-undecene as a catalyst were added thereto to undergo a reaction at 120° C. for 7 hours. After confirming by titration that 98% or more of the acid anhydride was half-esterified, the reaction was completed. After completing the reaction, propylene glycol monomethyl ether acetate was added thereto for preparation such that the non-volatile content became 40% by mass, thereby preparing a pigment dispersant 3 having an acid value of 45 mg KOH/g per solid content and a weight-average molecular weight of 10,000.

[Pigment Dispersant 4]

For a first-stage synthesis, 100 parts by mass of diallyl orthophthalate, 100 parts by mass of n-butyl acrylate, and 40 parts by mass of propylene glycol monomethyl ether acetate were introduced into a reaction vessel equipped with a gas introduction pipe, a condenser, a stirring blade, and a thermometer, and the inside of the reaction vessel was replaced by a nitrogen gas. The inside of the reaction vessel was heated to 80° C., 12 parts of 3-mercapto-1,2-propanediol was added thereto, then 0.2 parts by mass of 2,2'-azobisisobutyronitrile were added to the reaction vessel every 30 minutes in 20 divided portions to undergo a reaction at 80° C. for 12 hours, and it was confirmed by measurement of a solid content that 95% of the reaction proceeded.

Next, for a second-stage synthesis, 30 parts by mass of pyromellitic anhydride, 160 parts by mass of propylene glycol monomethyl ether acetate, and 0.40 parts by mass of 1,8-diazabicyclo-[5.4.0]-7-undecene as a catalyst were added thereto to undergo a reaction at 120° C. for 7 hours. After confirming by titration that 98% or more of the acid anhydride was half-esterified, the reaction was completed. After completing the reaction, propylene glycol monomethyl ether acetate was added thereto for preparation such that the non-volatile content became 40% by mass, thereby preparing a pigment dispersant 4 having an acid value of 45 mg KOH/g per solid content and a weight-average molecular weight of 9,800.

Blue Pigment Dispersion Liquid

A mixed liquid formed of 9.7 parts by mass of C. I. Pigment Yellow Blue 15:6, 2.4 parts by mass of C. I. Pigment Violet 23, 5.5 parts by mass of a dispersant (Disperbyk-161, manufactured by BYK Chemie), and 82.4 parts by mass of PGMEA was mixed and dispersed using a beads mill (zirconia beads having a diameter of 0.3 mm) for 3 hours. Thereafter, a dispersion treatment was performed under a pressure of 2,000 kg/cm$^3$ at a flow rate of 500 g/min, using a high-pressure disperser NANO-3000-10 (manufactured by Nippon BEE Chemical Co., Ltd.) equipped with a pressure reducing mechanism. This dispersing treatment was repeated 10 times to obtain a blue pigment dispersion.

Polymerizable compound 11: A compound having the following structure

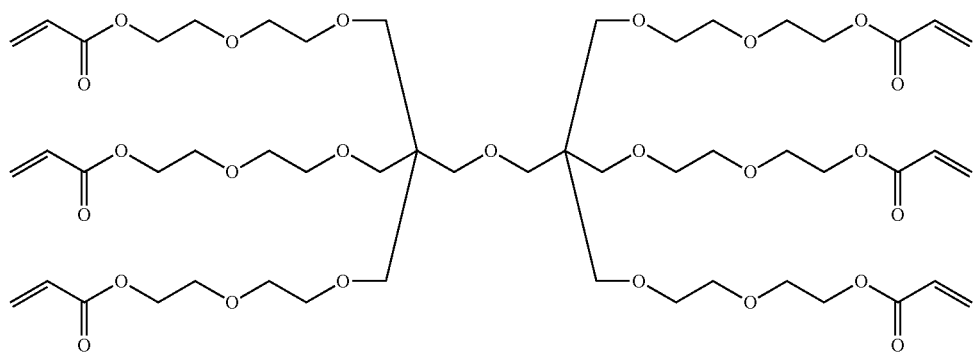 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable compound 12: A mixture of compounds having the following structures (a mixture in which a molar ratio of the left compound to the right compound is 7:3)

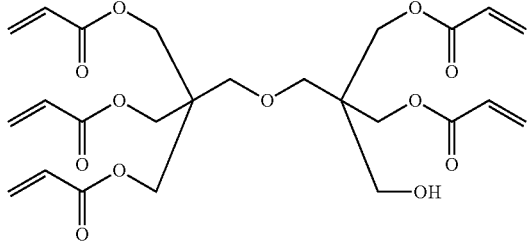

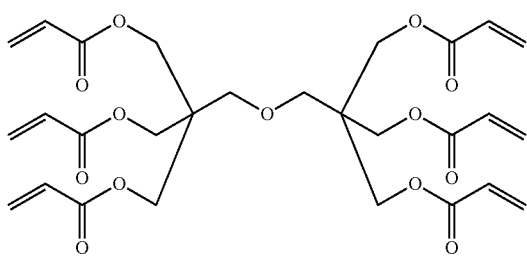

Polymerizable compound 13: ARONIX M-305 (55% to 63% by mass of triacrylate, manufactured by Toagosei Co., Ltd.)

Polymerizable compound 16: 2-Cyano-3-phenylacrylic acid

Polymerizable compound 17: 4-Cyanophenyl methacrylate

Polymerizable compound 18: 3-Chloro-2-hydroxypropyl methacrylate

Polymerizable compound 19: 3-Chloro-2-hydroxypropyl acrylate

Polymerizable compound 20: 3-Bromo-2-hydroxypropyl methacrylate

Polymerizable compound 21: 3-Bromo-2-hydroxypropyl acrylate

Polymerizable compound 22: 3-Fluoro-2-hydroxypropyl methacrylate

Polymerizable compound 23: 3-Fluoro-2-hydroxypropyl acrylate

Polymerizable compound 24: 3-Chloropropyl methacrylate

Polymerizable compound 25: N-Acryloxyethyl hexahydrophthalimide (ARONIX M140, manufactured by Toagosei Co., Ltd.)

Polymerizable compound 26: Maleimide acrylate (ARONIX M145, manufactured by Toagosei Co., Ltd.)

Polymerizable compound 27: 1,4-Bis(maleimide)butane

Photopolymerization initiator 11: IRGACURE-OXE01 (manufactured by BASF)

Photopolymerization initiator 12: Compound having the following structure

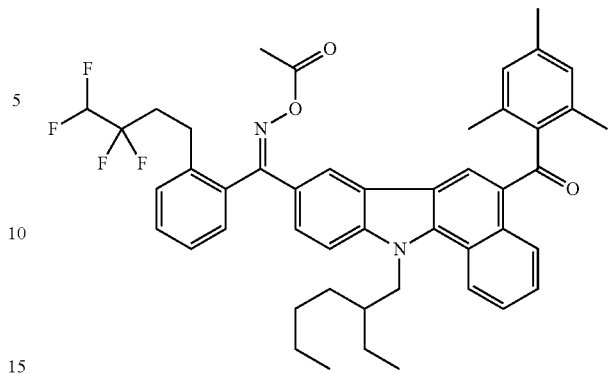

Ultraviolet absorber 11: The ultraviolet absorber 1
Additive 12: LA-63P (manufactured by Adeka Corporation)
Additive 13: Tinuvin 622 (manufactured by BASF)
Additive 14: 2-Nitrophenyl methacrylate
Additive 15: p-Nitrophenol
Resin 11: The resin 1
Resin 28

70 parts by mass of cyclohexanone was put into a reaction vessel and heated to 80° C. while injecting a nitrogen gas into the vessel, and a mixture of 12.3 parts by mass of benzyl methacrylate, 4.6 parts by mass of 2-hydroxyethyl methacrylate, 5.3 parts by mass of methacrylic acid, 7.4 parts by mass of paracumylphenol ethylene oxide-modified acrylate (manufactured by Toagosei Co., Ltd., ARONIX M110) as a photopolymerizable monomer, and 0.8 parts by mass of azobisisobutyronitrile was added dropwise thereto at the same temperature for 2 hours to perform a polymerization reaction. After completing the dropwise addition, the reaction was performed at 80° C. for 3 hours, then a solution formed by dissolving 4.0 parts by mass of 4-cyanophenyl methacrylate in 20 parts by mass of cyclohexanone was added to the mixture, and the reaction was continued at 80° C. for 2 hours to obtain a non-photosensitive transparent resin copolymer solution. After cooling to room temperature, cyclohexanone was added thereto such that a non-volatile content was 20% by mass, thereby obtaining a resin 28. The mass-average molecular weight of the obtained resin 28 was 15,000.

Resin 29

70 parts by mass of cyclohexanone was put into a reaction vessel and heated to 80° C. while injecting a nitrogen gas into the vessel, and a mixture of 12.3 parts by mass of benzyl methacrylate, 4.6 parts by mass of 2-hydroxyethyl methacrylate, 5.3 parts by mass of methacrylic acid, and 0.4 parts by mass of azobisisobutyronitrile was added dropwise thereto at the same temperature for 2 hours to perform a polymerization reaction. After completing the dropwise addition, the reaction was performed at 80° C. for 3 hours, then a solution formed by dissolving 7.4 parts by mass of 3-chloro-2-hydroxypropyl methacrylate and 0.2 parts by mass of azobisisobutyronitrile in 10 parts by mass of cyclohexanone was added to the mixture, and the reaction was continued at 80° C. for 1 hour to obtain a non-photosensitive transparent resin copolymer solution. After cooling to room temperature, about 2 g of the non-photosensitive transparent resin solution was sampled, the sample was dried by heating at 180° C. for 20 minutes to measure a non-volatile content, and cyclohexanone was added to the non-photosensitive transparent resin solution synthesized above such that the non-volatile content was 20% by mass to obtain a resin 29. The mass-average molecular weight of the obtained resin 29 was 15,000.

Resin 30: Maleimido group-containing photoreactive acryl polymer (ARONIX UVT-302, manufactured by Toagosei Co., Ltd.)

Resin 31

70 parts by mass of cyclohexanone was put into a reaction vessel and heated to 80° C. while injecting a nitrogen gas into the vessel, and a mixture of 50 parts by mass of cyclohexylmaleimide as a N-substituted maleimide, 15 parts by mass of hydroxyethyl methacrylate, 12 parts by mass of methacrylic acid, 23 parts by mass of methyl methacrylate, and 0.4 parts by mass of azobisisobutyronitrile was added dropwise thereto at the same temperature for 2 hours to perform a polymerization reaction. After completing the dropwise addition, the reaction was performed at 80° C. for 3 hours, then a solution formed by dissolving 0.2 parts by mass of azobisisobutyronitrile in 10 parts by mass of cyclohexanone was added to the mixture, and the reaction was continued at 80° C. for 1 hour to obtain a non-photosensitive transparent resin copolymer solution. After cooling to room temperature, about 2 g of the non-photosensitive transparent resin solution was sampled, the sample was dried by heating at 180° C. for 20 minutes to measure a non-volatile content, and cyclohexanone was added to the non-photosensitive transparent resin solution synthesized above such that the non-volatile content was 20% by mass to obtain a resin 31. The mass-average molecular weight of the obtained resin 31 was 14,000.

Resin 32

70 parts by mass of cyclohexanone was put into a reaction vessel and heated to 80° C. while injecting a nitrogen gas into the vessel, and a mixture of 50 parts by mass of N-(4-phenyl)-(5-norbornene-2,3-dicarboxyimide) as N-substituted norbornene-5,6-dicarboxyimide, 15 parts by mass of hydroxyethyl methacrylate, 12 parts by mass of methacrylic acid, 23 parts by mass of methyl methacrylate, and 0.4 parts by mass of azobisisobutyronitrile was added dropwise thereto at the same temperature for 2 hours to perform a polymerization reaction. After completing the dropwise addition, the reaction was performed at 80° C. for 3 hours, then a solution formed by dissolving 0.2 parts by mass of azobisisobutyronitrile in 10 parts by mass of cyclohexanone was added to the mixture, and the reaction was continued at 80° C. for 1 hour to obtain a non-photosensitive transparent resin copolymer solution. After cooling to room temperature, about 2 g of the non-photosensitive transparent resin solution was sampled, the sample was dried by heating at 180° C. for 20 minutes to measure a non-volatile content, and cyclohexanone was added to the non-photosensitive transparent resin solution synthesized above such that the non-volatile content was 20% by mass to obtain a resin 32. The mass-average molecular weight of the obtained resin 32 was 20,000.

Resin 33

70 parts by mass of cyclohexanone was put into a reaction vessel and heated to 80° C. while injecting a nitrogen gas into the vessel, and a mixture of 12.3 parts by mass of benzyl methacrylate, 4.6 parts by mass of 2-hydroxyethyl methacrylate, 5.3 parts by mass of methacrylic acid, 7.4 parts by mass of paracumylphenol ethylene oxide-modified acrylate (manufactured by Toagosei Co., Ltd., ARONIX M110) as a (b) photopolymerizable monomer, and 0.4 parts by mass of azobisisobutyronitrile was added dropwise thereto at the same temperature for 2 hours to perform a polymerization reaction. After completing the dropwise addition, the reaction was performed at 80° C. for 3 hours, then a solution formed by dissolving 0.2 parts by mass of azobisisobutyronitrile in 10 parts by mass of cyclohexanone was added to the mixture, and the reaction was continued at 80° C. for 1 hour to obtain a non-photosensitive transparent resin copolymer solution. After cooling to room temperature, about 2 g of the non-photosensitive transparent resin solution was sampled, the sample was dried by heating at 180° C. for 20 minutes to measure a non-volatile content, and cyclohexanone was added to the non-photosensitive transparent resin solution synthesized above such that the non-volatile content was 20% by mass to obtain a resin 33. The mass-average molecular weight of the obtained resin 33 was 20,000.

Resin 34

70 parts by mass of cyclohexanone was put into a reaction vessel and heated to 80° C. while injecting a nitrogen gas into the vessel, and a mixture of 12.3 parts by mass of benzyl methacrylate, 4.6 parts by mass of 2-hydroxyethyl methacrylate, 5.3 parts by mass of methacrylic acid, 7.4 parts by mass of paracumylphenol ethylene oxide-modified acrylate (manufactured by Toagosei Co., Ltd., ARONIX M110) as a photopolymerizable monomer, and 0.8 parts by mass of azobisisobutyronitrile was added dropwise thereto at the same temperature for 2 hours to perform a polymerization reaction. After completing the dropwise addition, the reaction was performed at 80° C. for 3 hours, then a solution formed by dissolving 4.0 parts by mass of 4-nitrophenyl methacrylate in 20 parts by mass of cyclohexanone was added to the mixture, and the reaction was continued at 80° C. for 2 hours to obtain a non-photosensitive transparent resin copolymer solution. After cooling to room temperature, cyclohexanone was added thereto such that the non-volatile content was 20% by mass to obtain a resin 34. The mass-average molecular weight of the obtained resin 34 was 15,000.

Surfactant 11: A 0.2%-by-mass PGMEA solution of the following compound (Mw=14,000). In the following formulae, % indicating the ratio of the repeating unit is % by mole.

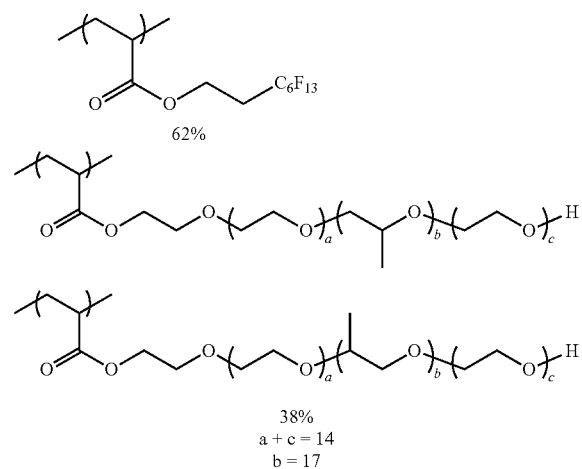

62%

38%
a + c = 14
b = 17

<Production of Structure>

Examples 1 to 12

The composition 1 for forming a green pixel was applied onto a glass wafer using a spin coater such that the film thickness after drying became 0.6 μm, and subjected to a heating treatment (pre-baking) using a hot plate at 100° C. for 120 seconds.

Subsequently, exposure from 50 to 1,500 mJ/cm$^2$ at a step of 50 mJ/cm$^2$ was performed with a photomask having a Bayer pattern formed thereon in 1.1 μm×1.1 μm, using an i-ray stepper exposure device FPA-3000i5+(manufactured by Canon Inc.) to determine an optimal exposure dose that resolved the square pixel pattern, and exposure was performed at this optimal exposure dose.

Thereafter, the glass wafer having the exposed coating film formed thereon was placed on a horizontal rotary table of a spin-shower developing machine (DW-30 Type, manufactured by Chemitronics Co., Ltd.), and subjected to puddle development with a developer (CD-2060, manufactured by FUJIFILM Electronic Materials) at 23° C. for 60 seconds. Then, a rinsing treatment was performed with pure water and then spin drying was performed. Subsequently, a heating treatment (post-baking) was performed using a hot plate at 200° C. for 300 seconds to form a green colored pattern (green pixel) on the glass wafer.

In the same manner, pattern formation was performed by the same process using a composition for forming a red pixel and a composition for forming a blue pixel to sequentially form a red pixel and a blue pixel, and thus form color filters having a green pixel, a red pixel, and a blue pixel.

A composition for forming an absorption layer shown in the following table was applied onto a surface of the color filter using a spin coater such that the film thickness after drying was 0.5 μm, and a heating treatment (pre-baking) was performed using a hot plate at 100° C. for 120 seconds.

Subsequently, exposure was performed with a photomask at an exposure dose of 1,000 mJ/cm$^2$, using an i-ray stepper exposure device FPA-3000i5+(manufactured by Canon Inc.). Thereafter, the glass wafer having the exposed coating film formed thereon was placed on a horizontal rotary table of a spin-shower developing machine (DW-30 Type, manufactured by Chemitronics Co., Ltd.), and subjected to puddle development with a developer (CD-2060, manufactured by FUJIFILM Electronic Materials) at 23° C. for 60 seconds. Then, a rinsing treatment was performed with pure water and then spin drying was performed. Subsequently, a heating treatment (post-baking) was performed using a hot plate at 200° C. for 300 seconds to form an absorption layer on the green pixel and the red pixel of the color filter. This structure is a structure having an absorption layer provided on the optical paths of the pixels (the green pixel and the red pixel) of the color filter and on the side through which light is incident on such the pixels. In this structure, the film thickness of each of the green pixel, the red pixel, and the blue pixel was 0.6 μm, and the film thickness of the absorption layer was 0.5 μm.

Examples 13 to 18

A green pixel was formed by performing pattern formation by the same process as in Examples 1 to 12, except that a composition 2 for forming a green pixel, instead of the composition 1 for forming a green pixel, was applied onto a glass wafer using a spin coater such that the film thickness after drying became 0.4 μm. Subsequently, a red pixel and a blue pixel were sequentially formed by performing pattern formation by the same process using the composition for forming a red pixel and the composition for forming a blue pixel, and a color filter having the green pixel, the red pixel, and the blue pixel was formed.

The compositions 1 to 6 for forming an absorption layer shown in the following tables were applied onto a surface of the color filter such that the film thickness after drying became 0.1 μm, and subjected to a heating treatment (pre-baking) using a hot plate at 100° C. for 120 seconds.

Subsequently, exposure was performed with a photomask at an exposure dose of 1,000 mJ/cm$^2$, using an i-ray stepper exposure device FPA-3000i5+(manufactured by Canon Inc.). Thereafter, the glass wafer having the exposed coating film formed thereon was placed on a horizontal rotary table of a spin-shower developing machine (DW-30 Type, manufactured by Chemitronics Co., Ltd.), and subjected to puddle development with a developer (CD-2060, manufactured by FUJIFILM Electronic Materials) at 23° C. for 60 seconds. Then, a rinsing treatment was performed with pure water and then spin drying was performed. Subsequently, a heating treatment (post-baking) was performed using a hot plate at 200° C. for 300 seconds to form an absorption layer on the green pixel of the color filter. This structure is a structure having an absorption layer provided on an optical path of a pixel (a green pixel) of the color filter and on the side through which light is incident on the pixel. In this structure, the film thickness of the green pixel was 0.4 μm, the film thickness of each of the red pixel and the blue pixel was 0.5 μm, and the film thickness of the absorption layer was 0.1 μm.

Examples 19 to 24

A green pixel was formed by performing pattern formation by the same process as in Examples 1 to 12, except that a composition 3 for forming a green pixel, instead of the composition 1 for forming a green pixel, was applied onto a glass wafer using a spin coater such that the film thickness after drying became 0.48 μm. Subsequently, a red pixel and a blue pixel were sequentially formed by performing pattern formation by the same process using the composition for forming a red pixel and the composition for forming a blue pixel, and a color filter having the green pixel, the red pixel, and the blue pixel was formed.

The compositions 1 to 6 for forming an absorption layer shown in the following tables were applied onto a surface of the color filter such that the film thickness after drying became 0.12 μm, and subjected to a heating treatment (pre-baking) using a hot plate at 100° C. for 120 seconds.

Subsequently, exposure was performed with a photomask at an exposure dose of 1,000 mJ/cm$^2$, using an i-ray stepper exposure device FPA-3000i5+(manufactured by Canon Inc.). Thereafter, the glass wafer having the exposed coating film formed thereon was placed on a horizontal rotary table of a spin-shower developing machine (DW-30 Type, manufactured by Chemitronics Co., Ltd.), and subjected to puddle development with a developer (CD-2060, manufactured by FUJIFILM Electronic Materials) at 23° C. for 60 seconds. Then, a rinsing treatment was performed with pure water and then spin drying was performed. Subsequently, a heating treatment (post-baking) was performed using a hot plate at 200° C. for 300 seconds to form an absorption layer on the green pixel of the color filter. This structure is a structure having an absorption layer provided on an optical path of a pixel (a green pixel) of the color filter and on the side through which light is incident on the pixel. In this structure, the film thickness of the green pixel was 0.48 μm, the film thickness of each of the red pixel and the blue pixel was 0.6 μm, and the film thickness of the absorption layer was 0.12 μm.

<Production of Structure>

Examples 25 to 55

A structure was formed in the same manner as in Example 1, except that each of compositions 4 to 34 for forming a green pixel was used instead of the composition 1 for forming a green pixel.

Comparative Example 1 to 8

A structure was produced by forming an absorption layer in the same manner as in Examples 1 to 8, except that each of compositions 1 to 8 for forming an absorption layer was used on a side of the glass wafer having the color filter formed thereon, which is opposite to the color filter. This structure is a structure having an absorption layer provided on the optical paths of pixels (a green pixel and a red pixel) of the color filter and on the side through which light exits from such pixels.

Comparative Example 9

A structure was produced by forming a film by applying a comparative composition 1 onto a surface of the color filter in the same manner as in Examples 1 to 12. This structure is a structure having a film formed with the comparative composition 1 on the optical paths of pixels (a green pixel and a red pixel) of the color filter and on the side through which light is incident on such pixels.

<Evaluation>

(Light Resistance)

A light resistance test was performed by irradiating the structure with light at a luminance of 100,000 lux for 1,500 hours using a Super Xenon Weather Meter SX75 (manufactured by Suga Test Instruments Co., Ltd.). Further, the structures of Examples 1 to 55 and Comparative Example 9 were irradiated with light from the absorption layer side (the side of the film formed with the comparative composition 1 for Comparative Example 9). In addition, the structures of Comparative Examples 1 to 8 were irradiated with light from the color filter side.

In addition, a variation ($\Delta T$ %) of the transmittance of each pixel was measured and the light resistance was evaluated in accordance with the following standard. In addition, a variation ($\Delta T$ %) of the transmittance as compared is a variation with respect to a wavelength at which the variation in the transmittance is the largest (|Transmittance (%) before light resistance test-Transmittance (%) after light resistance|) in a wavelength range of 400 to 700 nm.

<Evaluation Standard>
5: $\Delta T$ %$\leq$10
4: 10<$\Delta T$ %$\leq$20
3: 20<$\Delta T$ %$\leq$30
2: 30<$\Delta T$ %$\leq$40
1: 40<$\Delta T$ %

(Moisture Resistance)

With regard to the structure, a moisture resistance test was performed for 250 hours under the conditions of a temperature of 110° C./a humidity of 85% using HASTEST MODEL 304R[8] (manufactured by Hirayama Manufacturing Corporation). After the moisture resistance test, a variation ($\Delta T$ %) of the transmittance of each pixel was measured and the moisture resistance was evaluated in accordance with the following standard. Further, a variation ($\Delta T$ %) of the transmittance as compared is a variation with respect to a wavelength at which the variation in the transmittance is the largest (|Transmittance (%) before moisture resistance test-Transmittance (%) after moisture resistance|) in a wavelength range of 400 to 700 nm.

<Evaluation Standard>
5: $\Delta T$ %$\leq$1
4: 1<$\Delta T$ %$\leq$2
3: 2<$\Delta T$ %$\leq$3
2: 3<$\Delta T$ %$\leq$4
1: 4<$\Delta T$ %

TABLE 1

| | Green composition used | Composition for forming absorption layer used | Light resistance Green pixel | Light resistance Red pixel | Moisture resistance Green pixel | Moisture resistance Red pixel |
|---|---|---|---|---|---|---|
| Example 1 | Green composition 1 | Composition 1 for forming absorption layer | 4 | 4 | 4 | 4 |
| Example 2 | | Composition 2 for forming absorption layer | 2 | 2 | 4 | 4 |
| Example 3 | | Composition 3 for forming absorption layer | 3 | 3 | 4 | 4 |
| Example 4 | | Composition 4 for forming absorption layer | 5 | 5 | 5 | 5 |
| Example 5 | | Composition 5 for forming absorption layer | 3 | 3 | 5 | 5 |
| Example 6 | | Composition 6 for forming absorption layer | 4 | 4 | 5 | 5 |
| Example 7 | | Composition 7 for forming absorption layer | 2 | 2 | 2 | 2 |
| Example 8 | | Composition 8 for forming absorption layer | 2 | 2 | 3 | 3 |
| Example 9 | | Composition 9 for forming absorption layer | 2 | 2 | 2 | 2 |
| Example 10 | | Composition 10 for forming absorption layer | 3 | 3 | 3 | 3 |
| Example 11 | | Composition 11 for forming absorption layer | 4 | 4 | 3 | 3 |
| Example 12 | | Composition 12 for forming absorption layer | 4 | 4 | 3 | 3 |
| Example 13 | Green composition 2 | Composition 1 for forming absorption layer | 4 | — | 3 | — |

TABLE 1-continued

|  | Green composition used | Composition for forming absorption layer used | Light resistance Green pixel | Light resistance Red pixel | Moisture resistance Green pixel | Moisture resistance Red pixel |
|---|---|---|---|---|---|---|
| Example 14 |  | Composition 2 for forming absorption layer | 2 | — | 3 | — |
| Example 15 |  | Composition 3 for forming absorption layer | 3 | — | 3 | — |
| Example 16 |  | Composition 4 for forming absorption layer | 5 | — | 3 | — |
| Example 17 |  | Composition 5 for forming absorption layer | 3 | — | 3 | — |
| Example 18 |  | Composition 6 for forming absorption layer | 4 | — | 3 | — |
| Example 19 | Green composition 3 | Composition 1 for forming absorption layer | 5 | — | 4 | — |
| Example 20 |  | Composition 2 for forming absorption layer | 3 | — | 4 | — |
| Example 21 |  | Composition 3 for forming absorption layer | 4 | — | 4 | — |
| Example 22 |  | Composition 4 for forming absorption layer | 5 | — | 4 | — |
| Example 23 |  | Composition 5 for forming absorption layer | 4 | — | 4 | — |
| Example 24 |  | Composition 6 for forming absorption layer | 5 | — | 4 | — |

TABLE 2

|  | Green composition used | Composition for forming absorption layer used | Light resistance Green pixel | Light resistance Red pixel | Moisture resistance Green pixel | Moisture resistance Red pixel |
|---|---|---|---|---|---|---|
| Example 25 | Green composition 4 | Composition 1 for forming absorption layer | 5 | 4 | 4 | 4 |
| Example 26 | Green composition 5 |  | 5 | 4 | 4 | 4 |
| Example 27 | Green composition 6 |  | 5 | 4 | 4 | 4 |
| Example 28 | Green composition 7 |  | 5 | 4 | 4 | 4 |
| Example 29 | Green composition 8 |  | 5 | 4 | 4 | 4 |
| Example 30 | Green composition 9 |  | 5 | 4 | 4 | 4 |
| Example 31 | Green composition 10 |  | 5 | 4 | 4 | 4 |
| Example 32 | Green composition 11 |  | 5 | 4 | 4 | 4 |
| Example 33 | Green composition 12 |  | 5 | 4 | 4 | 4 |
| Example 34 | Green composition 13 |  | 5 | 4 | 4 | 4 |
| Example 35 | Green composition 14 |  | 5 | 4 | 4 | 4 |
| Example 36 | Green composition 15 |  | 5 | 4 | 4 | 4 |
| Example 37 | Green composition 16 |  | 5 | 4 | 4 | 4 |
| Example 38 | Green composition 17 |  | 5 | 4 | 4 | 4 |
| Example 39 | Green composition 18 |  | 5 | 4 | 4 | 4 |
| Example 40 | Green composition 19 |  | 5 | 4 | 4 | 4 |
| Example 41 | Green composition 20 |  | 5 | 4 | 4 | 4 |
| Example 42 | Green composition 21 |  | 5 | 4 | 4 | 4 |
| Example 43 | Green composition 22 |  | 5 | 4 | 4 | 4 |
| Example 44 | Green composition 23 |  | 5 | 4 | 4 | 4 |
| Example 45 | Green composition 24 |  | 5 | 4 | 4 | 4 |
| Example 46 | Green composition 25 |  | 5 | 4 | 4 | 4 |
| Example 47 | Green composition 26 |  | 5 | 4 | 4 | 4 |
| Example 48 | Green composition 27 |  | 5 | 4 | 4 | 4 |
| Example 49 | Green composition 28 |  | 5 | 4 | 4 | 4 |
| Example 50 | Green composition 29 |  | 5 | 4 | 4 | 4 |
| Example 51 | Green composition 30 |  | 5 | 4 | 4 | 4 |
| Example 52 | Green composition 31 |  | 5 | 4 | 4 | 4 |
| Example 53 | Green composition 32 |  | 5 | 4 | 4 | 4 |
| Example 54 | Green composition 33 |  | 5 | 4 | 4 | 4 |
| Example 55 | Green composition 34 |  | 5 | 4 | 4 | 4 |

TABLE 3

| | Green composition used | Composition for forming absorption layer used | Light resistance Green pixel | Light resistance Red pixel | Moisture resistance Green pixel | Moisture resistance Red pixel |
|---|---|---|---|---|---|---|
| Comparative Example 1 | Green composition 1 | Composition 1 for forming absorption layer | 1 | 1 | 1 | 1 |
| Comparative Example 2 | | Composition 2 for forming absorption layer | 1 | 1 | 1 | 1 |
| Comparative Example 3 | | Composition 3 for forming absorption layer | 1 | 1 | 1 | 1 |
| Comparative Example 4 | | Composition 4 for forming absorption layer | 1 | 1 | 1 | 1 |
| Comparative Example 5 | | Composition 5 for forming absorption layer | 1 | 1 | 1 | 1 |
| Comparative Example 6 | | Composition 6 for forming absorption layer | 1 | 1 | 1 | 1 |
| Comparative Example 7 | | Composition 7 for forming absorption layer | 1 | 1 | 1 | 1 |
| Comparative Example 8 | | Composition 8 for forming absorption layer | 1 | 1 | 1 | 1 |
| Comparative Example 9 | | Comparative Composition 1 | 1 | 1 | 2 | 2 |

Furthermore, in the tables, the Green composition represents a composition for forming a green pixel.

The structures of Examples as shown in the tables had excellent light resistance. In addition, the structures also had excellent moisture resistance. In contrast, the structures of Comparative Examples had deteriorated light resistance.

In the respective Examples, the same effects as in Examples were obtained even in a case where an absorption layer was formed by applying a composition for forming an absorption layer onto a surface of various layers or members (for example, a planarization layer, a microlens, a light collecting lens, an infrared blocking filter, and a sealing glass) on an optical path of the pixel of the color filter and on the side through which light was incident on the pixel, not on a surface of the color filter, as shown in FIGS. 2 to 6.

EXPLANATION OF REFERENCES

1: support
10, 10a: color filter
11 to 13: pixel
11a, 11b: red pixel
12a, 12b: green pixel
13a, 13b: blue pixel
20, 21, 22: absorption layer
30: microlens
40: planarization layer
50: light collecting lens
60: infrared blocking filter
70: sealing glass

What is claimed is:

1. A structure comprising:
a color filter having two or more different types of pixels; and
an absorption layer including at least one colorant Y selected from a yellow colorant or a colorant having a maximum absorption wavelength in a wavelength range of 400 to 500 nm,
wherein the colorant Y includes C. I. Pigment Yellow 150, and
50% by mass or more of the colorant Y is at least one selected from C. I. Pigment Yellow 150, C. I. Pigment Yellow 139, or C. I. Pigment Yellow 185, and
the structure has the absorption layer on an optical path of at least one pixel of the pixels of the color filter and on the side through which light is incident on the pixel.

2. The structure according to claim 1,
wherein the absorption layer further includes an ultraviolet absorber.

3. The structure according to claim 2,
wherein the ultraviolet absorber includes at least one selected from a benzotriazole compound, a benzophenone compound, or a triazine compound.

4. The structure according to claim 1,
wherein the absorption layer includes at least one selected from an azo compound or an isoindoline compound.

5. The structure according to claim 1,
wherein the colorant Y further includes at least one selected from Color Index Pigment Yellow 139, or Color Index Pigment Yellow 185.

6. The structure according to claim 1,
wherein the color filter includes at least one colored pixel selected from a green pixel or a red pixel, and the structure has the absorption layer on an optical path of the colored pixel.

7. The structure according to claim 1,
wherein the color filter includes a green pixel, a red pixel, and a blue pixel, and
the structure has the absorption layer on an optical path of at least one pixel selected from the green pixel or the red pixel, but does not have the absorption layer on an optical path of the blue pixel.

8. The structure according to claim 7,
wherein the green pixel contains a halogenated zinc phthalocyanine pigment.

9. The structure according to claim 7,
wherein the structure has the absorption layer on the optical paths of the green pixel and the red pixel.

10. The structure according to claim 6,
wherein a film thickness of the absorption layer is 0.001 to 2 times a film thickness of the pixel having the absorption layer provided on an optical path thereof.

11. The structure according to claim 6,
wherein a film thickness of the absorption layer is 0.1 to 1 time a film thickness of the pixel having the absorption layer provided on an optical path thereof.

12. The structure according to claim 6,
wherein the color filter further includes at least one pixel selected from a transparent pixel or a pixel of an infrared transmitting layer.

13. The structure according to claim 1,
wherein the absorption layer is obtained by curing a composition including at least one selected from a yellow colorant or a colorant having a maximum absorption wavelength in a wavelength range of 400 to 500 nm, and a curable compound.

14. The structure according to claim 1,
wherein the pixel of the color filter and the absorption layer are in contact with each other.

15. A method for producing a structure, the method comprising:
forming a color filter; and
forming an absorption layer,
wherein the color filter has two or more different types of pixels,
the absorption layer includes at least one colorant Y selected from a yellow colorant or a colorant having a maximum absorption wavelength in a wavelength range of 400 to 500 nm,
the structure has the absorption layer on an optical path of at least one pixel of the pixels of the color filter and on the side through which light is incident on the pixel,
forming an absorption layer includes applying a composition for forming an absorption layer, the composition including at least one colorant Y selected from a yellow colorant or a colorant having a maximum absorption wavelength in a wavelength range of 400 to 500 nm,
the colorant Y includes C. I. Pigment Yellow 150, and
50% by mass or more of the colorant Y is at least one selected from C. I. Pigment Yellow 150, C. I. Pigment Yellow 139, or C. I. Pigment Yellow 185.

16. The method for producing a structure according to claim 15,
wherein the composition for forming an absorption layer is applied onto a surface of the color filter.

17. The method for producing a structure according to claim 15,
wherein forming an absorption layer further includes forming a pattern.

18. A composition for forming an absorption layer of a structure having a color filter having two or more different types of pixels and an absorption layer including at least one colorant Y selected from a yellow colorant or a colorant having a maximum absorption wavelength in a wavelength range of 400 to 500 nm, the structure having the absorption layer on an optical path of at least one pixel of the pixels of the color filter and on the side through which light is incident on the pixel,
wherein the composition for forming an absorption layer includes at least one colorant Y selected from a yellow colorant or a colorant having a maximum absorption wavelength in a wavelength range of 400 to 500 nm,
the colorant Y includes C. I. Pigment Yellow 150, and
50% by mass or more of the colorant Y is at least one selected from C. I. Pigment Yellow 150, C. I. Pigment Yellow 139, or C. I. Pigment Yellow 185.

19. The composition for forming an absorption layer according to claim 18, further comprising an ultraviolet absorber.

20. The composition for forming an absorption layer according to claim 19,
wherein the ultraviolet absorber includes at least one selected from a benzotriazole compound, a benzophenone compound, or a triazine compound.

21. A solid-state imaging element comprising the structure according to claim 1.

22. An image display device comprising the structure according to claim 1.

23. The structure according to claim 1,
wherein in the absorption layer, a content of a colorant other than the colorant Y is 1 part by mass or less with respect to 100 parts by mass of the colorant Y.

24. The method for producing a structure according to claim 15,
wherein in the absorption layer, a content of a colorant other than the colorant Y is 1 part by mass or less with respect to 100 parts by mass of the colorant Y.

25. The composition for forming an absorption layer according to claim 18,
wherein a content of a colorant other than the colorant Y is 1 part by mass or less with respect to 100 parts by mass of the colorant Y.

* * * * *